United States Patent
Iwata et al.

(10) Patent No.: US 6,426,532 B1
(45) Date of Patent: Jul. 30, 2002

(54) SEMICONDUCTOR DEVICE AND METHOD OF MANUFACTURE THEREOF

(75) Inventors: Hiroshi Iwata; Seizo Kakimoto; Masayuki Nakano; Kouichiro Adachi, all of Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/720,714

(22) PCT Filed: Jun. 29, 1999

(86) PCT No.: PCT/JP99/03483

§ 371 (c)(1),
(2), (4) Date: Apr. 19, 2001

(87) PCT Pub. No.: WO00/01015

PCT Pub. Date: Jan. 6, 2000

(30) Foreign Application Priority Data

Jun. 30, 1998 (JP) .............................. 10-183466

(51) Int. Cl.[7] .............................................. H01L 31/119
(52) U.S. Cl. .................. 257/374; 257/371; 257/372; 257/377; 257/402; 257/412
(58) Field of Search .................. 257/374, 371, 257/372, 377, 402, 412, 288

(56) References Cited

U.S. PATENT DOCUMENTS

| | | | |
|---|---|---|---|
| 4,855,014 A | | 8/1989 | Kakimoto et al. |
| 5,234,847 A | * | 8/1993 | Iranmanesh ............ 437/34 |
| 5,314,835 A | | 5/1994 | Iguchi et al. |
| 5,334,869 A | | 8/1994 | Iguchi et al. |
| 5,391,508 A | | 2/1995 | Matsuoka et al. |
| 5,559,368 A | | 9/1996 | Hu et al. |
| 5,773,331 A | * | 6/1998 | Solomon et al. ........ 438/164 |
| 5,780,899 A | * | 7/1998 | Hu et al. .............. 257/335 |
| 5,960,319 A | | 9/1999 | Iwata et al. |
| 5,970,351 A | * | 10/1999 | Takeuchi .............. 438/300 |
| 6,172,405 B1 | | 1/2001 | Shibata et al. |

FOREIGN PATENT DOCUMENTS

| | | | |
|---|---|---|---|
| JP | 3074848 | | 3/1991 |
| JP | 6085262 | | 3/1994 |
| JP | 06326262 A | * | 11/1994 |
| JP | 2576506 | | 11/1996 |
| JP | 10022462 | | 1/1998 |
| JP | 10335660 | | 12/1998 |

OTHER PUBLICATIONS

"Advanced Trench and Local Oxidation of Silicon (LOCOS) Isolation Technology for Ultra–Low–Power bulk Dynamic Threshold Metal Oxide Semiconductor Field Effect Transistor (B–DTMOS)", Hiroshi Kotaki et al., *Jpn: J. Appl. Phys.* vol. 36 (1997) pp. 7660–7664, Part 1, NO. 12B, Dec. 1997.

"Novel Bulk Dynamic Threshold Voltage MOSFET (B–DTMOS) with Advanced Isolation (SITOS) and Gate to Shallow–Well Contact (SSS–C) Processes for Ultra Low Power Dual Gate CMOS", H. Kotaki et al., *IEEE*, pp. 17.7.1–17.7.4, 1996.

"Channel Profile Optimization and Device Design for Low–Power High–Performance Dynamic–Threshold MOSFET", Clement Wann et al., *IEEE*, pp. 5.3.1–5.3.4, 1996.

* cited by examiner

*Primary Examiner*—Nathan Flynn
*Assistant Examiner*—Remmon R. Fordé

(57) ABSTRACT

A semiconductor device according to the present invention includes a semiconductor substrate; device isolation regions provided in the semiconductor substrate; a first conductivity type semiconductor layer provided between the device isolation regions; a gate insulating layer provided on an active region of the first conductivity type semiconductor layer; a gate electrode provided on the gate insulating layer; gate electrode side wall insulating layers provided on side walls of the gate electrode; and second conductivity type semiconductor layers provided adjacent to the gate electrode side wall insulating layers so as to cover a portion of the corresponding device isolation region, the second conductivity type semiconductor layers acting as a source region and/or a drain region. The gate electrode and the first conductivity type semiconductor layer are electrically connected to each other. The second conductivity type semiconductor layers are provided above the first conductivity type semiconductor layer and have a thickness which gradually increases from the device isolation region toward the gate electrode.

12 Claims, 43 Drawing Sheets

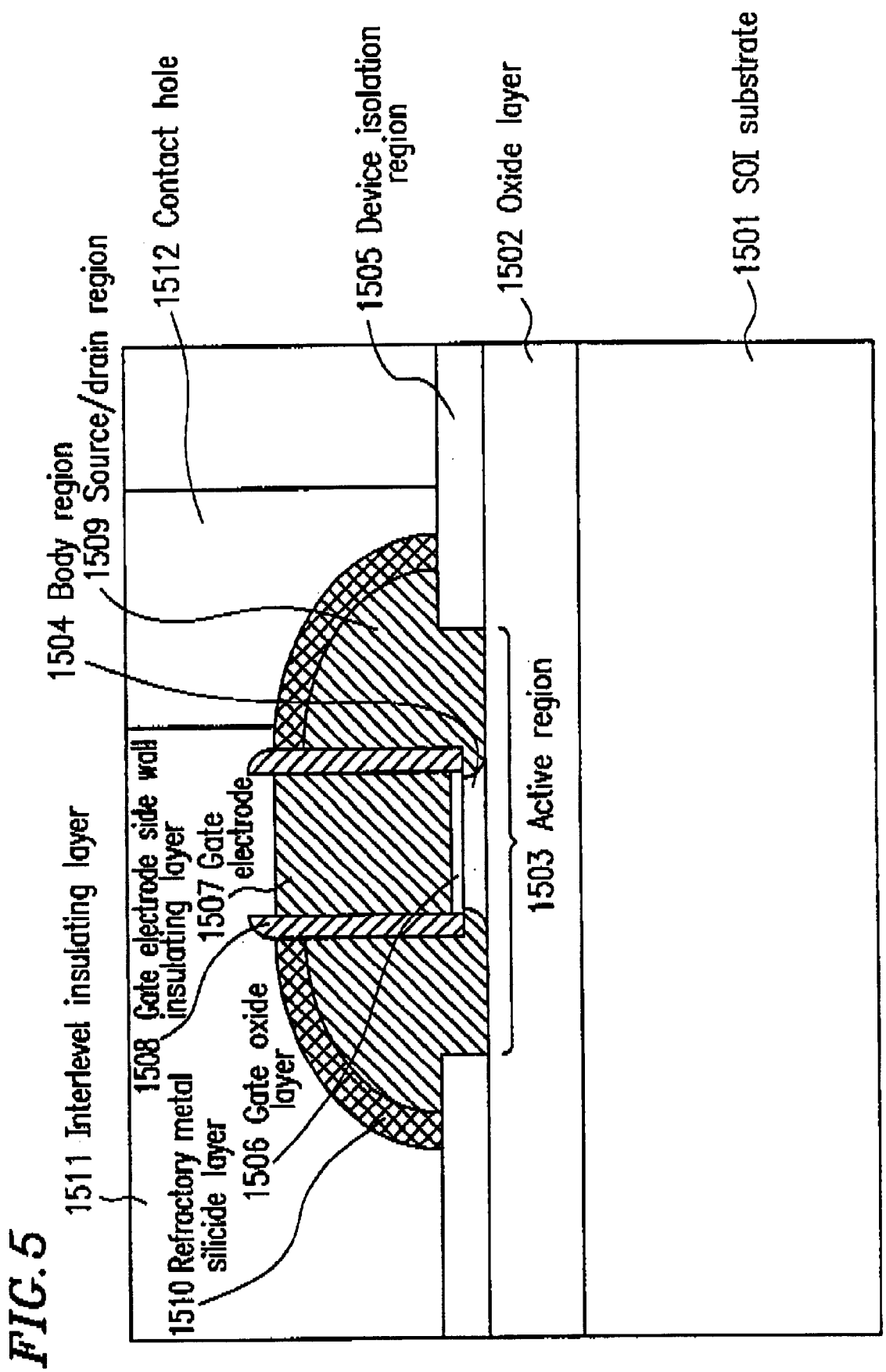

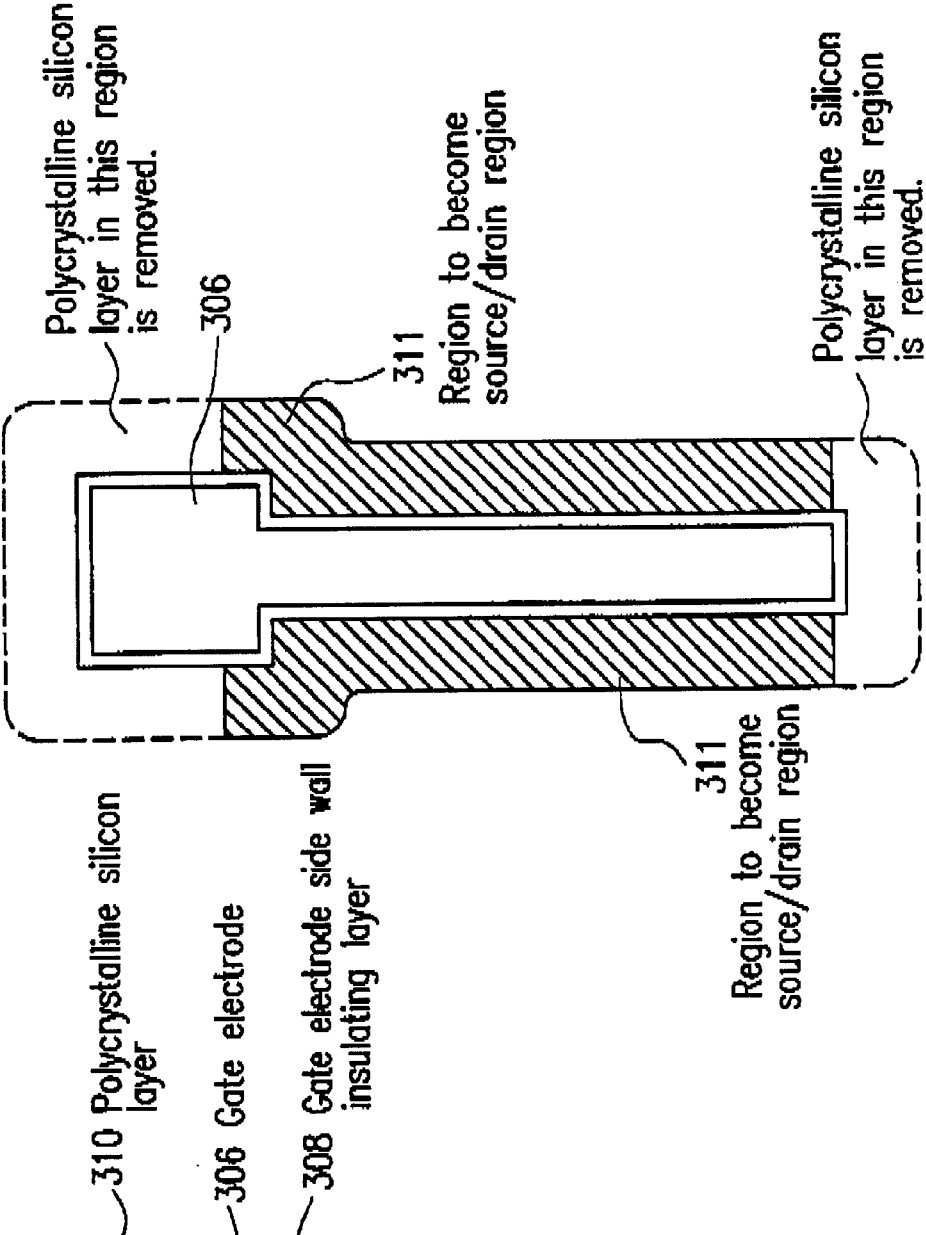

Not offset

Offset

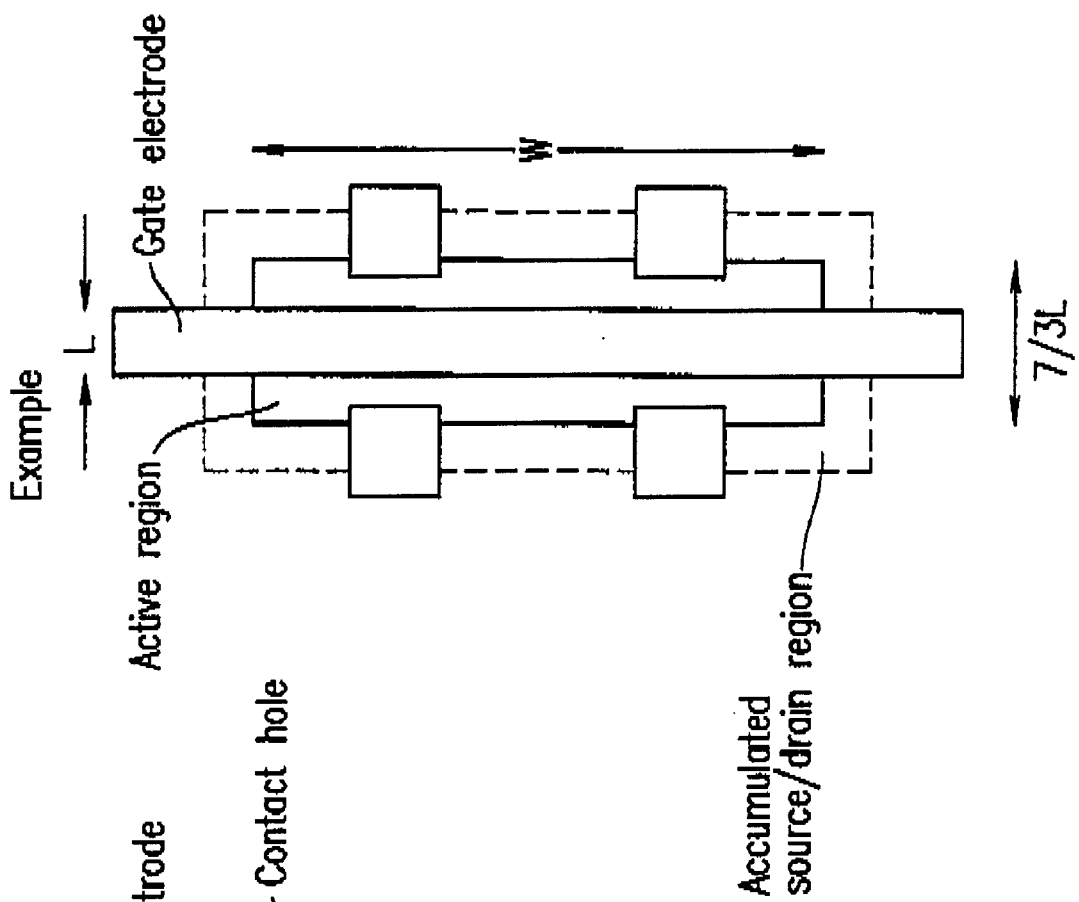
FIG. 23B Example
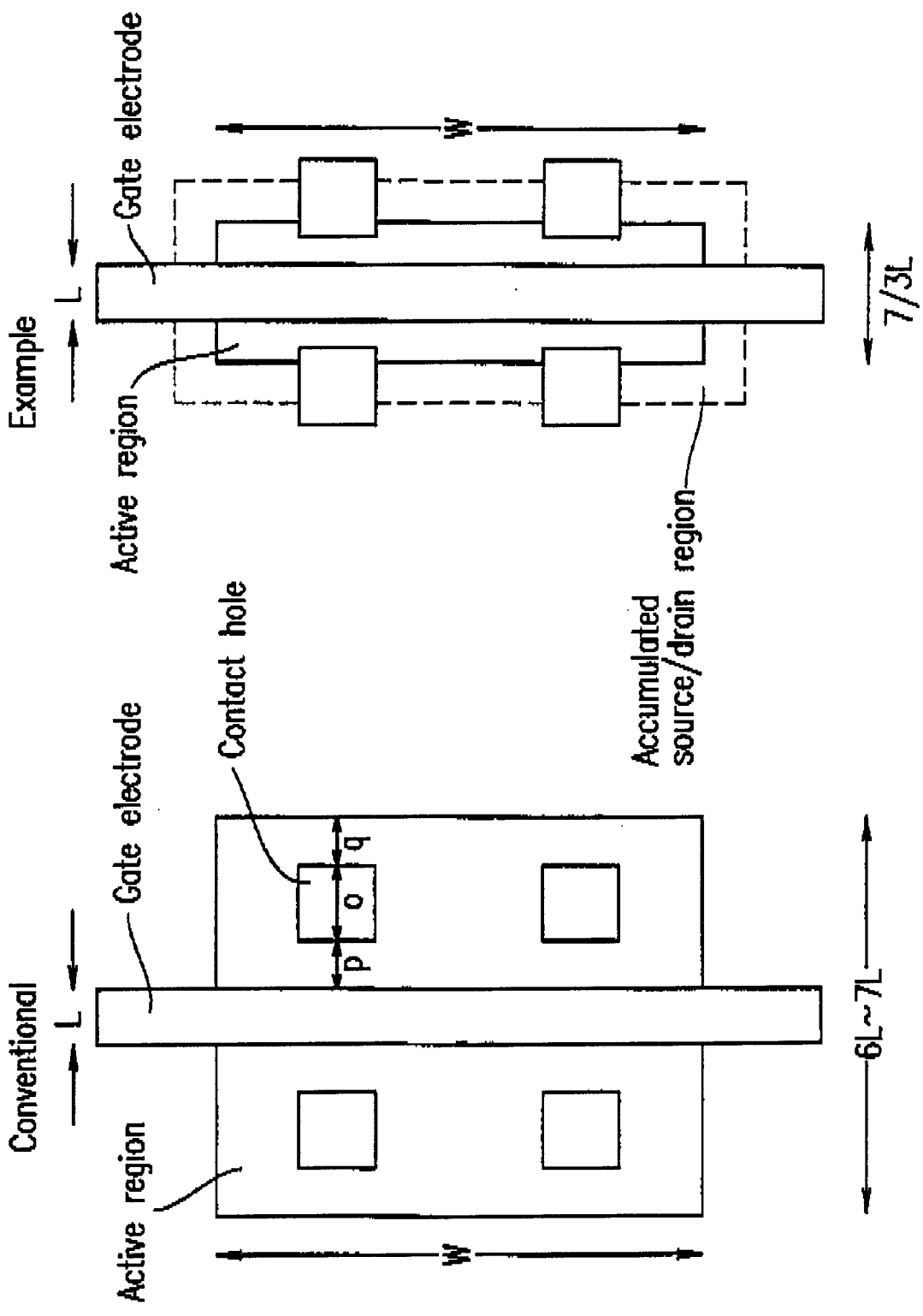
FIG. 23A Conventional

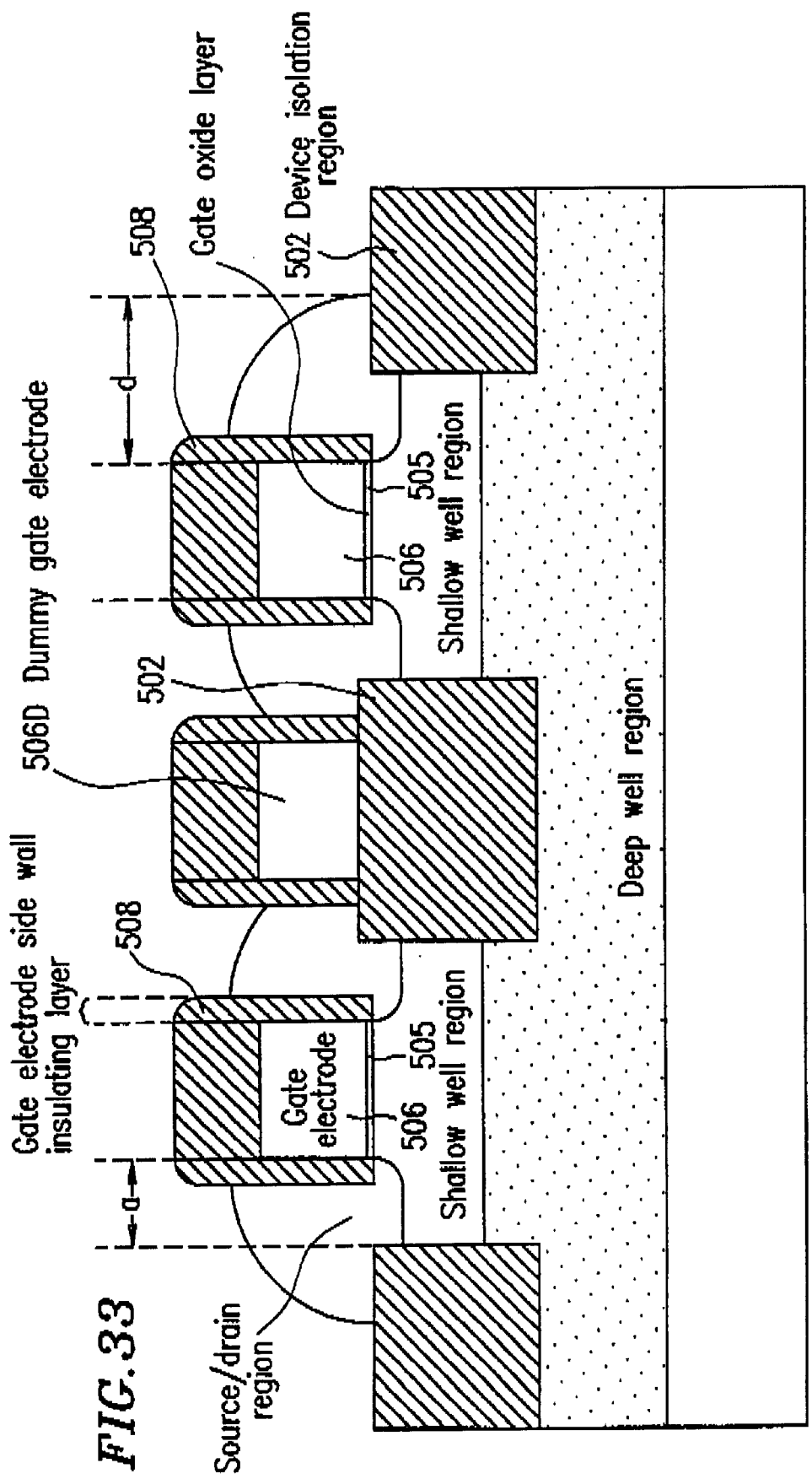

Cross-sectional view of contact region between gate electrode and body region

SEMICONDUCTOR DEVICE AND METHOD OF MANUFACTURE THEREOF

This application is the national phase under 35 U.S.C. § 371 of PCT International Application No. PCT/JP99/03483 which has an International filing date of Jun. 29, 1999, which designated the United States of America.

TECHNICAL FIELD

The present invention relates to a semiconductor device used for a switching device, and in particular, to an MIS semiconductor device drivable at a low supply voltage and having a dynamic threshold voltage and a method for producing the same.

BACKGROUND ART

In a CMOS circuit, a power consumption is in proportion to the square of a supply voltage, and therefore reduction in the supply voltage is effective for realizing a CMOS LSI consuming less power. However, a reduction in the supply voltage reduces the driving force of transistors and thus increases a delay time period of the circuit. The problem becomes more serious as the supply voltage is reduced. Especially, it is known that the delay time period significantly increases when the supply voltage is three times the threshold voltage or less. One conceivable solution to this problem is to reduce the threshold voltage. A reduction in the threshold voltage, however, increases a leakage current when the gate is off, and therefore causes another problem that the lower limit of the threshold voltage is restricted based on the amount of tolerable leakage current when the gate is off.

In order to alleviate this problem, a dynamic threshold voltage transistor has conventionally been proposed in, for example, F. Assaderaghi et al., "A Dynamic Threshold Voltage MOSFET (DTMOS) for Ultra-Low Voltage Operation", IEDM94, Ext. Abst. page 809, as a transistor operable at a low supply voltage. The dynamic threshold voltage transistor realizes a high driving power at a low voltage by reducing the effective threshold voltage when the transistor is ON. FIG. 34 shows a structure of a conventional dynamic threshold voltage transistor. FIG. 34 shows a dynamic threshold voltage transistor using an SOI substrate which is disclosed in U.S. Pat. No. 5,559,368 and Japanese Laid-Open Publication No. 6-85262. FIG. 34 shows an NMOS structure, but a PMOS can also be realized by inverting the polarities.

FIG. 34A is a cross-sectional view of the conventional dynamic threshold voltage transistor using an SOI substrate. FIG. 34B is a top view of the dynamic threshold voltage transistor, and FIG. 34C is a cross-sectional view thereof across a contact region of a gate electrode and a body. Reference numeral 1000 represents a silicon substrate, reference numeral 1001 represents a buried oxide layer, reference numeral 1002 represents a source region, reference numeral 1003 represents a p-type silicon layer, reference numeral 1004 represents a drain region, reference numeral 1005 represents a gate insulating layer, reference numeral 1006 represents a gate electrode, reference numeral 1007 represents a p-type diffusion layer, and reference numeral 1008 represents a metal line.

The SOI substrate is used, and the gate electrode 1006 and the p-type silicon layer 1003 are locally shortcircuited via the p-type diffusion layer 1007 and the oversized metal line 1008. When a gate bias is applied to such a structure in which the gate electrode 1006 and the p-type silicon layer 1003 are shortcircuited, a forward bias is applied to an active region, the forward bias having an equal magnitude to that of the gate bias.

It should be noted that in this structure, the voltage to be applied to the gate electrode in order to restrict the standby current is restricted to 0.6 V or less. At or in the vicinity of 0.6 V, a lateral direction bipolar transistor is turned ON. Due to the restriction in the voltage, when the gate is OFF, the substrate is usually in the same bias state as that of the transistor; and when the gate is ON, the substrate is forwardly biased as the gate bias increases. In this manner, the threshold voltage is reduced. Therefore, the dynamic threshold voltage transistor has an equivalent leakage current to that of a general SOI transistor in the same channel state when the substrate bias (gate bias) is OFF. When the transistor is ON, a significant increase in the driving force is provided as the threshold voltage is reduced.

However, the above-described structure uses an SOI substrate. Accordingly, the body (p-type silicon layer as the channel region) has a very small thickness (50 nm to 200 nm) and thus obtains a very high resistance. Therefore, even when the gate electrode and body are shortcircuited by a contact region, it becomes more difficult to transfer the potential of the gate electrode to the body and the CR time constant becomes larger as the body is more distanced from the contact region. Thus, in terms of a transient operation, the effect of the dynamic threshold metal-oxide-silicon FET (DTMOSFET; hereinafter, referred to as the "DTMOS") is restricted and the DTMOS device cannot operate at a high speed.

The source and drain regions have a great thickness and thus obtains a high resistance. It is effective to salicide the source and drain regions (self-aligned saliciding) using a refractory metal material in order to avoid the high resistance of the source and drain regions. However, it is difficult to salicide the source and drain regions which are formed of a very thin silicon layer on the oxide layer. In order to solve the problems of the DTMOS device using the SOI substrate, the present inventors proposed a dynamic threshold voltage transistor using a bulk silicon substrate (Japanese Laid-Open Publication No. 10-22462). As shown in FIG. 35, the dynamic threshold voltage transistor using a bulk silicon substrate includes a MOSFET provided on a bulk silicon substrate 0301. The MOSFET includes a deep well 0302 provided on the bulk silicon substrate 0301, a shallow wall 0303 having an opposite conductivity type to that of the deep well 0302 provided in the deep well 0302, and source and drain regions 0307 of a conductivity type opposite to that of the shallow well 0303 (namely, the same conductivity type as that of the deep well 0302) which are provided in the shallow well 0303. A gate electrode 0306 of the MOSFET has a feature of being electrically connected to the shallow well 0303. At least the shallow well 0303 is electrically isolated from a shallow well 0303' included in an adjacent transistor by a groove-type device isolation region 0304. Reference numeral 0305 represents a gate oxide layer, reference numeral 0308 represents an interlevel isolating layer, and reference numeral 0309 represents a contact hole.

The structure shown in FIG. 35 solves the problem of the increase in the resistance of the body of a DTMOS using an SOI substrate. However, when a bulk substrate is used, unlike the case of the SOI substrate, the planar size of the junction of the source and drain regions and the shallow well region increases, which accompanies an increase in the parasitic capacitance. The power consumption P is expressed by $P = C \times V^2 \times f$ where V is the supply voltage, C is the capacitance of the circuit including the parasitic capacitance, and f is the operating frequency. In other words, it is important to reduce the supply voltage, and also to reduce the capacitance, in order to lower the power consumption. As compared to the usual MOSFET having a constant potential in the wall region, the DTMOS having the structure shown in FIG. 35 which shortcircuits the gate electrode and the body region or the wall region is disadvantageous when the planar size of the junction of the source and drain regions and the well region is the same.

With reference to FIGS. 36 and 37, the parasitic capacitance will be described in detail. FIG. 36 shows the state of a usual CMOS inverter having a fan-out of 1. FIG. 37 shows the state of a CMOS inverter of a dynamic threshold voltage transistor having a fan-out of 1, in which the gate electrode and the well region are shortcircuited. In FIGS. 36 and 37, parasitic capacitances are indicated with "−" and "+". As is easily appreciated from the comparison between FIGS. 36 and 37, the dynamic threshold voltage transistor shown in FIG. 37 has a capacitance at the junction which is three times as high as that of the junction of the usual transistor shown in FIG. 36 when the planar size of the junction is the same. In actuality, however, the capacitance is not simply three times since the area of the depletion layer is different between the forward bias portion and the reverse bias portion. FIG. 38 compares specific capacitances of the two types of transistors both having circuit of a fan-out of 2.

The transistors used for the comparison shown in FIGS. 38A and 38B have a gate length of 0.24 μm. The distance between the gate electrode to the device isolation region (the width of the source and drain regions) is 0.72 μm. In FIGS. 38A and 38B, $C_W$ represents a line capacitance, $C_G$ represents a gate capacitance, $C_{DE}$ represents a capacitance at the junction of the well region and the drain region in a reverse bias state, $C_{DF}$ represents a capacitance at the junction of the well region and the drain region in a forward bias state, $C_S$ represents a capacitance at the junction of the well region and the source region, $CS_{W/DW}$ represents a capacitance between the shallow well region and the deep well region, and $C_{dep}$ represents a capacitance between the inverted channel region and the shallow well. Since the usual MOS transistor and the bulk-DTMOS (B-DTMOS) device are substantially the same in the gate capacitance $C_G$ and the line capacitance $C_W$, the usual transistor and the dynamic threshold voltage transistor are compared with the other capacitances. When $C_W$ is 10 fF (see FIG. 38A), the usual transistor has only the $C_{DR}$, which is 4.7; whereas the dynamic threshold voltage transistor has a total capacitance of $C_{DR}+C_{DF}+C_S+C_{SW/DW}+D_{dep}$, which is 28.5. Namely the junction parasitic capacitance of the bulk DTMOS device is about 6 times as large as that of the usual transistor when compared using a circuit having a fan-out of 2. This problem of the parasitic capacitance is caused even when an SOI substrate is used. When $C_W$ is as large as 100 fF as in FIG. 38B, the junction parasitic capacitance of $C_{DR}+C_{DF}+C_E+C_{dep}$ is 9.2, which is smaller than the above-mentioned value of 28.5. As the size of the device is reduced, the ratio of the line capacitance is increased since the line capacitance cannot be reduced in proportion to the size of the device. The ratio of the junction parasitic capacitance is decreased but not to a negligible level. (For example, even in the case of FIG. 38B, the capacitance is increased by about 8% as can be appreciated from the ratio of 100:107.8). Therefore, it is important to reduce the junction parasitic capacitance.

DISCLOSURE OF THE INVENTION

A semiconductor device according to the present invention includes a semiconductor substrate; device isolation regions provided in the semiconductor substrate; a first conductivity type semiconductor layer provided between the device isolation regions; a gate insulating layer provided on the first conductivity type semiconductor layer; a gate electrode side wall insulating layer provided on side walls of the gate electrode; and second conductivity type semiconductor layers provided adjacent to portions of the gate electrode side wall insulating layer so as to cover a portion of the corresponding device isolation region, the second conductivity type semiconductor layers acting as a source region and/or a drain region. The gate electrode and the first conductivity type semiconductor layer are electrically connected to each other, and the second conductivity type semiconductor layers are provided above the first conductivity type semiconductor layer and have a thickness which gradually increases from the device isolation region toward the gate electrode.

The structure according to the present invention has a function of reducing the parasitic resistance of the source and drain regions. The structure according to the present invention significantly facilitates siliciding of the source and drain regions which is conventionally very difficult. According to the structure of the present invention, impurity ions to act as donors or acceptors for forming the source and drain regions can be implanted only into a second conductivity type semiconductor region (more precisely, the region becomes of the second conductivity type as a result of the implantation) accumulated above the channel region and can be diffused from the accumulated region into the solid layer, i.e., the semiconductor substrate. Thus, the junction can be formed. Therefore, the short channel effect resulting from size reduction of the device is effectively suppressed. The surface area of the source drain regions can be larger than the plannar size thereof. Therefore, the contact region of the source and drain regions and upper lines can be enlarged so as to reduce the contact resistance with respect to the planar size of the source and drain regions.

In terms of saliciding (self-aligned salicide), the surface area which is to be salicided is large with respect to the planar size. Accordingly, the resistance is reduced, and the undesirable influence of the thin lines occurring at the time of siliciding reaction (i.e., the siliciding reaction of the thin lines is inhibited) is alleviated. The structure according to the present invention compensates for a vertical step generated by the gate electrode. This solves various problems of semiconductor device production which are caused by the vertical step of the gate electrode. For example, the problem that the etching rate of the etching stop layer undesirably rises at the vertical step of the gate electrode during the etching process performed for forming a contact region by self-alignment contact is solved. Thus, the etching process is facilitated. In addition, the interlevel insulating layer on the gate electrode is more easily flattened.

Since the active region is not exposed after the source and drain regions are formed, the active region is not damaged by etching or ion implantation.

A semiconductor device according to the present invention includes a semiconductor substrate; a second conductivity type deep well region provided in the semiconductor substrate; device isolation regions provided in the semiconductor substrate; a first conductivity type shallow well region provided in the second conductivity type deep well regions; a gate insulating layer provided on the first conductivity type shallow well region; a gate electrode provided on the gate insulating layer; a gate electrode side wall insulating layer provided on side walls of the gate electrode; and second conductivity type semiconductor layers provided adjacent to portions of the gate electrode side wall insulating layer so as to cover a portion of the corresponding device isolation region, the second conductivity type semiconductor layers acting as a source region and/or a drain region. The gate electrode and the first conductivity type shallow well region are electrically connected to each other, and the second conductivity type semiconductor layers are provided above the first conductivity type shallow well region and have a thickness which gradually increases from the device isolation region toward the gate electrode.

The structure according to the present invention can minimize the planar size of the junction of the source and drain regions and the well region of the dynamic threshold voltage transistor using a bulk substrate. Specifically, the distance from the gate electrode to the device isolation region in a gate length direction which is vertical to the longitudinal direction of the gate electrode can be reduced to about $2/3$ L from the conventional value of 2.5 L to 3 L (L is the gate length and is usually a minimum processable size). The planar size of the junction is obtained by multiplying this value by a width W of the transistor. When the width W is the same, the planar size of the junction can be as small as about $4/15$ to $2/5$ of that of the conventional transistor. A planar component of the junction capacitance can also be as small as about $4/15$ to $2/5$ of that of the conventional transistor. Specifically, according to the present invention, as described above, the junction can be formed by implanting impurity ions to act as donors or acceptors for forming the source and drain regions only to the accumulated regions above the channel region and diffusing the impurity ions from the accumulated regions to the solid layer, i.e., the semiconductor substrate. Therefore, the junction can be formed at a shallow level. Consequently, a perimeter length component of the capacitance can be reduced. As described above, the present invention has advantages of reducing the parasitic resistance of the source and drain regions, effectively restricting the short channel effect, reducing the contact resistance with respect to the planar size of the source and drain regions, alleviating the undesirable thin line influence occurring at the time of siliciding reaction, and compensating for a vertical step generated by the gate electrodes.

In one embodiment, a surface of the source and drain regions is exposed to at least a portion of a contact hole for connecting the source and drain regions and the upper lines. The diameter of the contact hole can be larger than the width of the active region, i.e., the distance from an end of the gate electrode of the device isolation region in a cross-section taken along a direction vertical to the longitudinal direction of the gate electrode. Therefore, the diameter of the contact hole can be enlarged, which facilitates the formation of the contact hole. Conventionally, each of the contact holes needs to be entirely in the source or drain region. Accordingly, the contact hole needs to have a diameter which is smaller than the width of the source or drain region, and thus the processing for forming the contact hole is difficult.

In the structure of this embodiment also, the contact region can have a sufficient size when the length thereof in the longitudinal direction of the gate electrode is longer than the length thereof in the direction vertical to the longitudinal direction.

In one embodiment of the invention, the semiconductor device further includes contact holes for electrically connecting the source region and/or the drain region to upper lines. A width of each of the contact holes in a cross-section which is vertical to a longitudinal direction of the gate electrode is larger than a distance between the corresponding end of the gate electrode and the corresponding device isolation region. Therefore, the size of the contact hole can be increased without increasing the size of the source and drain regions. The ease of formation of the contact hole and the reduction in the junction capacitance (which depends on the planar size of the junction of the source and drain regions and the well region) can both be provided.

In one embodiment of the invention, a distance, in a direction which is vertical to a longitudinal direction of the gate electrode, between each end of the gate electrode and the corresponding device isolation region is smaller than a width of the gate electrode. Therefore, the planar size of the device is reduced, and also the parasitic capacitance at the junction of the source and drain regions and the well region is significantly reduced.

In one embodiment of the invention, the second conductivity type semiconductor layers acting as the source region and/or the drain region are formed of a material having an impurity diffusion coefficient which is larger than an impurity diffusion coefficient of the semiconductor substrate. Therefore, when the impurities are diffused and activated by heat treatment, the diffusion occurs very rapidly up to the interface between the accumulated layer and the semiconductor substrate but very slowly in the semiconductor substrate. In consequence, the depth of the level of the source and drain regions below the channel region is unlikely to be influenced by the dispersion in the height of the accumulated region, and thus the controllability on the impurity diffusion in the semiconductor substrate is improved. This allows the shallow junction to be formed with satisfactory controllability in the case of a bulk substrate, and allows the impurities to be diffused more easily in lateral directions in the channel region in the case of an SOI substrate.

The diffusion coefficient of the impurities in the second conductivity type semiconductor layers is preferably twice to 100 times as large as the diffusion coefficient of the impurities in the semiconductor substrate. In this case, the depth of the level of the source and drain regions below the channel region is unlikely to be influenced by the dispersion in the height of the accumulated region, and thus the controllability on the impurity diffusion in the semiconductor substrate is improved.

The second conductivity type semiconductor layers are preferably formed of polycrystalline silicon. Since polycrystalline silicon is often used in semiconductor device production, the need for introduction of new apparatuses or conditions is relatively small. Use of an enormous amount of hydrogen as required by a selective epitaxial growth apparatus is not necessary. The planar size of an apparatus for the device production is much smaller than a planar size of a selective epitaxial growth apparatus, which is very large partly due to the significant size of the hydrogen removal apparatus.

The polycrystalline silicon is preferably of column-like crystals. In this case, impurity diffusion in the polycrystalline silicon layer occurs very rapidly. The impurities doped into the polycrystalline silicon layer are diffused in the semiconductor substrate with satisfactory controllability. The depth of the level of the source and drain regions is unlikely to be influenced by the dispersion in the height of the polycrystalline silicon layer. Thus, the controllability on the impurity diffusion in the semiconductor substrate is improved.

When the grain size of the polycrystalline silicon is 50 nm or less, a diffusion coefficient larger than the diffusion coefficient in the semiconductor substrate can be realized. In addition, dispersion in the width of the side wall of the polycrystalline silicon layer which is caused by the grain of the polycrystalline silicon when etching back is performed can be suppressed.

In one embodiment of the invention, the gate electrode and the second conductivity type semiconductor layers each have a two-layer structure including a refractory metal silicide layer provided on a surface side of the semiconductor device and a polycrystalline silicon layer provided on a substrate side. Therefore, as described above, even the planar size of the contact region of the source and drain regions and the upper lines is small, the contract region can have a very low resistance. Since the silicide layer extends close to the channel region, the parasitic resistance can be restricted and thus the ability of the device for driving the current can be improved even when the planar size of the junction of the source and drain regions and the well region is small. The silicide layer can be used as an etching stop layer during the etching process for forming the contact hole.

A method for producing a semiconductor device according to the present invention includes the steps of forming device isolation regions, on a substrate including a first conductivity type semiconductor layer on a surface side, of a material which is resistant against silicon etching; sequentially forming a gate insulating layer, a gate electrode, and a gate electrode side wall insulating layer on the first conductivity type semiconductor layer; forming a polycrystalline silicon layer having a thickness larger than a distance between the gate electrode and the device isolation regions over the entire surface of the resultant laminate; and performing anisotropic etching until a portion of the polycrystalline silicon layer which is on the gate electrode is eliminated.

A method for producing a semiconductor device according to the present invention includes the steps of forming device isolation regions, on a silicon substrate, of a material which is resistant against silicon etching; forming a second conductivity type deep well region and forming a first conductivity type shallow well region in the second conductivity type deep well region; sequentially forming a gate insulating layer, a gate electrode, and a gate electrode side wall insulating layer on the first conductivity type well region; forming a polycrystalline silicon layer having a thickness larger than a distance between the gate electrode and the device isolation regions; and performing anisotropic etching until a portion of the polycrystalline silicon layer which is on the gate electrode is eliminated.

When the etching amount is set to such a value as to eliminate the polycrystalline silicon layer on the gate electrode for anisotropic etching back, the accumulated source and drain regions can easily be formed as in the present invention. Since the polycrystalline silicon layer has a thickness which is greater than the distance from the gate electrode to the device isolation region, the silicon substrate is not exposed. Thus, the silicon substrate is not damaged by anisotropic etching back. An end of the accumulated layer, on the side of the gate electrode, formed by anisotropic etching always extends onto the device isolation region formed of a material which is resistant to silicon etching. It should be noted that the accumulated layer formed of polycrystalline silicon layer on the side walls of the gate electrode needs to be divided into the source region and the drain region since the etching back process leaves the source region and the drain region shortcircuited.

When the source region of one semiconductor device and the drain region of an adjacent semiconductor substrate need to be connected to each other, such connection can be realized by setting the distance between adjacent gate electrodes of adjacent transistors connected in series to twice the thickness of the polycrystalline silicon layer to be accumulated or less.

A method for producing a semiconductor device according to the present invention includes the steps of forming device isolation regions, on a substrate including a first conductivity type semiconductor layer on a surface side, of a material which is resistant against silicon etching; sequentially forming a gate insulating layer, a gate electrode, and a gate electrode side wall insulating layer on the first conductivity type semiconductor layer; forming a polycrystalline silicon layer having a thickness larger than a distance between the gate electrode and the device isolation regions over the entire surface of the resultant laminate; performing anisotropic etching until a portion of the polycrystalline silicon layer which is on the gate electrode is eliminated; removing a portion of the polycrystalline silicon layer for electrically separating a source region and a drain region from each other; removing a portion of the gate electrode which corresponds to a contact region of the gate electrode and the first conductivity type semiconductor layer; removing a portion of the gate insulating layer which is exposed by removing the portion of the gate electrode, thereby exposing a surface of the first conductivity type semiconductor layer; and forming a refractory metal silicide layer on the source region, the drain region and the gate electrode, and concurrently forming a refractory metal silicide layer on the exposed surface of the first conductivity type semiconductor layer, thereby shortcircuiting the gate electrode and the first conductivity type semiconductor layer.

A method for producing a semiconductor device according to the present invention includes the steps of forming device isolation regions, on a silicon substrate, of a material which is resistant against silicon etching; forming a second conductivity type deep well region and forming a first conductivity type shallow well region in the second conductivity type deep well region; sequentially forming a gate insulating layer, a grate electrode, and a gate electrode side wall insulating layer on the first conductivity type well region; forming a polycrystalline silicon layer having a thickness layer than a distance between the gate electrode and the device isolation regions; performing anisotropic etching until a portion of the polycrystalline silicon layer which is on the gate electrode is eliminated; removing a portion of the polycrystalline silicon layer for electrically separating a source region and a drain region from each other; removing a portion of the gate electrode which corresponds to a contact region of the gate electrode and the first conductivity type well region; removing a portion of the gate insulating layer which is exposed by removing the portion of the gate electrode, thereby exposing a surface of the first conductivity type well region; and forming a refractory metal silicide layer on the source region, the drain region and the gate electrode, and concurrently forming a refractory metal silicide layer on the exposed surface of the first conductivity type semiconductor layer, thereby shortcircuiting the gate electrode and the first conductivity type semiconductor layer.

In this manner, the source and drain regions accumulated in contact with the side walls of the gate electrode can be formed in a self-aligned manner. By performing general saliciding process, the gate electrode and the body region or the shallow well region of the second conductivity type can be concurrently connected to each other without any additional step.

In one embodiment of the invention, the step of removing a portion of the polycrystalline silicon layer for electrically separating the source region and the drain region from each other, and the step of removing a portion of the gate electrode which corresponds to a contact region of the gate electrode and the first conductivity type well region are concurrently performed. Therefore, the process can be simplified.

In one embodiment of the invention, the method for producing a semiconductor device further includes the step of introducing an impurity acting as a donor or an acceptor into the source region, the drain region and the gate electrode, wherein the introduction is concurrently performed to the source region, the drain region and the gate electrode by ion implantation.

In this manner, a surface channel-type device can be formed with a small number of ion implantation steps. As described above, the diffusion coefficient of the impurities in the layer forming the source and drain regions accumulated on the semiconductor substrate is larger than the diffusion coefficient of the impurities in the semiconductor substrate. Therefore, even when doping of the gate electrode with impurities and doping of the source and drain regions with impurities are concurrently performed, the device can be formed with satisfactory controllability so that a depletion region is not formed in the gate electrode, the impurities are not diffused through the gate oxide layer, or an offset structure is not generated (i.e., the impurities are not diffused to form the source and drain regions sufficiently close to the channel region).

In one embodiment of the invention, the semiconductor device is a CMOS device. Concurrently with the introduction of the impurity acting as the donor to the source region, the drain region and the gate electrode of an n-channel semiconductor device, donor impurity implantation into the contact region is performed for shortcircuiting the gate electrode and an n conductivity type shallow well region or the semiconductor substrate of a p-channel semiconductor device. Concurrently with the introduction of the impurity acting as the acceptor to the source region, the drain region and the gate electrode of the p-channel semiconductor device, acceptor impurity implantation into the contact region is performed for shortcircuiting the gate electrode and a p conductivity type shallow well region or the semiconductor substrate of the n-channel semiconductor device.

Accordingly, ion implantation for connecting the gate electrode and the body region or the shallow wall region can be performed using only a usual CMOS process without requiring any additional step. Specifically, the impurity concentration of a surface of the body region or the shallow well region, which usually determines the threshold voltage of the device, is set to be low ($5 \times 10^{16}$ to $5 \times 10^{18}/cm^2$). For forming a contact region in the body region or the shallow well region in order to, for example, connect a metal line or the silicide layer (as according to the present invention) to the above-mentioned low concentration region, the impurity concentration of the contract region needs to be high ($10^{20}/am^3$ or more). This indispensably requires ion implantation into the contact region. If the low concentration contact region contacts a metal or metal silicide layer, a Schottky connection occurs but not an ohmic connection.

BRIEF DESCRIPTION OF THE DRAWINGS

FIG. 5 is a vertical cross-sectional view of the semiconductor device in the first example after contact hole formation.

FIG. 20A and 20B are plan views of the semiconductor device in the third example.

FIG. 23A is a plan view illustrating the positional relationship among a gate electrode, an active region and contact holes in a conventional example.

FIG. 23B is a plan view illustrating the positional relationship among a gate electrode, an active region and contact holes in the third example according to the present invention.

FIG. 33 is a cross-sectional view of adjacent transistors electrically separated from each other as semiconductor devices according to the present invention.

BEST MODE FOR CARRYING OUT THE INVENTION

EXAMPLE 1

Figure 1:
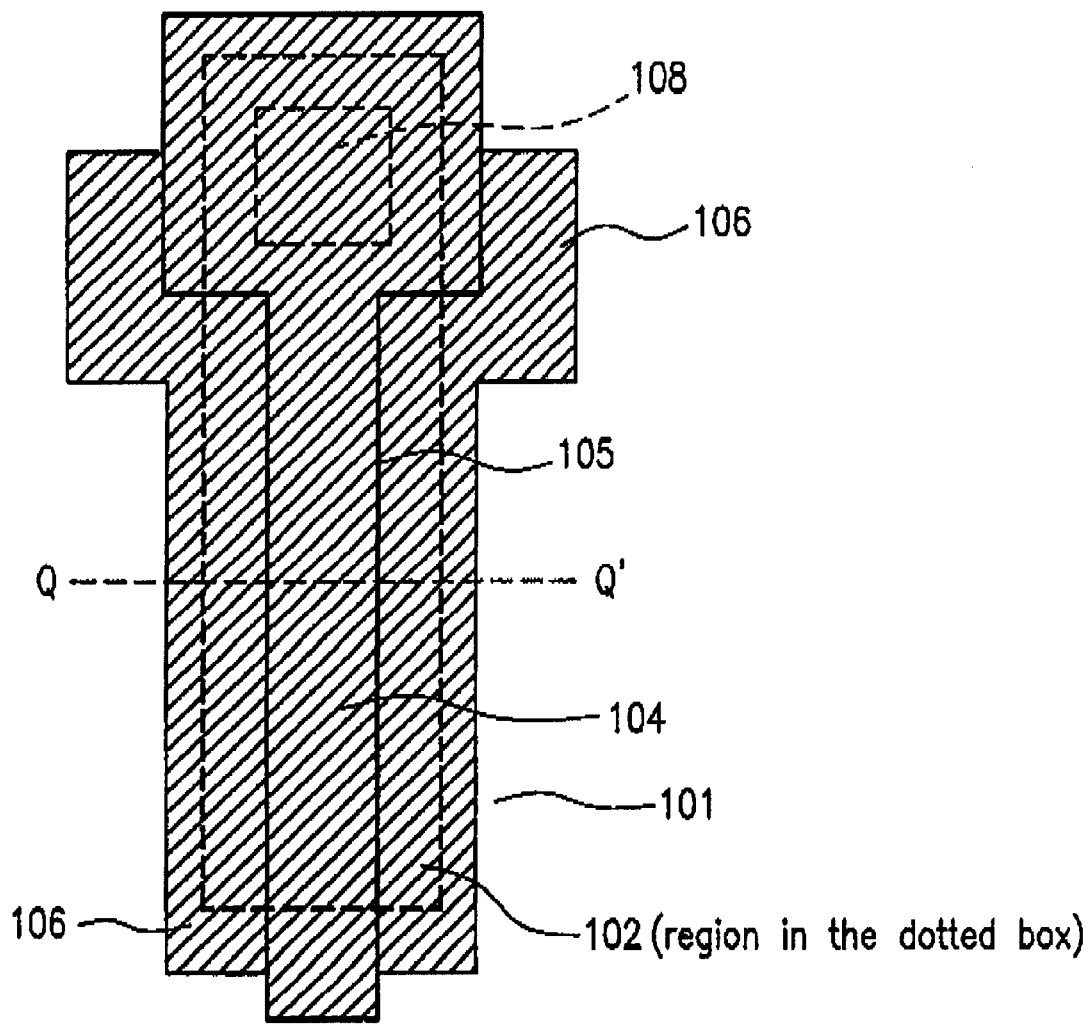
FIG. 1 is a plan view of a semiconductor device in a first example according to the present invention.
Figure 2:
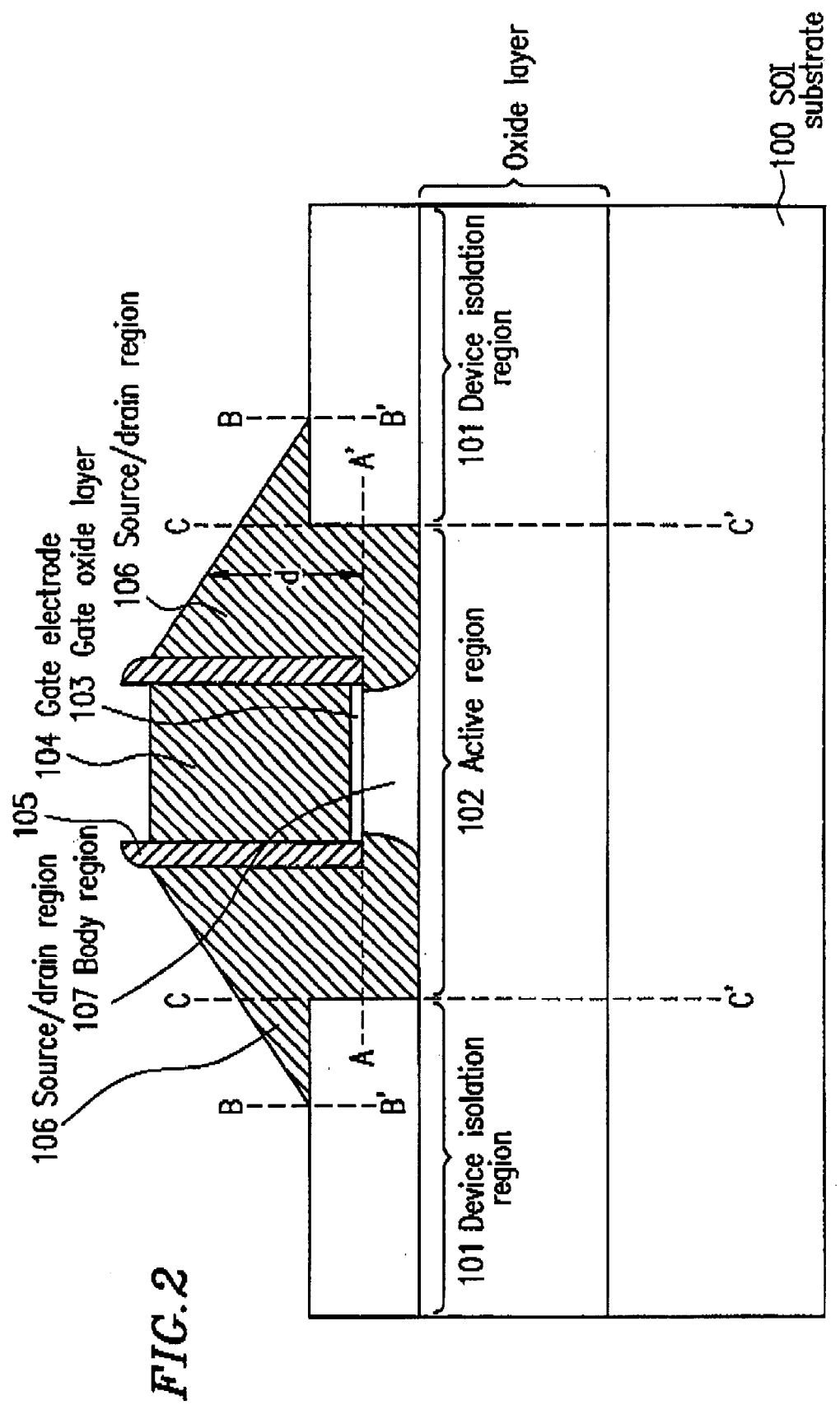
FIG. 2 is a vertical cross-sectional view of FIG. 1 taken along line Q—Q'.
Figure 3:
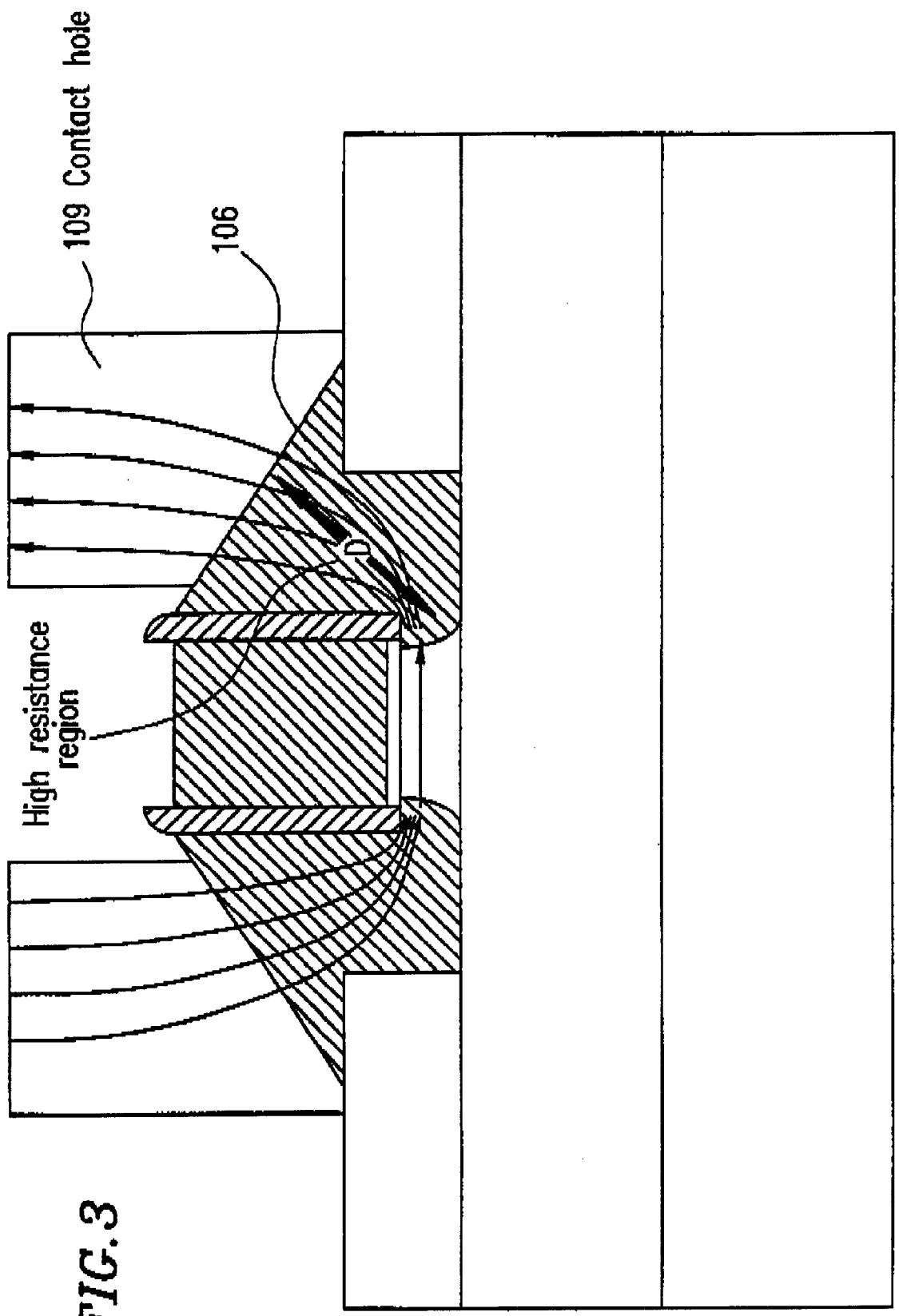
FIG. 3 is a view illustrating a current flow in the vertical cross-sectional view of FIG. 1 taken along line Q—Q'.
Figure 4A:
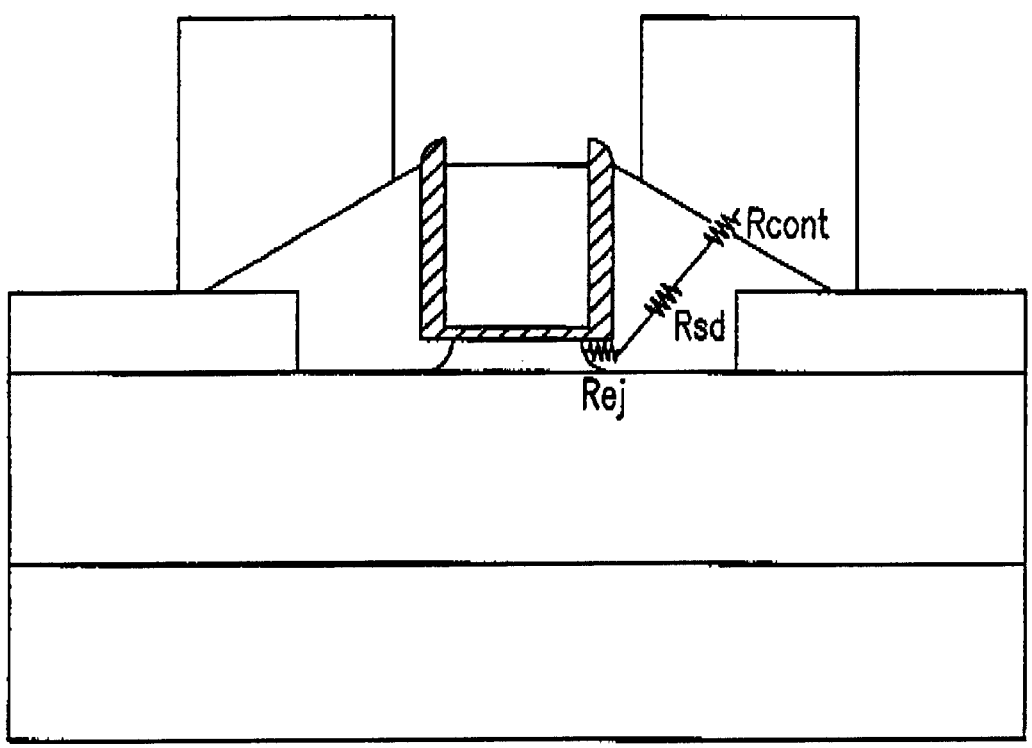
FIG. 4A is a view illustrating a parasitic resistance of a transistor in the vertical cross-sectional view of FIG. 1 taken along line Q—Q'.

A first example according to the present invention will be described with reference to FIGS. 1 through 4. This example uses an SOI substrate. FIG. 1 is a plan view of a semiconductor device in the first example according to the present invention. FIG. 2 is a vertical cross-sectional view of the semiconductor device taken along line Q-Q' in FIG. 1. FIG. 3 shows a current flow in the vertical cross-section of the semiconductor device taken along Q-Q' in FIG. 1. FIG. 4A shows a parasitic resistance of a transistor in the vertical cross-section of the semiconductor device taken along line Q-Q' in FIG. 1. Reference numeral 100 represents an SOI substrate, reference numeral 101 represents device isolation regions, reference numeral 102 represents an active region, reference number 103 represents a gate oxide layer, reference numeral 104 represents a gate electrode, reference numeral 105 represents gate electrode side wall isolating layers, reference numeral 106 represents source and drain regions, reference numeral 107 represents a body region, and reference numeral 108 represents a gate-body contact region.

In the semiconductor device in this example, as shown in FIG. 1, the gate electrode 104 is connected to the body region 107 (see FIG. 2) formed of a first conductivity type semiconductor layer via the gate-body contact region 108. As shown in FIG. 2, the SOI substrate 100 is divided roughly into the device isolation regions 101 and the active region 102, and the semiconductor device in this example is an MIS semiconductor device provided on the active region 102.

The semiconductor device in this example has the following shape. The source and drain regions 106 are adjacent to the gate electrode side wall insulating layers 105 provided on both sides of the gate electrode 104. Thus, the source and drain regions 106 is above an active layer surface A-A' (interface between the gate oxide layer 103 and the active region 102). In a direction which is vertical to a longitudinal direction of the gate electrode 104, a border (C-C') between the active region and each device isolation region exists between each of two ends of the gate electrode and an end of each of the source region and the drain region 106 (B-B'). In the vertical cross-section of the semiconductor device (taken along line Q-Q' in FIG. 1) which is perpendicular to the longitudinal direction of the gate electrode 104, a distance d between the active region surface A-A' of the semiconductor substrate and a surface of the source and drain regions 106 increases from each device isolation region toward the gate electrode 104. In other words, the active region 102 is covered with the three regions of the gate, source and drain regions which are electrically separated from each other without forming any vertical step between the gate electrode and the device isolation regions.

As shown in FIG. 3, this structure has a feature of having the surface of the source and drain regions 106 exposed to at least a portion of each contact hole 109. The contact holes 109 are provided for connecting the source and drain regions 106 with upper lines via an insulating layer (not shown) and are usually filled with metal. Due to these features, the semiconductor device in this example can have a surface area of the source and drain regions 106 which is larger than a planar size thereof, i.e., a size of a plane of the source and drain regions 106 which is parallel to the active region. Accordingly, the semiconductor device in this example has an effect of increasing the area of the contact region of the source and drain regions 106 and the upper lines so as to reduce a contact resistance. The semiconductor device in this example has another effect that the planar size thereof, especially the planar size of the source and drain regions 106, can be reduced regardless of the area of the contact region. In other words, this structure can reduce the planar size of the semiconductor device and thus lower the parasitic resistance so as to obtain a very large mutual conductance without increasing the content resistance.

A transistor device having such a structure has a current flow shown in FIG. 3. According to the present invention, the ratio of a region having a high resistance (D) with respect to a current path is very small and thus reduces the parasitic resistance of the source and drain regions 106 as compared to that of a transistor having a conventional structure. In addition, the current path expands on approaching the contact region from the source and drain regions 106 in the vicinity of the channel region, which also significantly reduces the parasitic resistance. Due to these functions, the ability of driving the current of the device is improved and thus the mutual conductance is raised.

Figure 4B:
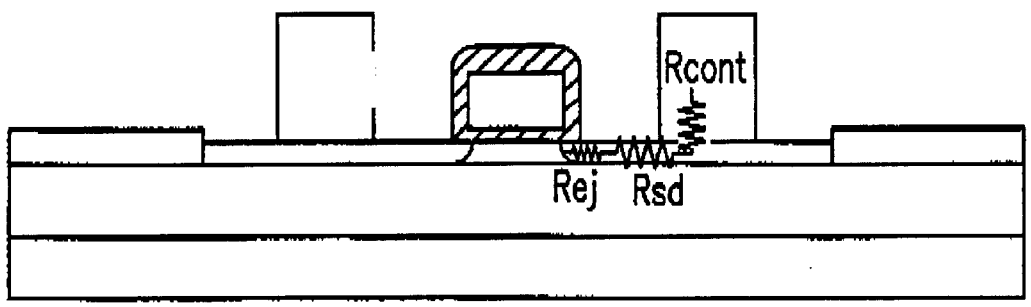
FIG. 4B is a view illustrating a parasitic resistance of a conventional semiconductor device as a comparative example to the transistor in FIG. 4A.

This will be described in detail with reference to FIG. 4. FIG. 4A shows a parasitic resistance of the semiconductor device in this example. FIG. 4B shows a parasitic resistance of a conventional semiconductor device. In FIGS. 4A and 4B, $R_{cont}$ represents a contact resistance, $R_{sd}$ represents a resistance in the source and drain regions, and $R_{sj}$ represents a spreading resistance at a junction of the channel region and the source and drain regions. As compared to the conventional semiconductor device, the semiconductor device in this example has a much shorter distance between the contact region and the channel region and thus has a smaller $R_{sd}$. In other words, the fundamental problem of the SOI substrate can be solved by applying the structure in this example to a semiconductor device using an SOI substrate.

An SOI substrate usually has a very thin silicon layer on the oxide layer. However, as the silicon layer becomes thinner, the resistance in the source and drain regions becomes undesirably higher. In order to solve this problem, the surface of the source and drain regions needs to be silicided to form a refractory metal silicide layer. This solution has the following fundamental problem. The thin silicon layer allows the silicide layer to reach the silicon oxide layer below the source and drain regions, which deteriorates the transistor characteristics.

FIG. 5 shows a structure obtained by saliciding the semiconductor device using the SOI substrate in this example.

In FIG. 5, reference numeral 1501 represents an SOI substrate, reference numeral 1502 represents an oxide layer, reference numeral 1503 represents an active region, reference numeral 1504 represents a body region, reference numeral 1505 represents device isolation regions, reference numeral 1506 represents a gate oxide layer, reference numeral 1507 represents a gate electrode, reference numeral 1508 represents a gate electrode side wall insulating layer, reference numeral 1509 represents source and drain regions, reference numeral 1510 represents a refractory metal silicide layer, reference numeral 1511 represents an interlevel insulating layer, and reference numeral 1512 represents a contact hole.

The source and drain regions 1509 formed of silicon (polycrystalline silicon) is accumulated above the channel region. Accordingly, the surface of the silicon layer accumulated above the channel region reacts with the refractory metal during the saliciding process, thereby forming a silicide layer. Therefore, the silicide layer is prevented from reaching the oxide layer in the SOI substrate. In this manner, the above-described problem specific to the SOI substrate is solved. In addition, in this structure, the area of a surface of the source and drain regions 1509 which is to be silicided is larger than the planar size of the source and drain regions 1509. Such a large surface area can reduce the resistance of the source and drain regions 1509 and also has an effect of alleviating the undesirable influence of the thin lines occurring at the time of siliciding reaction (i.e., the siliciding reaction of the thin lines is inhibited).

This structure alleviates undesirable reduction in the semiconductor device production yield caused by a vertical step of the gate electrode. For example, the interlevel insulating layer is easily flattened. In addition, since steps between the device isolation regions and the active region are covered with the source and drain regions, light is not reflected by the steps, which facilitates a lithography process.

EXAMPLE 2

Figure 6A:
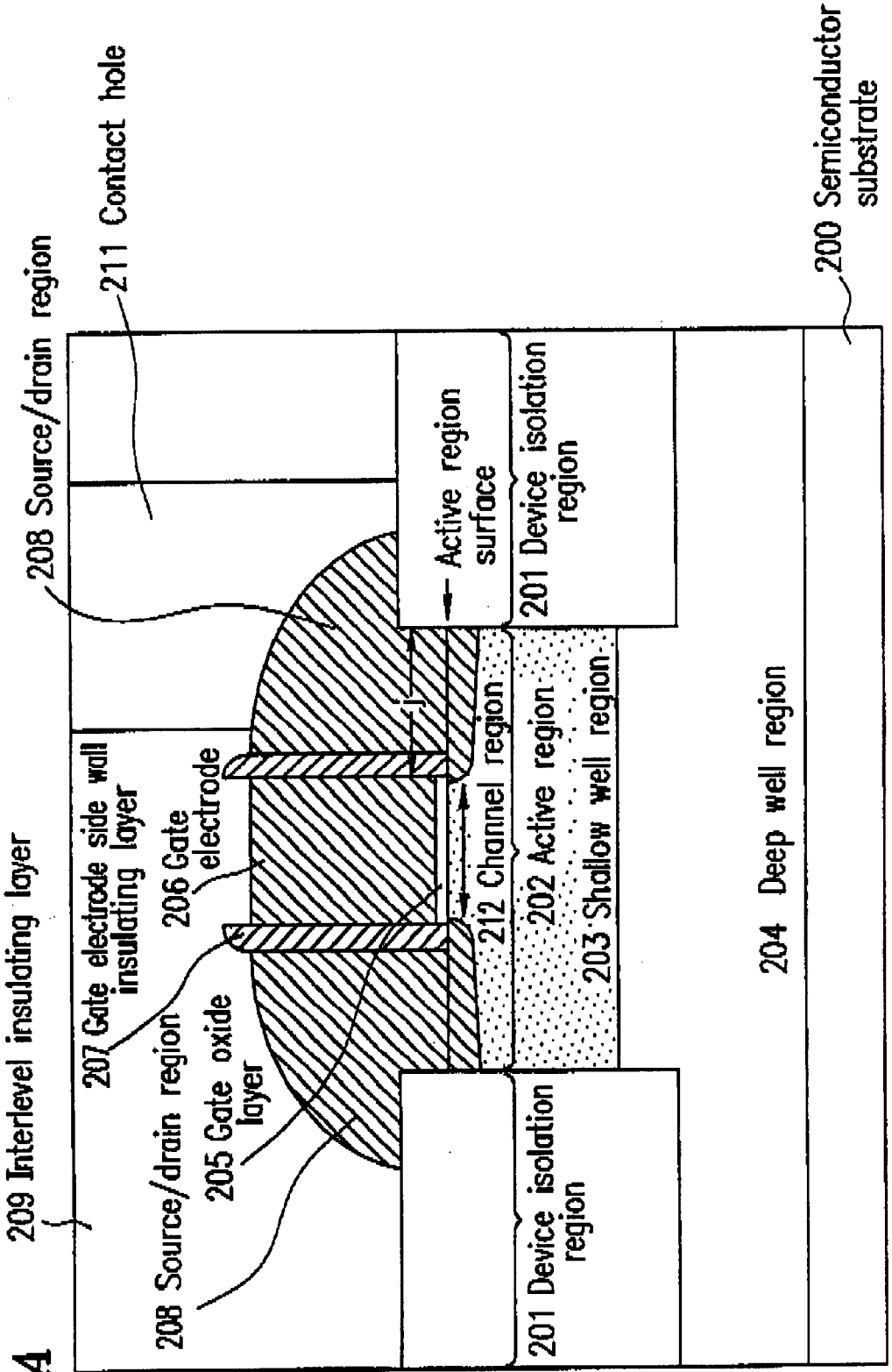
FIG. 6A is a vertical cross-sectional view of a semiconductor device in a second example.
Figure 6B:
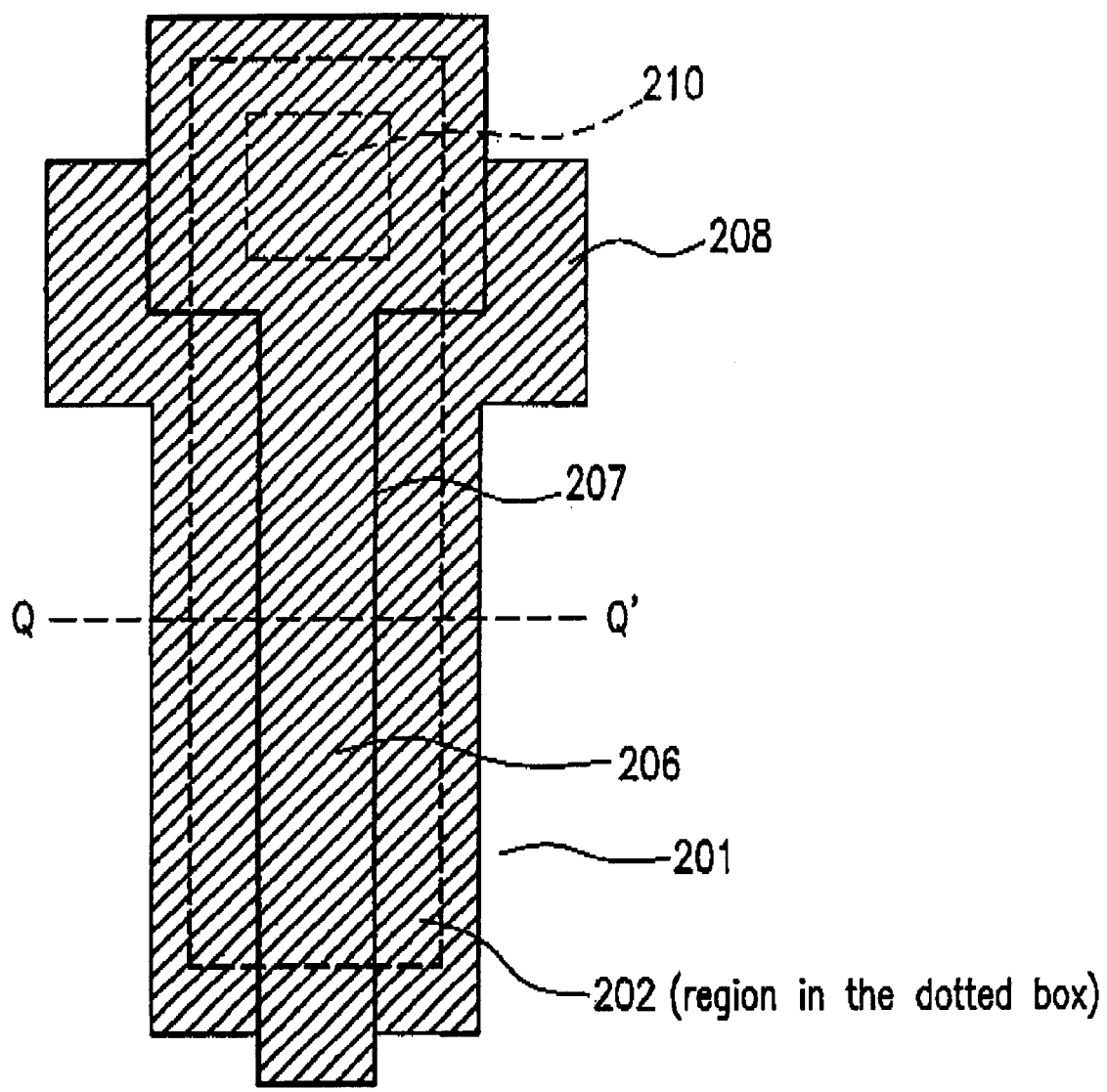
FIG. 6B is a plan view of the semiconductor device in the second example.

A second example according to the present invention uses a bulk silicon substrate. FIG. 6A (or FIG. 7) corresponds to FIG. 2 in the first example. FIG. 6A (or FIG. 7) is a vertical cross-sectional view of a DTMOS taken along a direction perpendicular to a longitudinal direction of a gate electrode of the DTMOS in the second example according to the present invention. FIG. 6B is a plan view of the DTMOS using the bulk silicon substrate. The plan view shown in FIG. 6B is not specifically different from the plan view in the first example (see FIG. 1).

In FIG. 6A (or FIG. 7), reference numeral 200 represents a semiconductor substrate, reference numeral 201 represents device isolation regions, reference numeral 202 represents an active region, reference numeral 203 represents a shallow well region of an opposite conductivity type to that of source and drain regions, reference numeral 204 represents a deep well region of the same conductivity type as that of the source and drain regions, reference numeral 205 represents a gate oxide layer, reference numeral 206 represents a gate electrode, reference numeral 207 represents a gate electrode side wall insulating layer, reference numeral 208 represents the source and drain regions, reference numeral 209 represents an interlevel insulating layer, reference numeral 210 represents a contact region for connecting the gate electrode 206 and the shallow well region 203, reference numeral 211 represents a contact region for connecting the corresponding source and drain region 208 and upper lines (not shown), and reference numeral 212 represents a channel region.

The DTMOS in this example has a feature that, as shown in FIG. 6A, a surface of the source and drain regions 208 is curved in the vertical cross-section taken in the direction perpendicular to the longitudinal direction of the gate electrode 206. Accordingly, the surface area of the source and drain regions 208 can be larger than the planar size of the source and drain regions 208 by a greater difference than in the first example. Thus, the area of the contact region can be increased. The shape shown in FIG. 6A is specifically obtained by a method described in a third or fourth example according to the present invention which will be described later.

Figure 7:
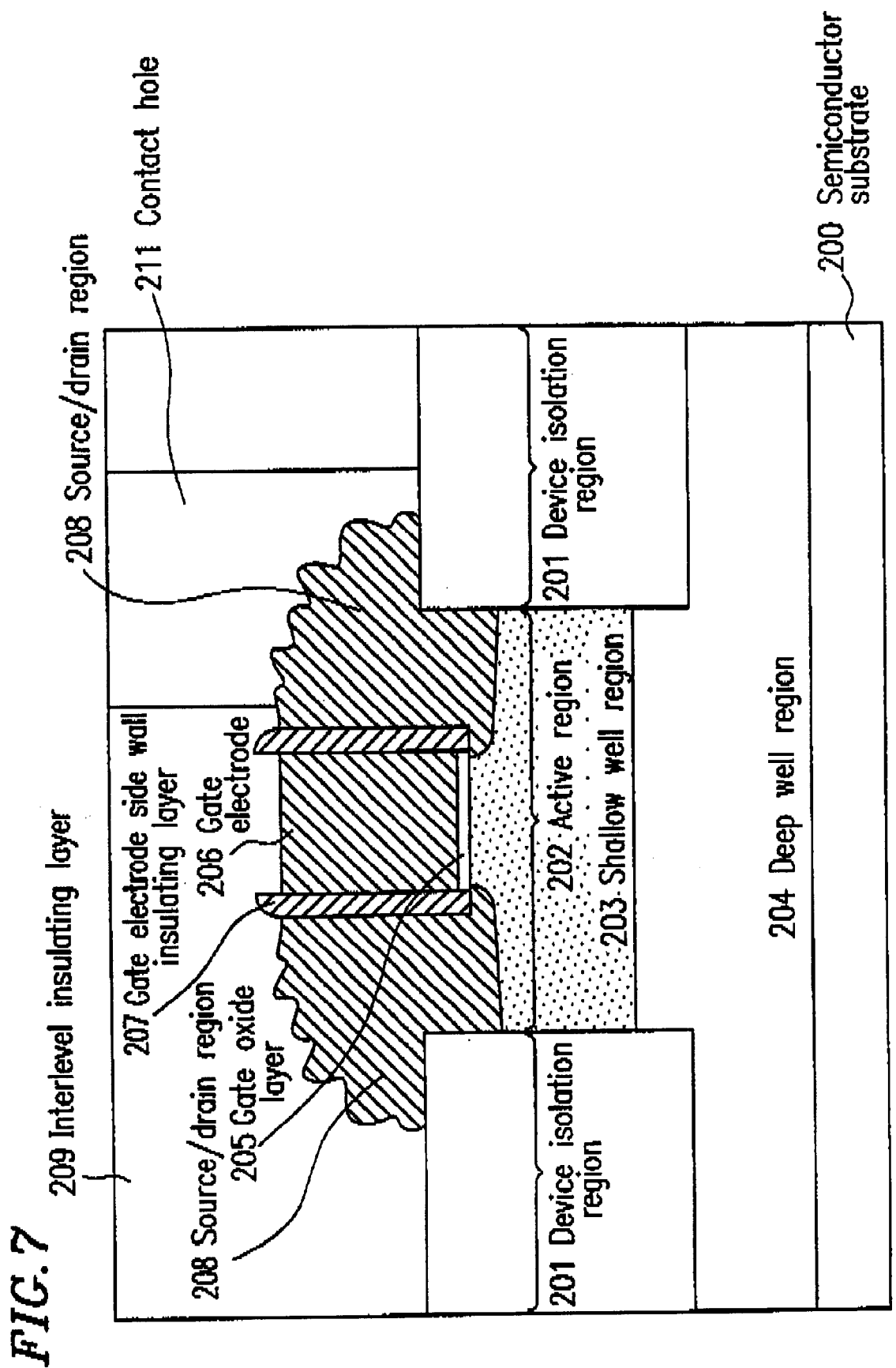
FIG. 7 is a vertical cross-sectional view of a modification of the semiconductor device in the second example.
Figure 8A:
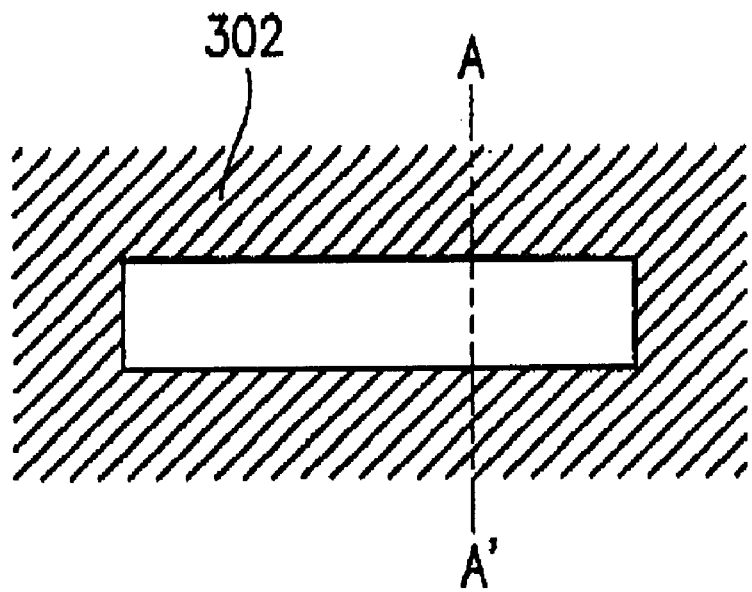
FIGS. 8A and 8B are views illustrating a step of a method for forming a semiconductor device in a third example according to the present invention.
Figure 8B:
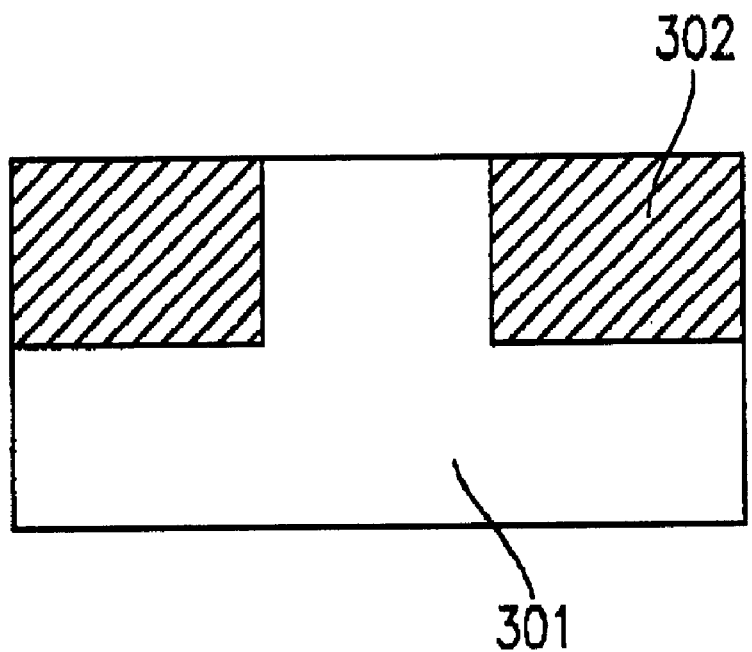
Figure 9A:
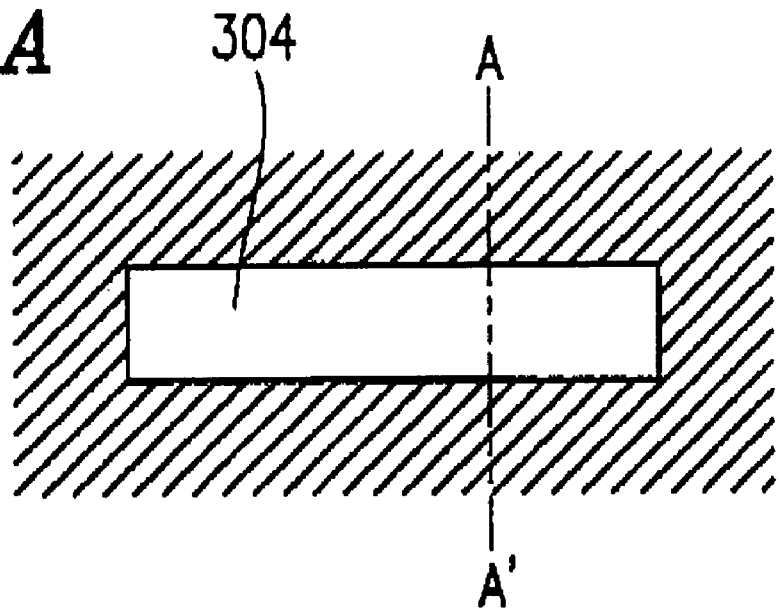
FIGS. 9A and 9B are views illustrating a step of the method for forming the semiconductor device in the third example.
Figure 9B:
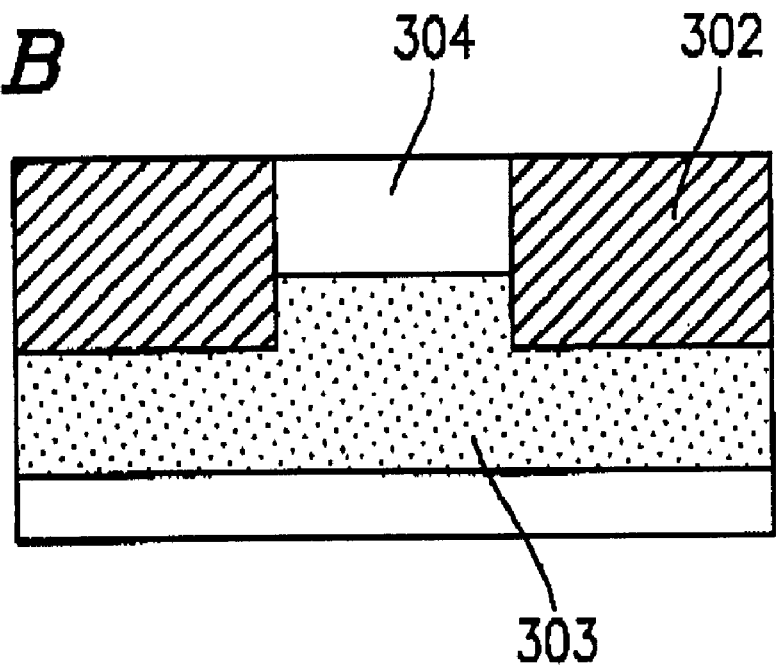
Figure 10A:
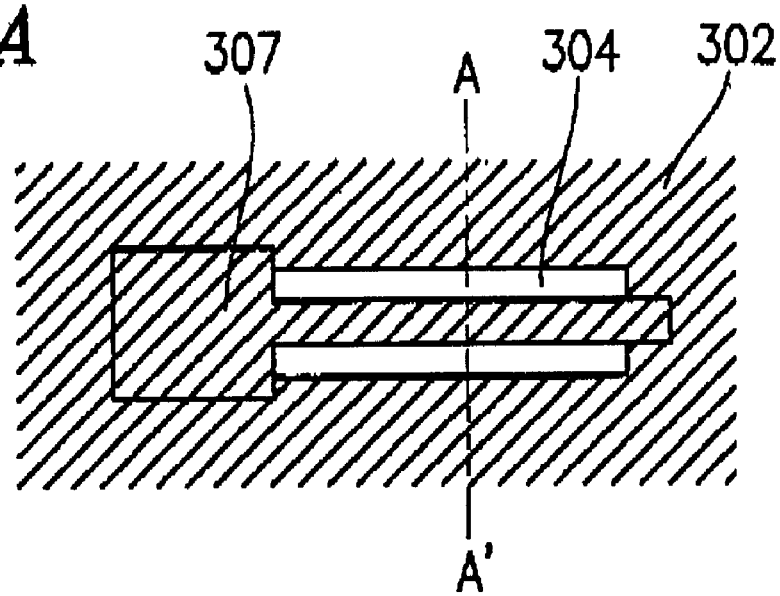
FIGS. 10A and 10B are views illustrating a step of the method for forming the semiconductor device in the third example.
Figure 10B:
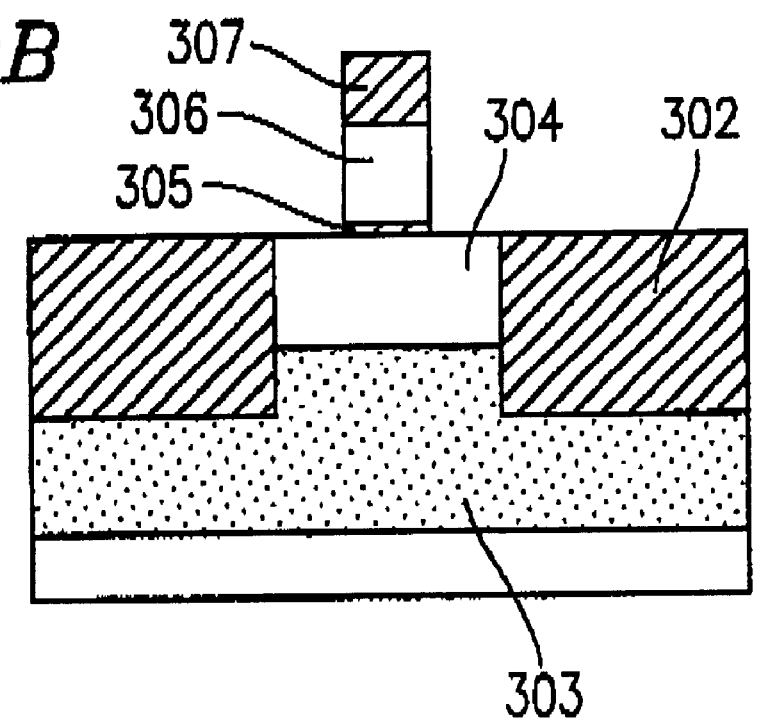
Figure 11A:
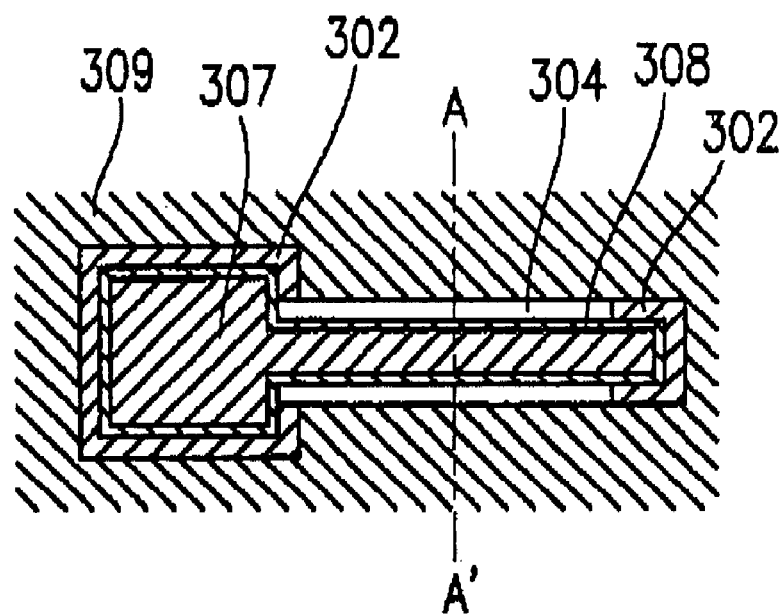
FIGS. 11A and 11B are views illustrating a step of the method for forming the semiconductor device in the third example.
Figure 11B:
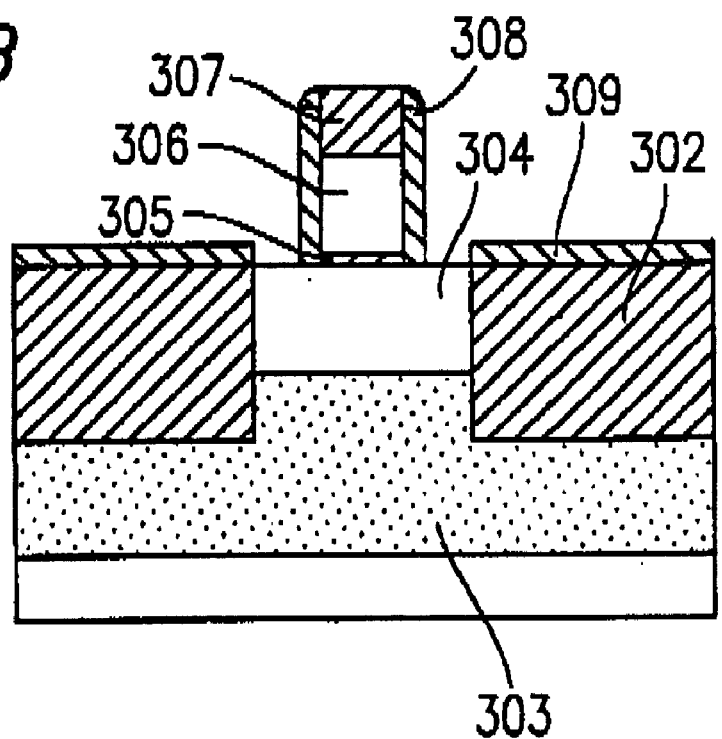
Figure 12A:
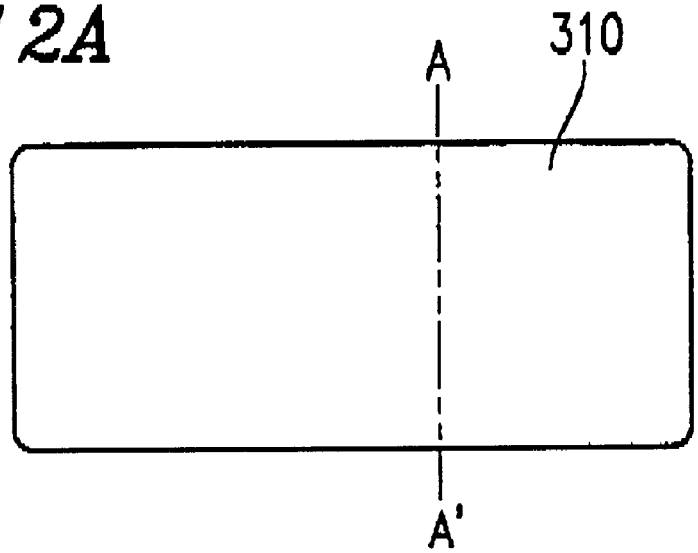
FIGS. 12A and 12B are views illustrating a step of the method for forming the semiconductor device in the third example.
Figure 12B:
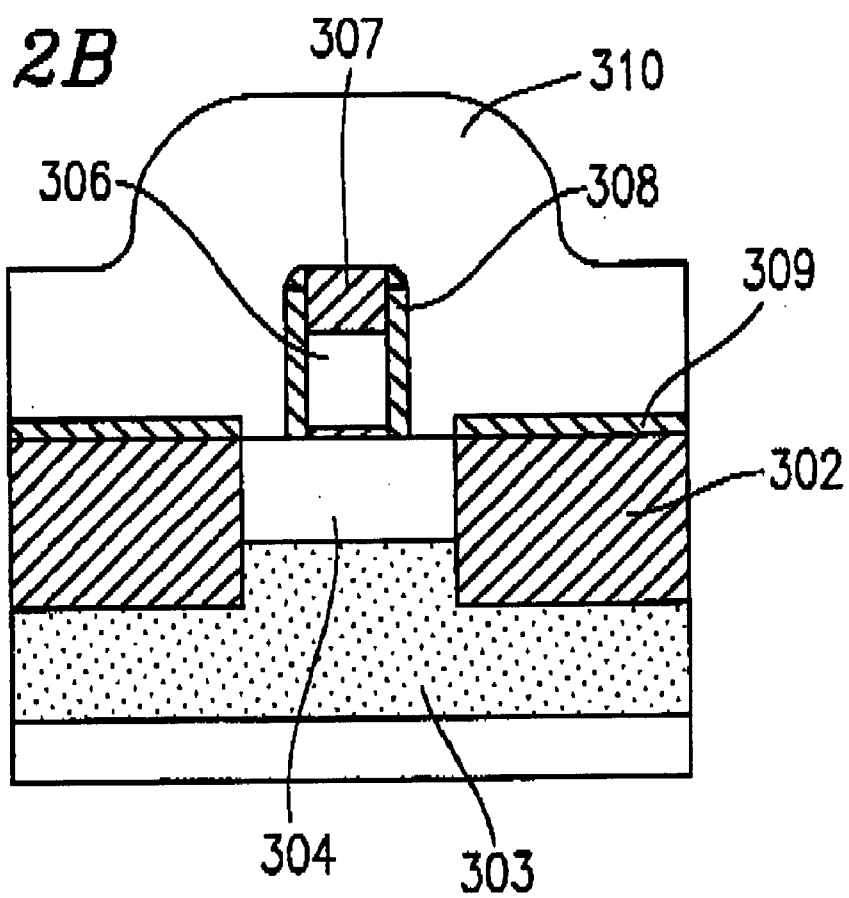
Figure 13A:
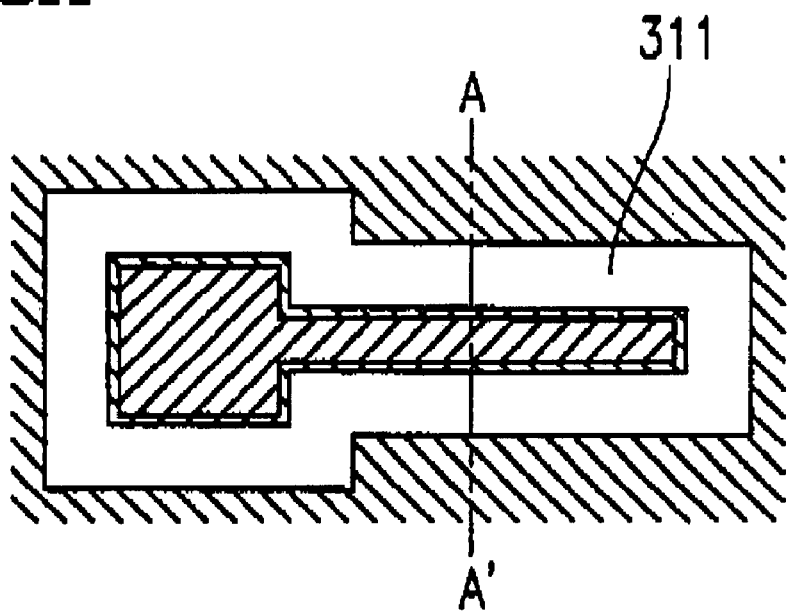
FIGS. 13A and 13B are views illustrating a step of the method for forming the semiconductor device in the third example.
Figure 13B:
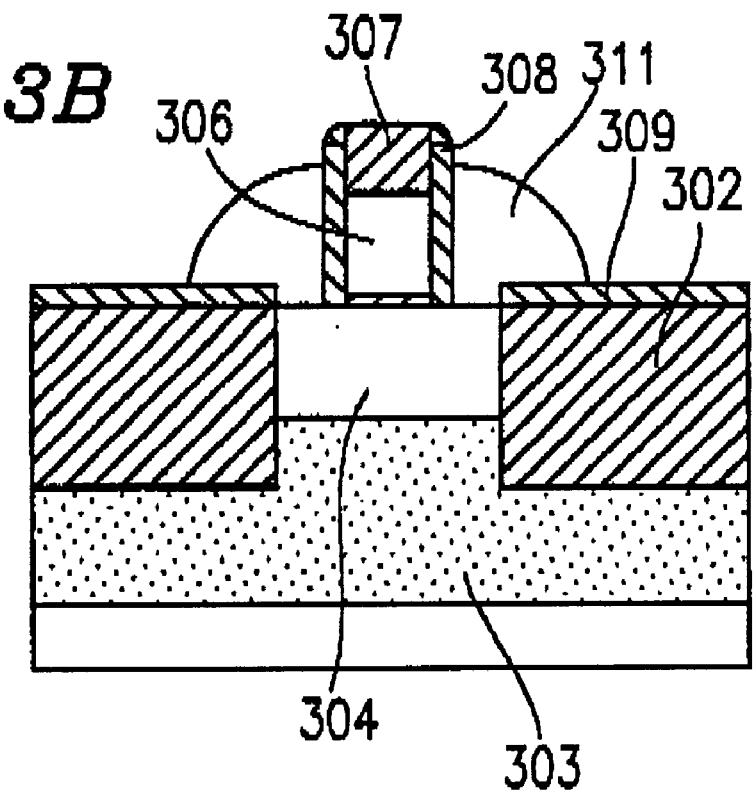
Figure 14A:
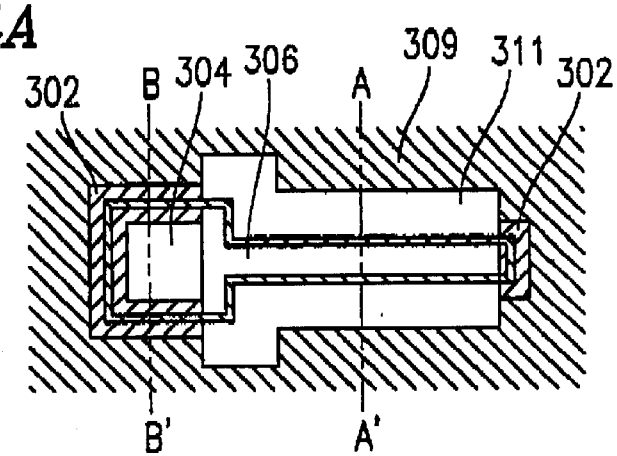
FIGS. 14A, 14B and 14C are views illustrating a step of the method for forming the semiconductor device in the third example.
Figure 14B:
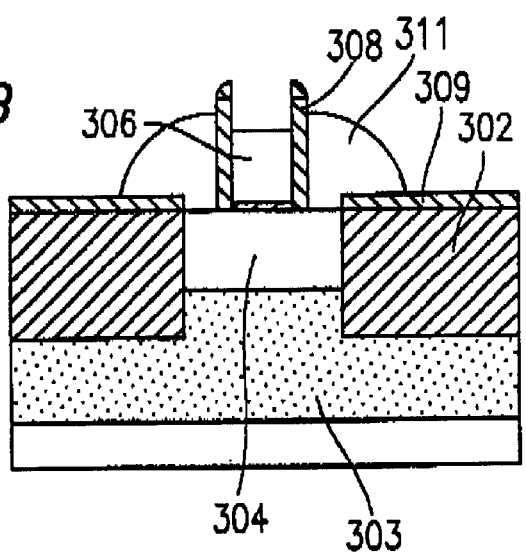
Figure 14C:
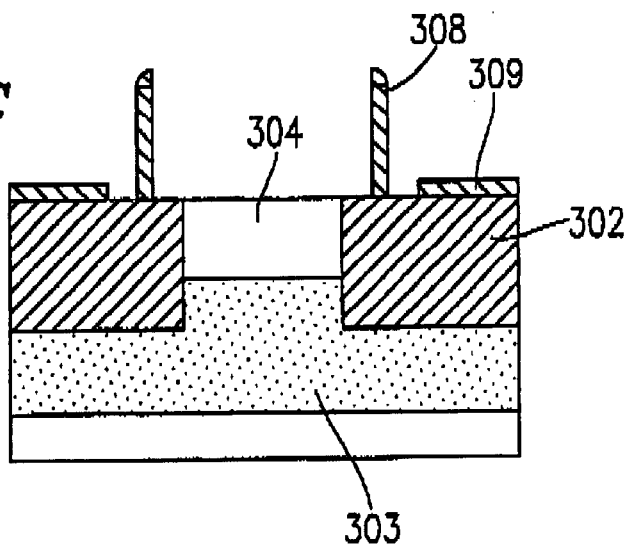
Figure 15A:
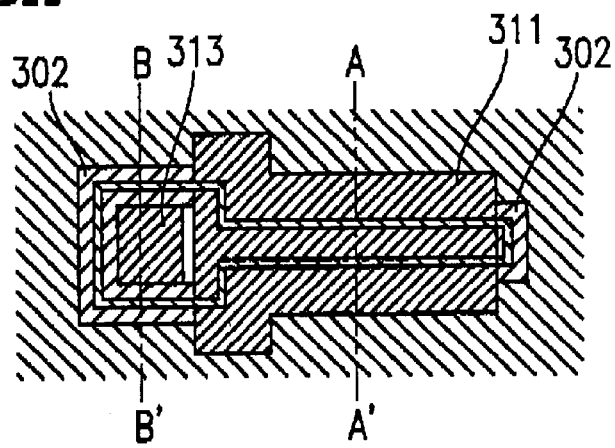
FIGS. 15A, 15B and 15C are views illustrating a step of the method for forming the semiconductor device in the third example.
Figure 15B:
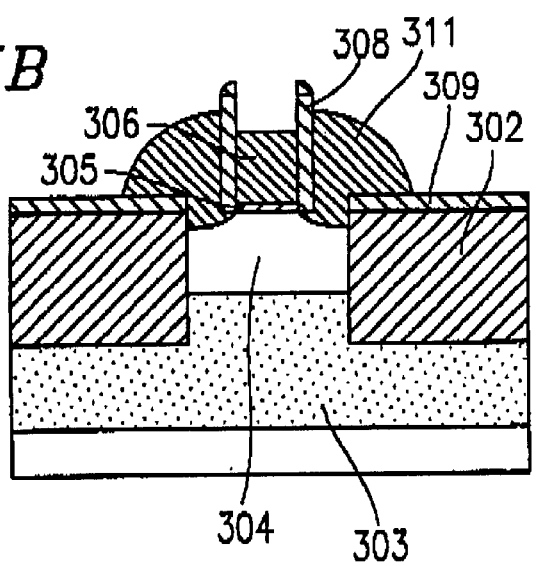
Figure 15C:
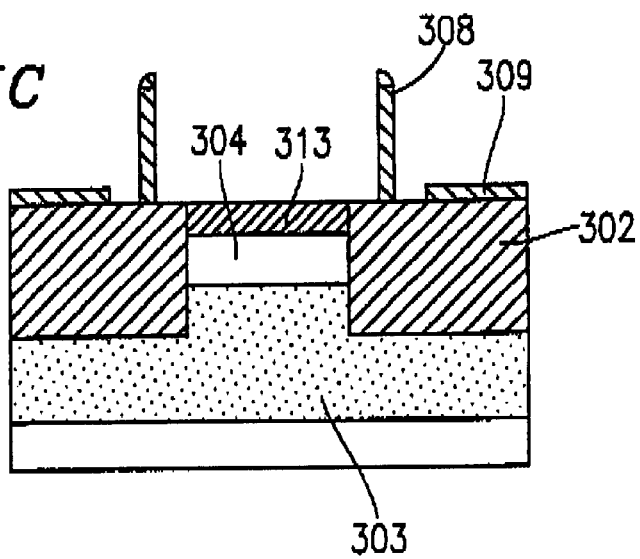
Figure 16A:
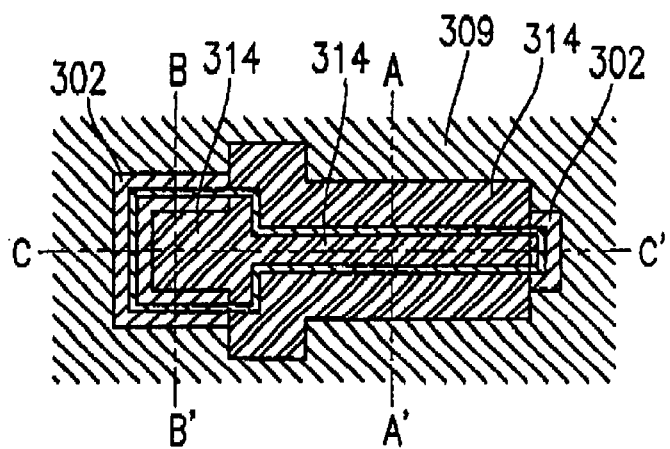
FIGS. 16A, 16B and 16C are views illustrating a step of the method for forming the semiconductor device in the third example.
Figure 16B:
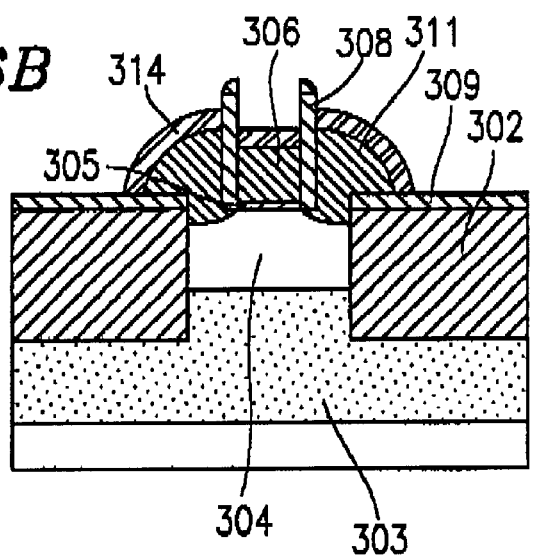
Figure 16C:
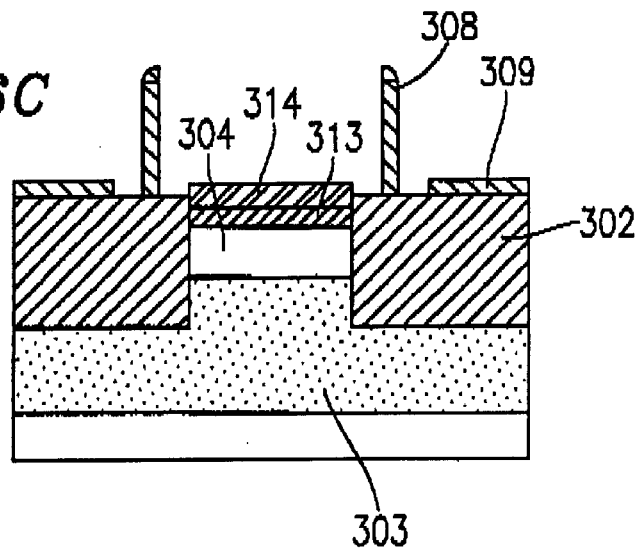
Figure 17A:
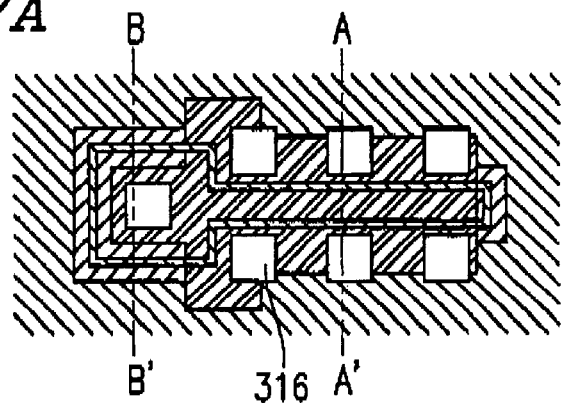
FIGS. 17A, 17B and 17C are views illustrating a step of the method for forming the semiconductor device in the third example.
Figure 17B:
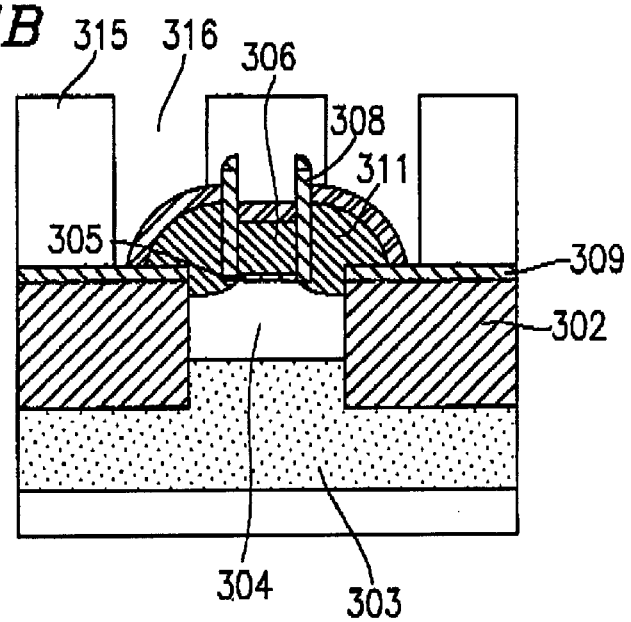
Figure 17C:
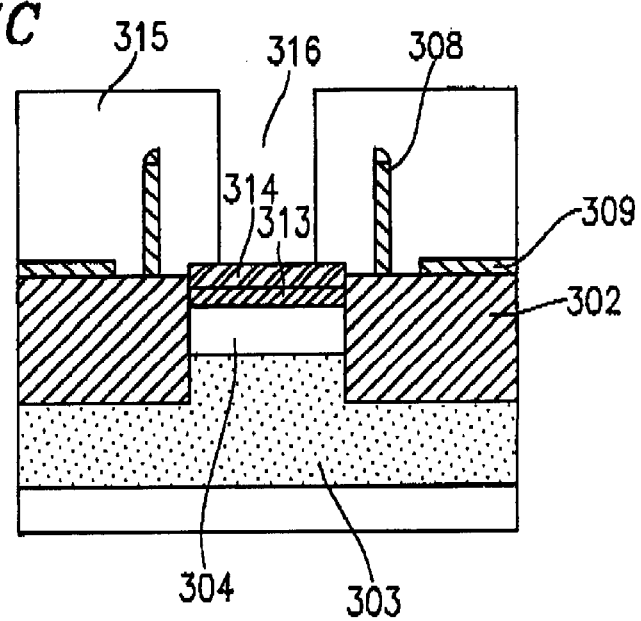

As described in detail in the third or fourth example, when the source and drain regions 208 accumulated above the channel region is formed by etching back polycrystalline silicon as the material of the source and drain regions 208, the surface of the source and drain regions 208 is rough as shown in FIG. 7 due to grains included in the polycrystalline silicon. In this case, the surface area can further be increased.

The shallow well region 203 corresponds to the body region in the SOI substrate. The deep well region 204 is provided in order to isolate the shallow well region 203 from a shallow well region of an adjacent semiconductor device.

Accordingly, the device isolation regions 201 need to be formed deeper than the shallow well region 203. As in the first example, the gate electrode 206 is connected to the shallow well region 203 via the contact region 210 (see FIG. 6B). In this structure, the junction area of the source and drain regions 208 and the shallow well region 203 in FIG. 6A can be minimized. Due to this function, as compared to the invention made by the present inventors and described in Japanese Laid-Open Publication No. 10-22462, the dynamic threshold voltage transistor using the bulk substrate in this example can significantly reduce the capacitance at the junction of the source and drain regions 208 and the shallow well region 203 as described in the Disclosure of the Invention section. Specifically, in the conventional DTMOS using the bulk substrate, a distance j, in a gate length direction vertical to the longitudinal direction of the gate electrode, between the gate electrode 206 and the device isolation region 102 is 2.5 L to 3 L (L is the gate length and is usually a minimum processable size). By contrast, in the DTMOS according to the present invention, the distance j can be reduced to a value close to a sum of the alignment margin for the photolithography process and the thickness of the gate electrode side wall insulating layer. Specifically, the distance can be reduced to about ⅔ L, of which ⅓ L is the alignment margin and a portion of the remaining ⅓ L is the thickness of the gate electrode side wall insulating layer. The junction area of the source and drain regions 208 and the shallow well region is obtained by multiplying this value by a width W of the transistor. When the width W is the same, the junction area of the transistor of the present invention can be as small as about 4/15 to 2/9 of the junction area of the conventional transistor. A planar component of the junction capacitance of the transistor of the present invention can also be as small as about 4/15 to 2/9 of that of the conventional transistor. In addition, in this example, the junction can be formed by implanting impurity ions to act as donors or acceptors for forming the source and drain regions only to the accumulated regions above the channel region and diffusing the impurity ions from the accumulated regions to the solid layer, i.e., the semiconductor substrate. Therefore, the junction can be formed at a very shallow level. Consequently, a perimeter length component of the capacitance can be reduced, and also the effect of the short channel resulting from the size reduction can be effectively restricted. As in the first example, the semiconductor device in this example has the effects of reducing the parasitic resistance in the source and drain regions 208, reducing the contact resistance with respect to the planar size of the source and drain regions 208, alleviating the undesirable thin line influence occurring at the time of siliciding reaction, and compensating for vertical steps generated by formation of the gate electrode.

EXAMPLE 3

In a third example according to the present invention, a specific method for producing the structure in the second example will be described. FIGS. 8A, 9A, 10A, 11A, 12A, 13A, 14A, 15A, 16A and 17A are plan views of steps of production in the third example; and FIGS. 8B, 9B, 10B, 11B, 12B, 13B, 14B, 15B, 16B and 17B are vertical cross-sectional views of FIGS. 8A, 9A, 10A, 11A, 12A, 13A, 14A, 15A, 16A and 17A taken along line A-A' of these figures. FIGS. 14C, 15C, 16C and 17C are vertical cross-sectional views of FIGS. 14A, 15A, 16A and 17A taken along line B-B' of these figures. In this example, a silicide layer is formed on the gate electrode, the source region and the drain region in a self-aligned manner (saliciding process).

Figure 18:
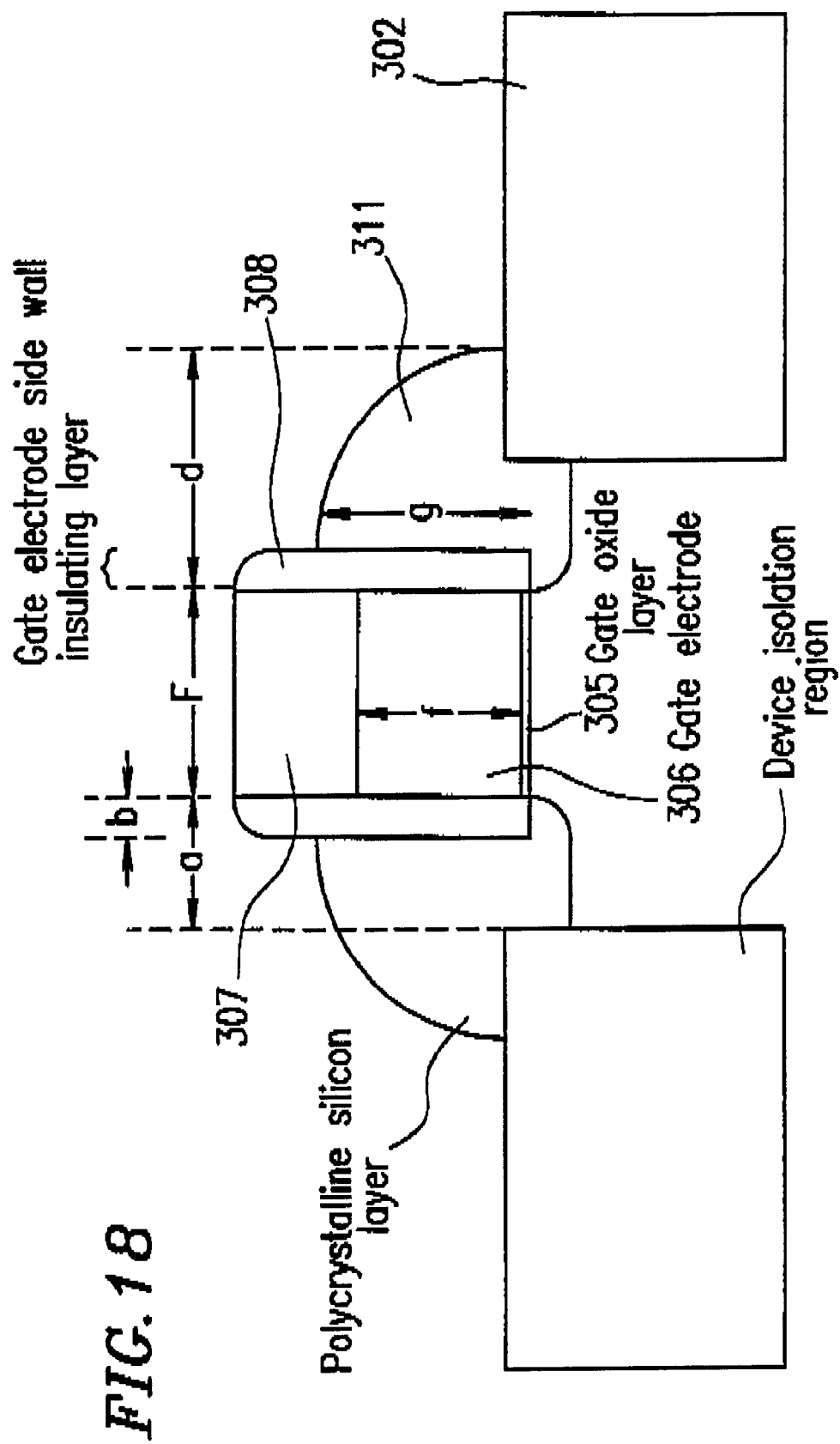
FIG. 18 is a vertical cross-sectional view showing the letters indicating relative sizes of various regions of the semiconductor device in the third example.
Figure 19:
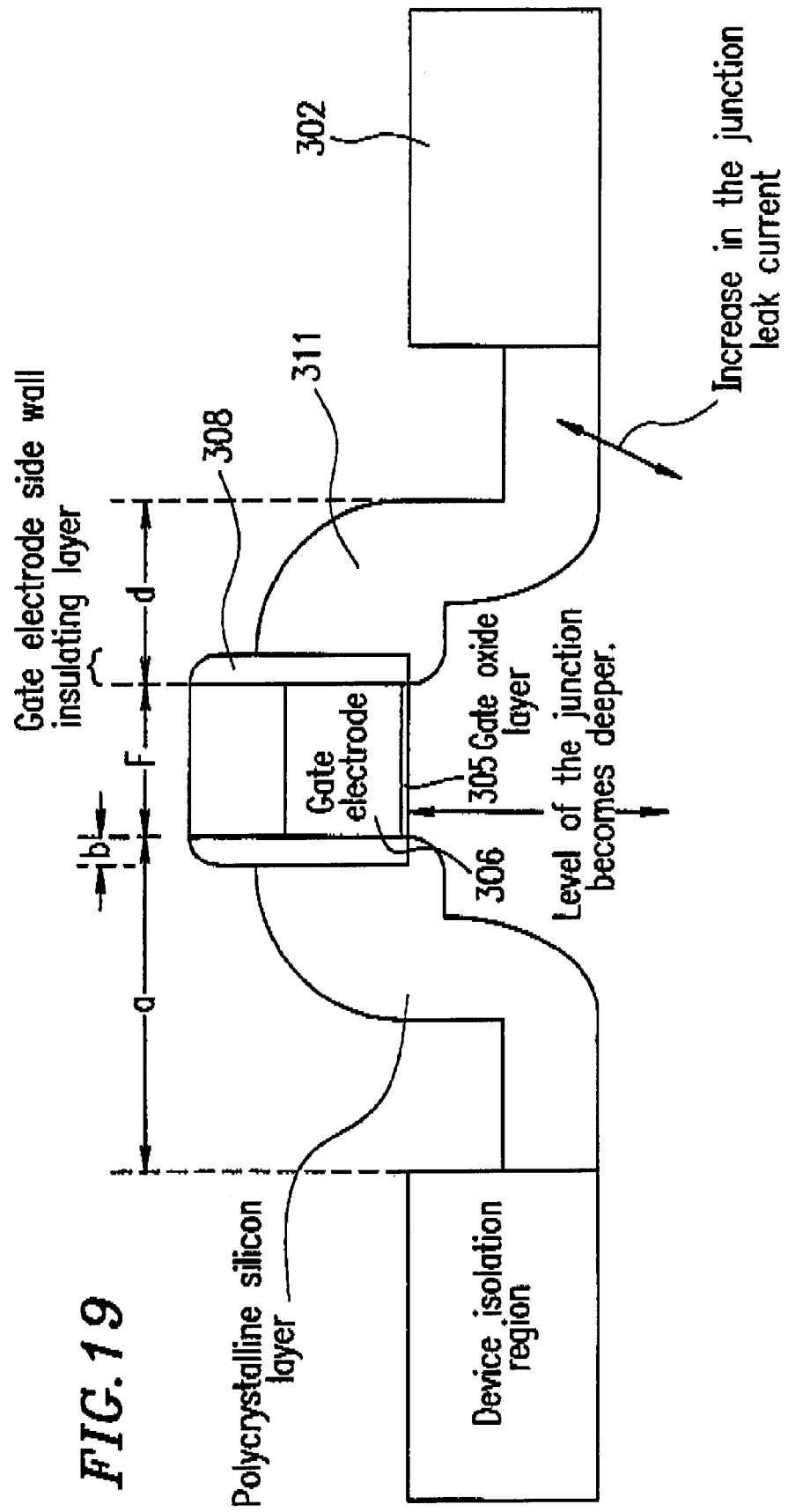
FIG. 19 is a view illustrating defect generation which might occur in the structure of the semiconductor device in the third example when forming source and drain regions.
Figure 21A:
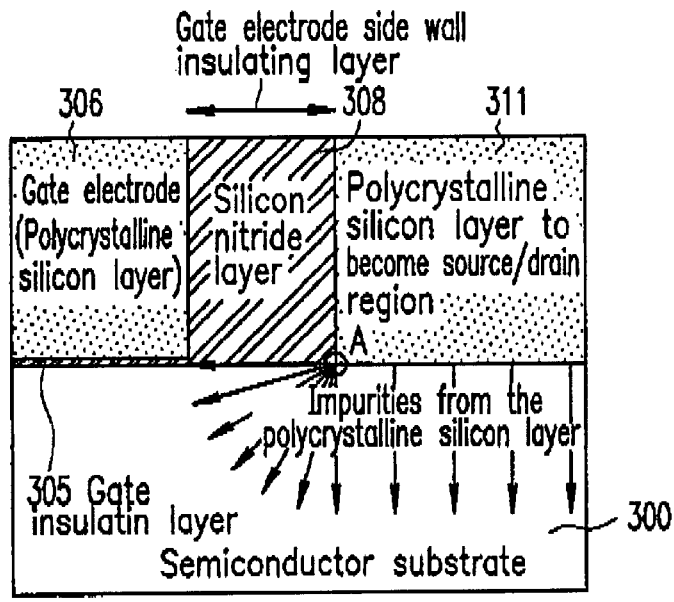
FIGS. 21A, 21B and 21C are views illustrating impurity diffusion from a second conductivity type semiconductor layer which is to become the source the drain regions in the third example.
Figure 21B:
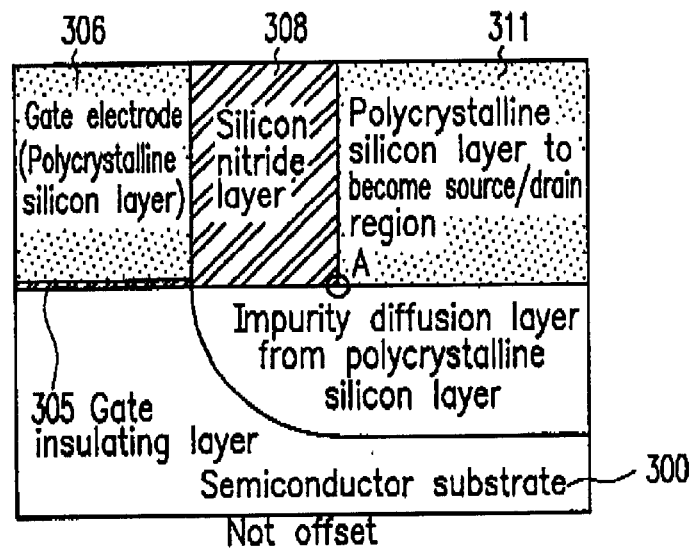
Figure 21C:
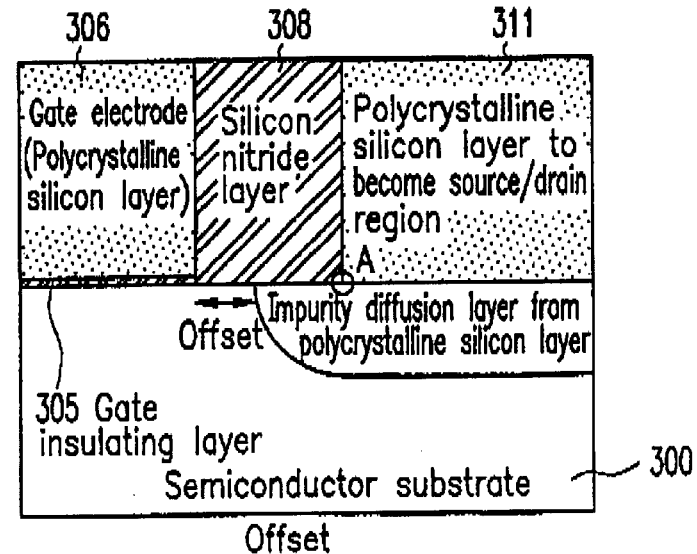
Figure 22:
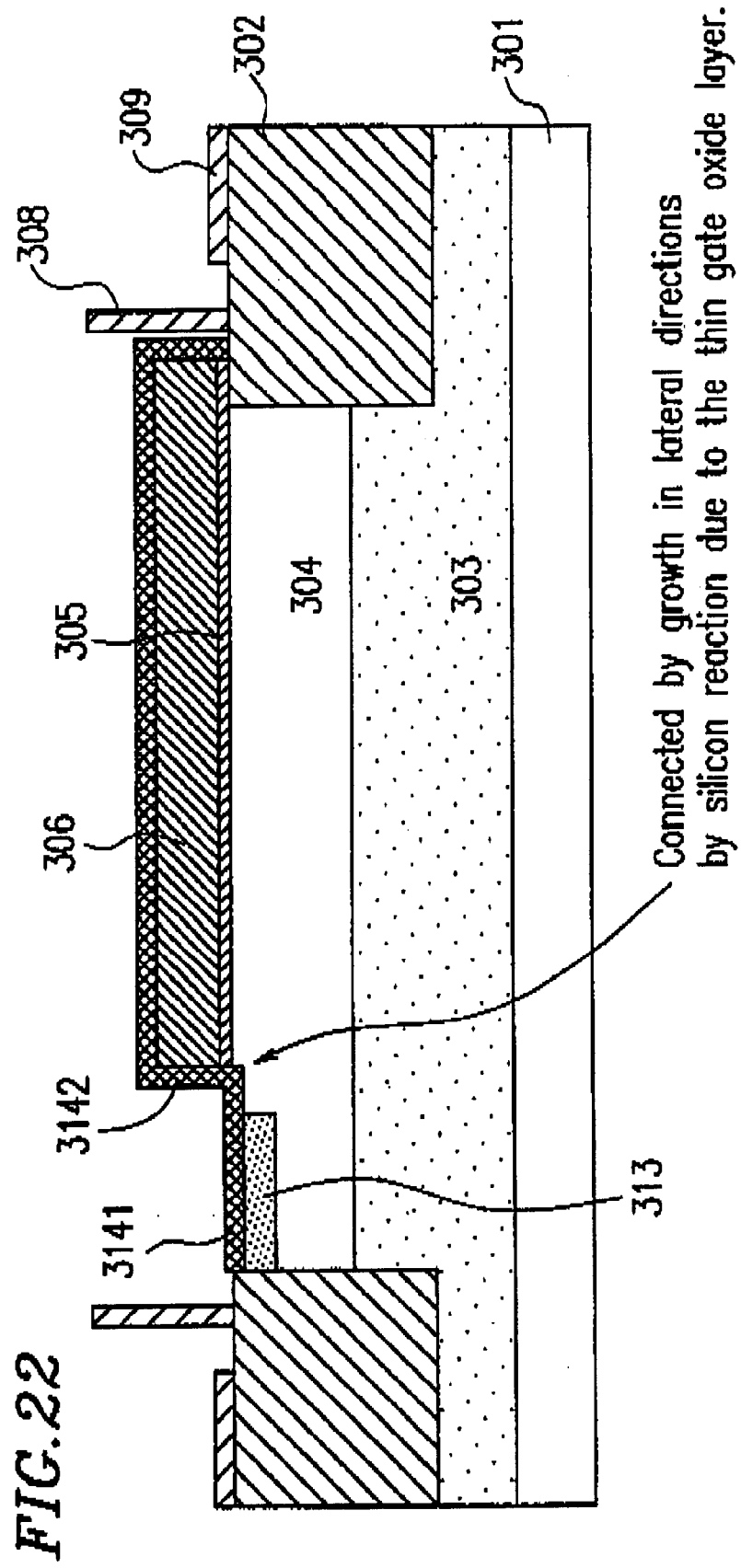
FIG. 22 is a vertical cross-sectional view of FIG. 16A taken along line C—C'.
Figure 24A:
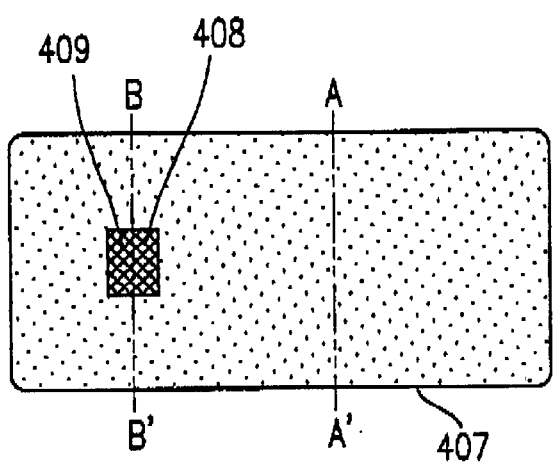
FIGS. 24A, 24B and 24C are views illustrating a step of a method for forming a semiconductor device in a fourth example according to the present invention.
Figure 24B:
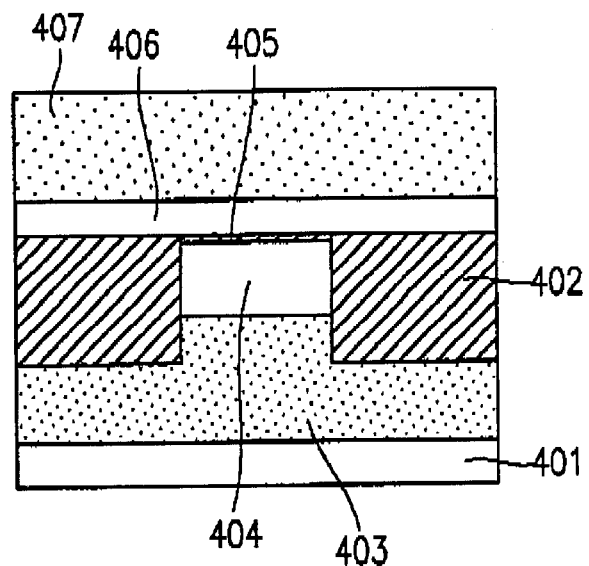
Figure 24C:
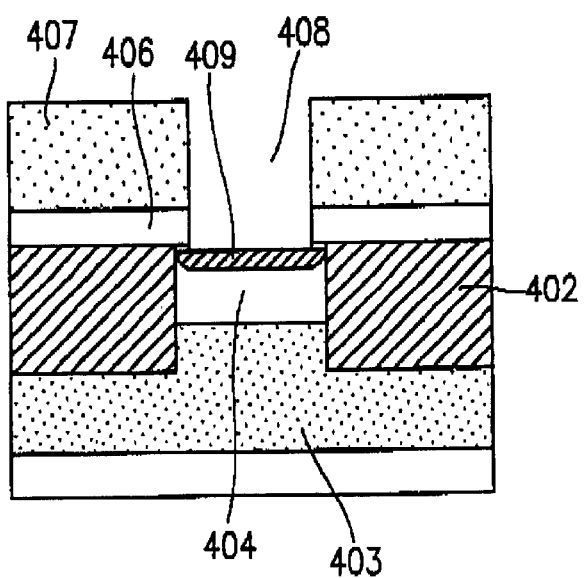
Figure 25A:
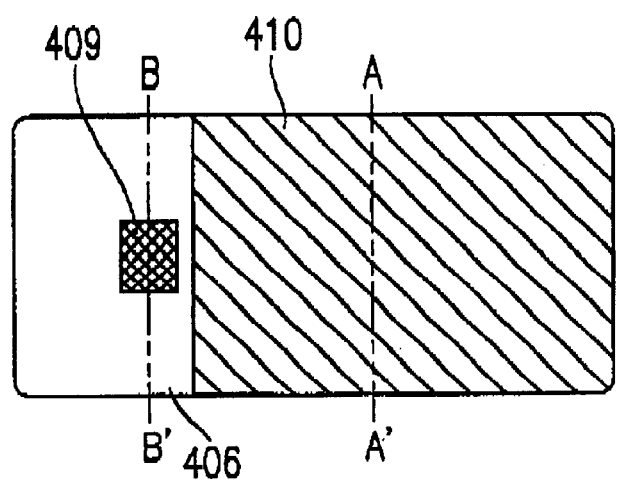
FIGS. 25A, 25B and 25C are views illustrating a step of the method for forming the semiconductor device in the fourth example.
Figure 25B:
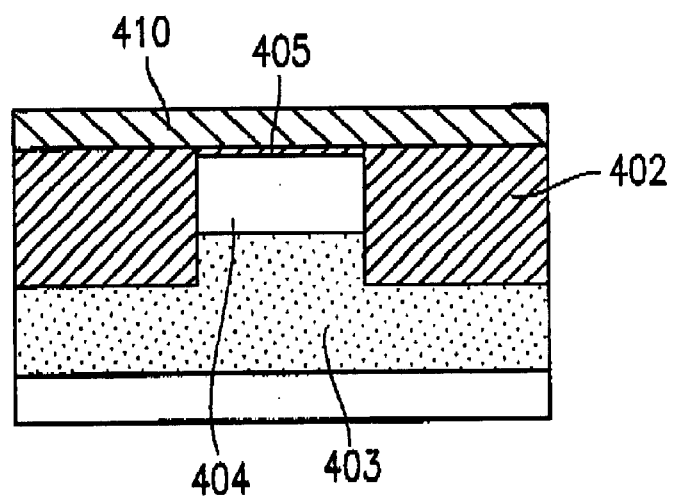
Figure 25C:
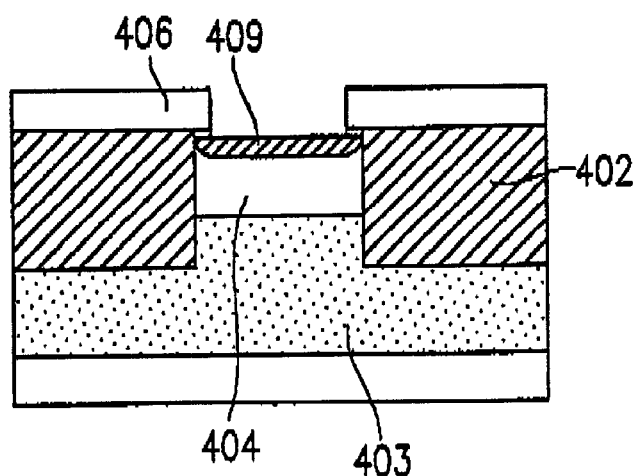

FIG. 18 is a vertical cross-sectional view of the structure in the third example taken in a direction perpendicular to a longitudinal direction of a gate electrode. The letters in FIG. 18 represent relative sizes of respective regions. FIG. 19 illustrates a defect which might occur when the source and drain regions are formed with the structure in the third example. FIGS. 20A and 20B are plan views of the structure in the third example. FIGS. 21A, 21B and 21C illustrate impurity diffusion for forming the source and drain regions in the third example. FIG. 22 is a vertical cross-sectional view of FIG. 16 taken along line C-C'. FIG. 23A is a plan view of a conventional structure, showing the positional relationship among a gate electrode, an active region and contact holes. FIG. 23B is a plan view of the structure in the third example, showing the positional relationship among a gate electrode, an active region and contact holes.

First, as shown in FIG. 8, a device isolation region 302 is formed on a semiconductor substrate 301 by a well-known technique. In this example, the device isolation region 302 is formed by forming a groove having a depth of 400 to 700 nm using an STI (shallow trench isolation) technique and burying an oxide layer in the groove. However, the technique for forming the device isolation region is not limited to this. Any technique is usable which causes the shallow well region to be divided into a plurality of shallow well regions for respective devices.

Then, as shown in FIG. 9, a deep well region 303 and shallow well region 304 are formed. In this example, when an n-channel transistor is to be formed, the deep well region 303 is formed by implanting about $5 \times 10^{12}$ to $5 \times 10^{13}/cm^2$ of phosphorus at an energy of about 250 keV to 350 keV. When a p-channel transistor is to be formed, the deep well region 303 is formed by implanting about $5 \times 10^{12}$ to $5 \times 10^{13}/cm^2$ of boron at an energy of about 170 keV to 230 keV. When the n-channel transistor is to be formed, the shallow well region 304 is formed by implanting about $1 \times 10^{12}$ to $1 \times 10^{14}/cm^2$ of boron at an energy of about 35 keV to 90 keV. When the p-channel transistor is to be formed, the shallow well region 304 is formed by implanting about $1 \times 10^{12}$ to $1 \times 10^{14}/cm^2$ of boron at an energy of about 100 keV to 200 keV.

The technique for forming each well is not limited to this. Basically, any technique is usable which provides the relationship of $S_{Wxj} < T_d < D_{Wxj}$ where $T_d$ is the depth of the device isolation region, $S_{Wxj}$ is the depth of the shallow well, and $D_{Wxj}$ is the depth of the deep well. Precisely, it is preferable that the relationship of $S_{Wxj} + D_{spw} < T_d$ is provided where $D_{spw}$ is the width of a depletion layer between the shallow well region and the deep well region. However, when the operation is performed at a low supply voltage (in an actual use, it is preferable to use the transistor at a supply voltage which is equal to or lower than the built-in potential at the P-N junction of the shallow well region and the source and drain regions since the transistor is in a forward bias state with respect to the P-N junction when the transistor is ON), the relationship of $S_{Wxj} < T_d \leq S_{Wxj} + D_{spw}$ is acceptable.

Next, as shown in FIG. 10, a gate oxide layer 305, a gate electrode 306, and an insulating layer 307 (silicon oxide layer in this example) are formed in a usual manner. The insulating layer 307 is formed on the gate electrode 306. With reference to FIG. 18, the relative sizes of the respective regions will be described. The minimum processable size is defined as F. The width of the gate electrode 306, i.e., the gate length of the transistor, is processed to the minimum processable size. At this point, distance a from the gate electrode 306 to the device isolation region 302 can be designed to provide the relationship of a>b+c where b is the thickness of the gate electrode side wall insulating layer and c is the alignment margin for aligning the gate electrode 306 with respect to the device isolation region (in general, c=⅓×F). When the alignment is done with the maximum tolerable error of c, the value obtained by multiplying a−(b+c) or a−b+c by the gate width of the transistor corresponds to the planar size of the source and drain regions, i.e., the area of a plane of the source and drain regions parallel to the surface of the semiconductor substrate. Basically, in order to minimize the planar size of the source and drain regions, when the gate electrode 306 is not aligned to the device isolation region as designed, a−(b+c) is preferably as small as possible from the viewpoint of reducing the junction capacitance. It should be noted, however, that a−(b+c) should be sufficiently large to allow the impurities acting as donors or acceptors to be diffused from the accumulated regions, and should be sufficiently large to avoid a significant increase in the parasitic resistance. Specifically, the present inventors designed the transistor with the sizes of b=0.05 μm, c=±0.08 μm, a=0.16 μm with the F=0.24 μm rule.

Then, as shown in FIG. 11, a gate electrode side wall insulating layer 308 is formed. In this example, a silicon nitride layer is deposited on the entire surface of the laminate produced so far. Then, a resist layer having an opening is formed by photolithography using a mask having the same planar shape as that of the gate electrode 306 except that the distance a is larger than that of the gate electrode 306 by 0.16 μm. Using the resist layer as a mask, the silicon nitride layer is etched back. In this manner, the gate electrode side wall insulating layer 308 is formed, and in addition, a silicon nitride layer 309 is formed on the device isolation region. The gate electrode side wall insulating layer 308 is formed of a silicon nitride in this example, but can instead have a two layer structure of a silicon oxide layer and a silicon nitride layer.

Next, as shown in FIG. 12, a polycrystalline silicon layer 310 is formed on the entire surface of the laminate produced so far by chemical vapor deposition (CVD). The polycrystalline silicon layer 310, which needs to be subjected to anisotropic etching so as to be left on the gate electrode side walls in the next step, is required to be processed so that an end of each side wall overlaps the respective device isolation region 302 when the polycrystalline silicon 310 is left on the side walls. If the end of each side wall does not overlap the respective device isolation region 302, i.e., if the distance a is excessively large, the silicon substrate is dug by anisotropic etching back as shown in FIG. 19. In such a case, the silicon substrate is damaged, the amount of the junction leakage current increases, and the level of the junction becomes deeper. Accordingly, the undesirable effect of the short channel is aggravated.

Specifically, a width d of each side wall (see FIG. 18) is determined by the step of the gate electrode 306 (the total height of the gate electrode 306 and the insulating layer 307) and the thickness of the polycrystalline silicon layer 310. In this example, since the transistor is designed with a=0.16 μm, d is set as d=0.3 μm so as to fulfill the relationship of d>a+c in consideration of the alignment error of the gate electrode 306 and the device isolation region (c=±0.08 μm in this example). The step of the gate electrode 306 is set to 300 nm to 400 nm, and the thickness of the polycrystalline silicon layer is set to 400 nm to 500 nm, so as to realize d=0.3 μm. The above-mentioned specific numerical values are selected in the range which can be realized by the present inventors under the F=0.24 μm rule. Any other values are usable which satisfy the relationships of a>b+c and d>a+c. In order to reduce the capacitance between the source and drain regions and the side walls of the gate electrode, the step of the gate electrode is preferably as small as possible as long as the relationship of d>a+c is fulfilled.

It is important that a polycrystalline silicon layer is deposited so as to prevent, to a maximum possible degree, spontaneous formation of an oxide layer at the interface between the surface of the active layer in the semiconductor substrate and the polycrystalline silicon layer. This becomes very important, in a later step, for diffusing impurities acting as donors or acceptors to the semiconductor substrate by thermal diffusion after the impurities are introduced into the polycrystalline silicon layer by ion implantation. If the oxide layer is spontaneously formed at the interface between the surface of the active region in the semiconductor substrate and the polycrystalline silicon layer, the oxide layer spontaneously formed acts as a diffusion barrier to inhibit uniform impurity diffusion (i.e., the depth of the level of the junction of the source and drain regions and the shallow well region is non-uniform). This causes dispersion in the transistor characteristics. In this example, a pre-exhaust chamber, a nitrogen purge chamber in which the dew point is maintained at −100° C., and a low pressure CVD (LPCVD) apparatus including a deposition furnace are used in order to form the polycrystalline silicon layer without causing spontaneous formation of an oxide layer at the interface.

Specifically, the polycrystalline silicon layer is formed in the following manner. Polysilicon is washed with a hydrogen fluoride-based solution immediately before being deposited, thereby removing a spontaneous oxide layer. Then, the wafer is transported to a pre-vacuum exhaust chamber. In this chamber, the atmosphere at the time of transportation is once exhausted to realize a vacuum state, and the interior atmosphere of the chamber is substituted with a nitrogen atmosphere. The wafer is then transported to a nitrogen purge chamber in which the dew point is maintained at −100° C. The nitrogen purge chamber is used to completely remove water molecules adsorbed to the wafer surface. Water molecules adsorbed to the wafer surface cannot be removed in vacuum. The experiments performed by the present inventors have shown that the water molecules adsorbed to the wafer surface can be completely removed by nitrogen purge.

With a conventional LPCVD apparatus, the wafer is transported to the deposition furnace while the water molecules are still adsorbed to the wafer surface. Deposition of a polycrystalline silicon layer is usually performed at a temperature of about 500° C. to 700° C. Therefore, when the wafer is transported to the deposition furnace having a high temperature, an oxygen component of the adsorbed water reacts with silicon in the wafer. As a result, an oxide layer is spontaneously formed on the silicon wafer surface before the polycrystalline silicon layer is deposited. Thus, the active region surface and the polycrystalline silicon layer sandwich the spontaneous oxide layer at an interface therebetween. However, in the LPCVD apparatus in this example, the adsorbed water molecules are completely removed in the nitrogen purge chamber in which the dew point is maintained at −100° C. and then the wafer is transported to the deposition furnace. Therefore, the polycrystalline silicon layer can be formed without causing spontaneous formation of an oxide layer.

Then, as shown in FIG. 13, the polycrystalline silicon layer 310 is etched back. Etching is performed with a mixture gas of chlorine and oxygen at a pressure of 0.3 Pa using a helicon type RIE apparatus. An end point detector (EPD) is used to perform over-etching by 10% to 30%. The over-etching is performed until the insulating layer 307 on the gate electrode 306 is exposed.

Next, as shown in FIG. 14, the insulating layer 307 on the gate electrode 306 is removed. In this example, the insulating layer 307 on the gate electrode 306 is removed with a hydrogen fluoride-based solution since the insulating layer 307 is formed of silicon oxide. Since the wafer is covered with the polycrystalline silicon layer 310, the gate electrode side wall insulating layer 308 and the silicon nitride layer 309 except for the gate electrode 306, only the insulating layer 307 on the gate electrode 306 can be removed. The etching of the polycrystalline silicon layer 310 in the previous step is not sufficient. After the etching back performed in the previous step, the polycrystalline silicon layer 310 still remains around the gate electrode 306 via the gate electrode side wall insulating layer 308 as shown in FIG. 20A. Accordingly, the source region and the drain region are connected to each other. In order to utilize the polycrystalline silicon layer 310 as the accumulated source and drain regions 311, a portion of the polycrystalline silicon layer 310 which is in the vicinity of two ends of the gate electrode 306 needs to be removed to separate the source region 311 and the drain region 311 from each other.

The polycrystalline silicon layer is subjected to dry etching, with the portion which is not be removed being covered with a mask. Thus, portions of the polycrystalline silicon layer are removed for separating the source region 311 and the drain region 311 from each other and for forming a contact region in the gate electrode 306. The etching is performed under the conditions of allowing for slight side etching in order to guarantee the separation even when the gate electrode side walls are not vertical to the surface of the substrate. Specifically, the etching is performed with a mixture gas of hydrogen bromide and oxygen at a pressure of 0.4 Pa using a helicon type RIE apparatus.

In the case where the etching for separating the source region and the drain region from each other is concurrently performed with the etching for forming the contact region in the gate electrode 306, the need for performing lithography to form a contact region for connecting the gate electrode 306 and the shallow well region 304 is eliminated. A portion of the gate oxide layer 305 positionally corresponding to the contact region is removed after the portion of the polycrystalline silicon 311 is removed in correspondence with the contact region. The gate oxide layer 305 can be removed after the ion implantation and activating annealing described below.

Next, as shown in FIG. 15, impurity ions are implanted for forming the source and drain regions 311. In this example, the gate electrode 306 and the source and drain regions 311 are doped in the same step. To a contact region 313 for connecting the gate electrode 306 and the shallow well region 304, impurity ions of a conductivity type opposite to that of the impurity ions implanted for forming the source and drain regions 311 are implanted.

In this example, in order to form a CMOS device, the step of implanting donor impurities into the source region, the drain region and the gate electrode 306 of an n-channel transistor is concurrently performed with the step of implanting donor impurities into the contact region for shortcircuiting the gate electrode 306 and the n conductivity type shallow well region 304 of a p-type transistor. The step of implanting acceptor impurities into the source region, the drain region and the gate electrode 306 of the p-channel transistor is concurrently performed with the step of implanting acceptor impurities into the contact region for shortcircuiting the gate electrode 306 and the p conductivity type shallow well region 304 of the n-channel transistor. This is one feature of this example.

Accordingly, ion implantation for connecting the gate electrode and the shallow well region can be performed using only a usual CMOS process without requiring any additional step. Specifically, the impurity concentration of a surface of the shallow well region 304, which usually determines the threshold voltage of the device, is set to be low (about $5\times10^{16}$ to $5\times10^{18}/cm^3$). For forming a contact region in the shallow well region in order to, for example, connect a metal line or the silicide layer (as according to the present invention) to the above-mentioned low concentration region, the impurity concentration of the contact region needs to be high ($10^{20}/cm^3$ or more). This indispensably requires ion implantation into the contact region. If the low concentration contact region contacts a metal or metal silicide layer, a Schottky connection occurs but not an ohmic connection.

Thickness F of the polycrystalline silicon layer acting as a gate electrode in this example (see FIG. 18) is 200 nm to 250 nm. A maximum height g of the accumulated in the vicinity of the gate electrode 306 is 200 nm to 300 nm. Accordingly, for the n-channel transistor, about $1\times10^{15}$ to $1\times10^{16}/cm^2$ of phosphorus ions are implanted at an energy of about 20 keV to 80 keV. For the p-channel transistor, about $1\times10^{15}$ to $1\times10^{16}/cm^2$ of boron ions are implanted at an energy of about 10 keV to 40 keV. In order to prevent the impurity ions from being diffused through the gate oxide layer by channeling and to control the diffusion of ions in the polycrystalline silicon layer, about $5\times10^{14}$ to $5\times10^{15}/cm^2$ of silicon ions can be implanted beforehand so as to change the polycrystalline silicon layer into an amorphous silicon layer. In this case, since the grain boundary of polycrystalline silicon is destroyed to some extent as expected, it is important, for forming a CMOS device, that the polycrystalline silicon layer is changed into an amorphous silicon layer under conditions appropriate to the type of impurity ions used.

After the ion implantation, heat treatment is performed at a temperature of about 800° C. to 950° C. for about 10 to 120 minutes, or rapid heat treatment is performed at a temperature of about 950° C. to 1100° C. for 10 to 60 seconds. Thus, the implanted impurities are activated and diffused into the silicon substrate. The heat treatment needs to be done until immediately before the source and drain regions 311 are offset with respect to the gate electrode 306. Specifically, the impurities need to be diffused in lateral directions at least by the thickness of the gate electrode side wall insulating layer 308. In order to improve the performance of the transistor (in order to prevent short channel effect and increase the amount of the driving current), the source and drain regions 311 need to be formed so as to make the depth of the level of the junction as shallow as possible and prevent the source and drain regions 311 from being offset with respect to the gate electrode 306.

FIG. 21 shows the manner of diffusion of impurities. When impurities are diffused from point A in FIG. 21A so as to offset the source and drain regions 311 with respect to the gate electrode 306 in lateral directions as shown in FIG. 21C, the amount of the driving current of the device is significantly reduced. Therefore, the impurity diffusion state shown in FIG. 21B is preferable. Specifically, the depth of the level of the junction of the source and drain regions and the shallow well region in the vicinity of the gate electrode is preferably 0.8 times the thickness of the gate electrode side wall insulating layer 308. The diffusion distances in the lateral and vertical directions are directly determined. Accordingly, in order to reduce the depth of the level of the junction of the source and drain regions and the shallow well region and thus restrict the short channel effect, the gate electrode side wall insulating layer 308 needs to be as thin as possible within a range in which an increase in the capacitance of the gate electrode side walls does not cause a significant increase in the entire load capacitance. In this example, the gate electrode side wall insulating layer 308 is 0.05 $\mu$m as described above.

Figure 39:
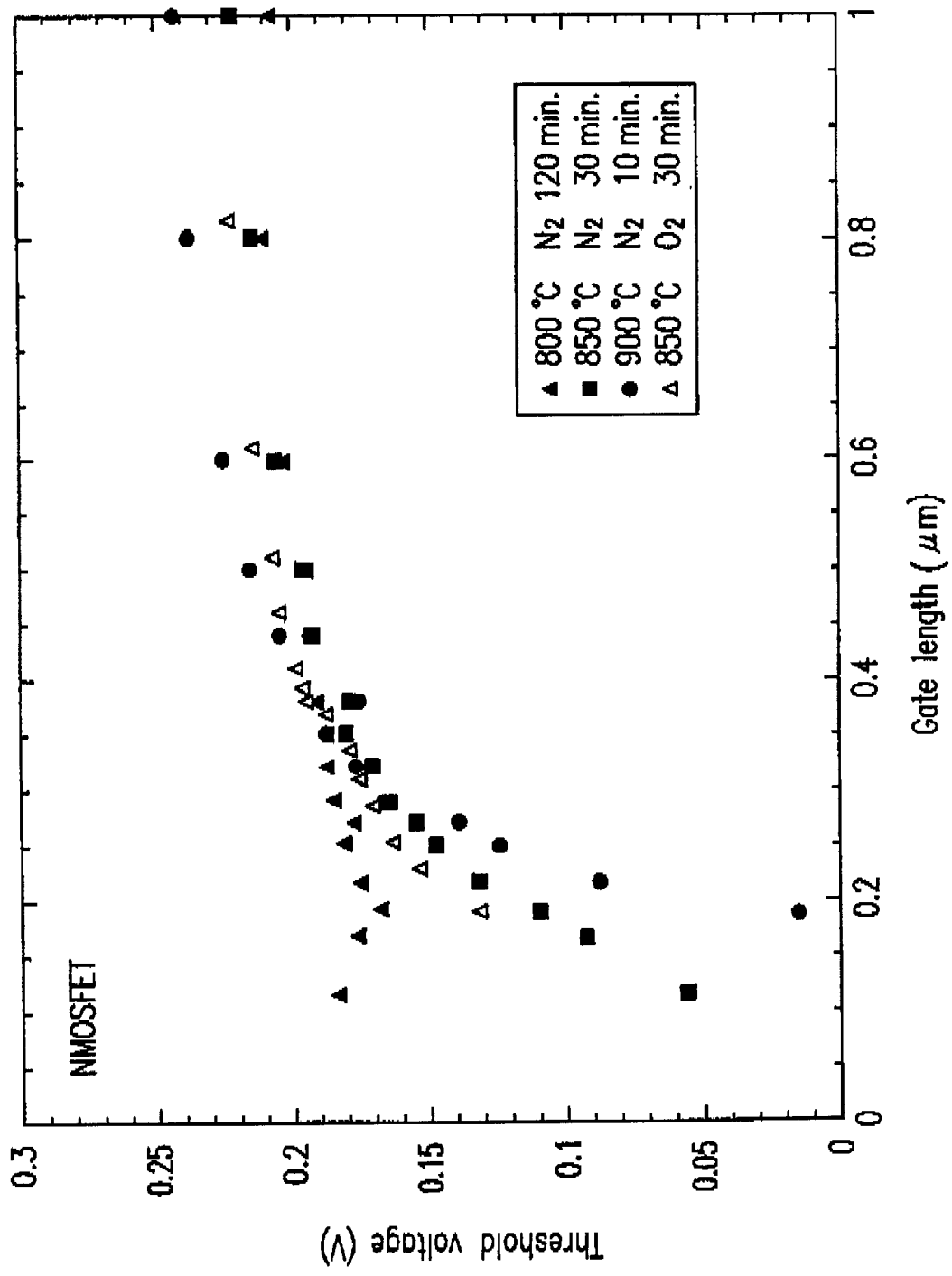
FIG. 39 is a graph illustrating the heat treatment condition and a short channel effect in an n-channel transistor.

FIGS. 39 through 42 show data on the specific relationships between the short channel effect and heat treatment. FIG. 39 shows the result of an experiment performed on an n-channel transistor. In the experiment, $5\times10^{15}$ cm$^{-2}$ of phosphorus ions are implanted as impurities for forming source and drain regions at an energy of 50 keV. Heat treatment is performed under each of conditions or 800° C. for 120 minutes in a nitrogen atmosphere, 850° C. for 30 minutes in a nitrogen atmosphere, 900° C. for 10 minutes in a nitrogen atmosphere, and 850° C. for 30 minutes in an oxygen atmosphere.

Figure 40:
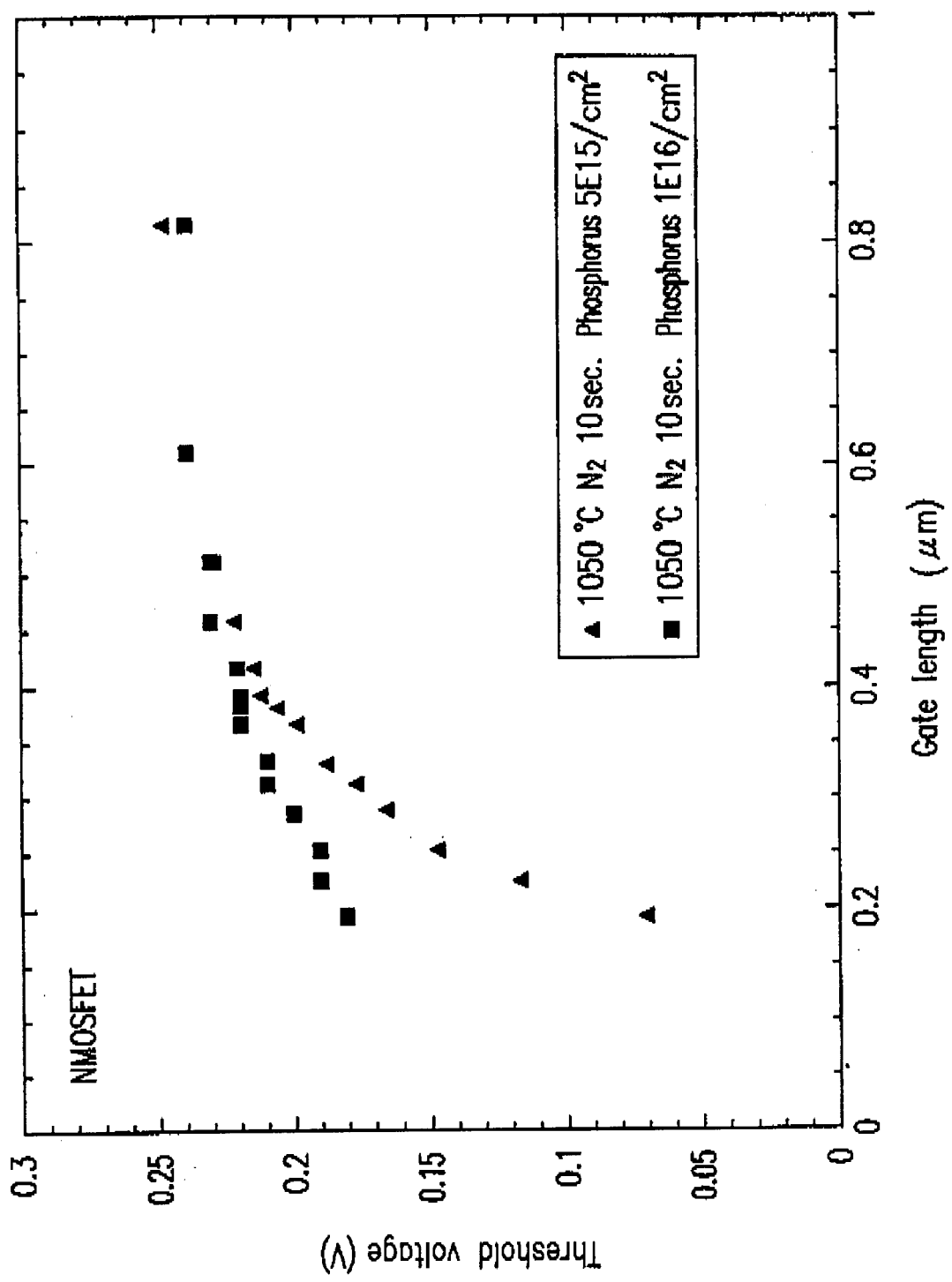
FIG. 40 is a graph illustrating the heat treatment condition and a short channel effect in the n-channel transistor.

FIG. 40 shows the result of an experiment performed on an n-channel transistor. In the experiment, implantation of phosphorus ions is performed with each of doses of $5\times10^{15}$ cm$^{-2}$ and $1\times10^{16}$ cm$^{-2}$ as impurities for forming source and drain regions at an energy of 50 keV, and then rapid heat treatment is performed at 1050° C. for 10 seconds in a nitrogen atmosphere.

Figure 41:
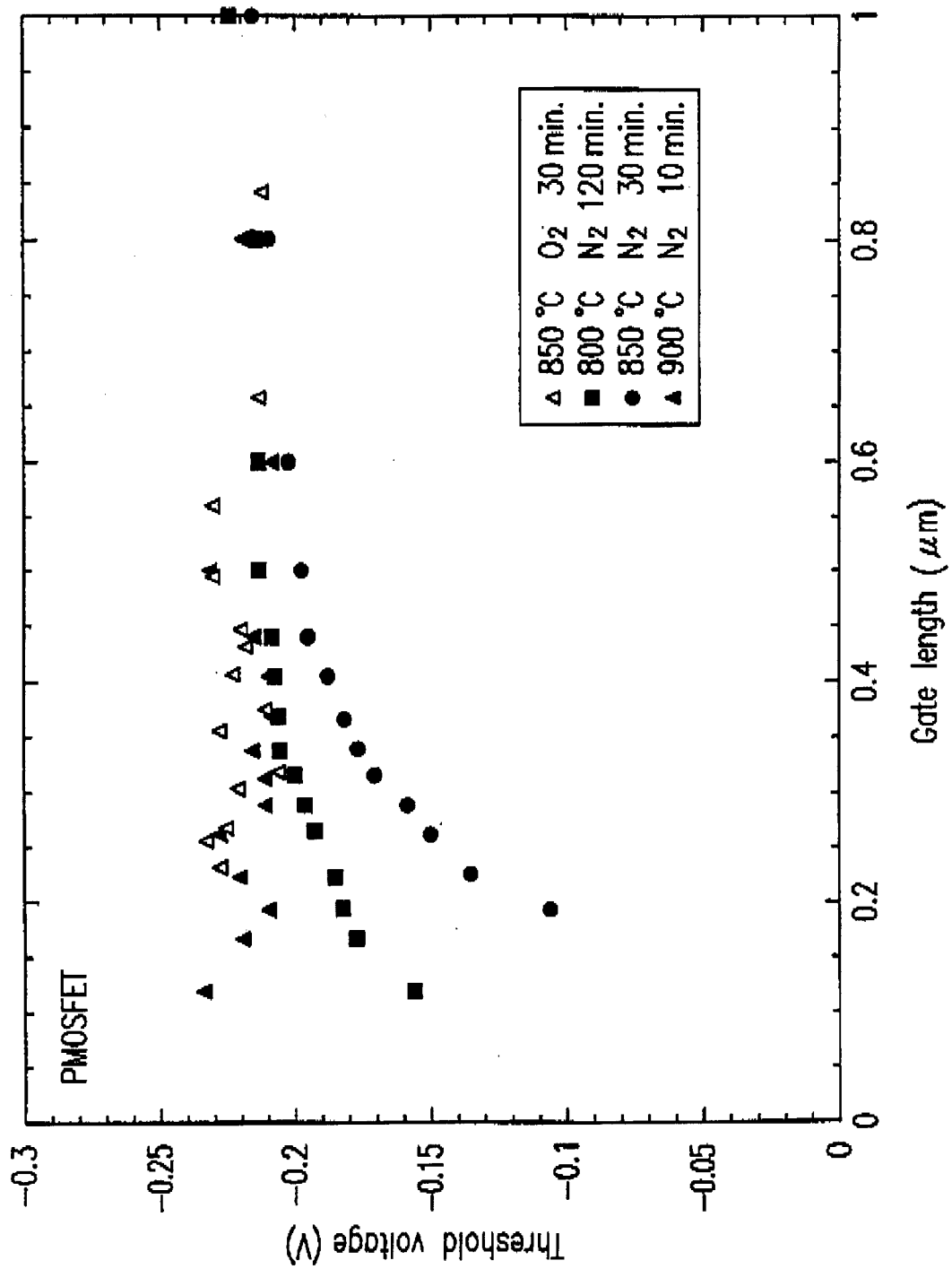
FIG. 41 is a graph illustrating the heat treatment condition and a short channel effect in a p-channel transistor.

FIG. 41 shows the result of an experiment performed on a p-channel transistor. In the experiment, $5\times10^{15}$ cm$^{-2}$ of boron ions are implanted as impurities for forming source and drain regions at an energy of 15 keV. Heat treatment is performed under each of conditions of 800° C. for 120 minutes in a nitrogen atmosphere, 850° C. for 30 minutes in a nitrogen atmosphere, 900° C. for 10 minutes in a nitrogen atmosphere, and 850° C. for 30 minutes in an oxygen atmosphere.

Figure 42:
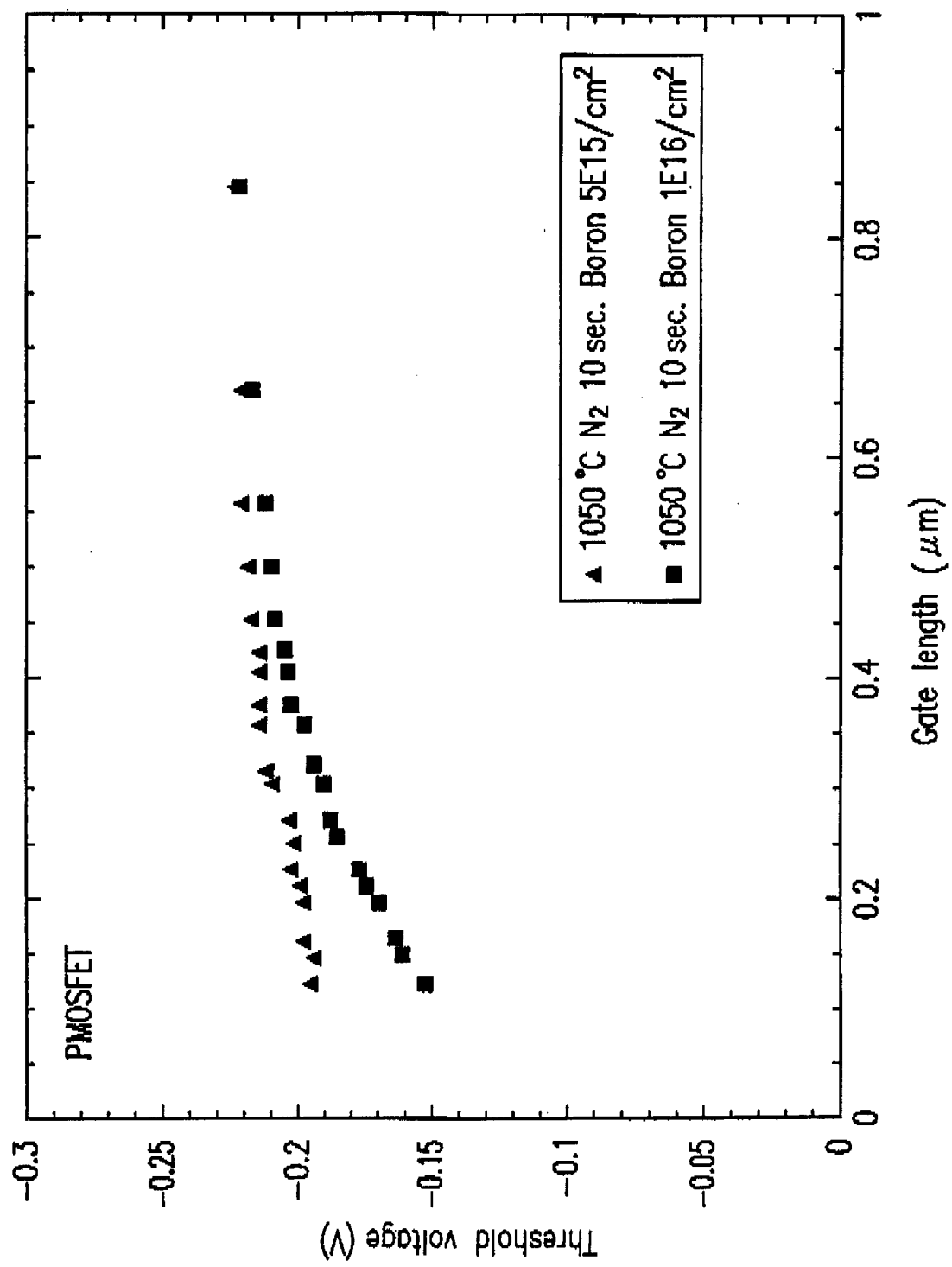
FIG. 42 is a graph illustrating the heat treatment condition and a short channel effect in the p-channel transistor.

FIG. 42 shows the result of an experiment performed on a p-channel transistor. In the experiment, implantation of boron ions is performed with each of doses of $5\times10^{15}$ cm$^{-2}$ and $1\times10^{16}$ cm$^{-2}$ as impurities for forming source and drain regions at an energy of 15 keV, and then rapid heat treatment is performed at 1050° C. for 10 seconds in a nitrogen atmosphere.

The results are as follows. In the case where $5\times10^{15}$ cm$^{-2}$ of phosphorus ions are implanted into the n-channel transistor including a gate electrode side wall insulating layer having a thickness of about 0.05 $\mu$m and a gate electrode having a gate length of about 0.24 $\mu$m, the optimum result is obtained when the heat treatment is performed within the range from 850° C. for 30 minutes in a nitrogen atmosphere or an oxygen atmosphere to 900° C. for 10 minutes in a nitrogen atmosphere. In the experiment providing the results shown in FIG. 39, heat treatment at 800° C. for 120 minutes in an oxygen atmosphere is not sufficient. Although not shown, it can be appreciated that heat treatment under such a condition results in an offset transistor, in consideration of the data on the driving current of the transistor. In the case where the dose of the ions is increased from $5\times10^{15}$ cm$^{-2}$ to $1\times10^{14}$ cm$^{-2}$, a satisfactory result is obtained, as shown in FIG. 40 when heat treatment is performed at 1050° C. for 10 seconds in a nitrogen atmosphere, due to the influence of rapid diffusion caused by the high concentration of the impurities. In the case where the dose of the ions is $5\times10^{15}$ cm$^{-2}$, sufficient diffusion is not obtained by heat treatment performed at 1050° C. for 10 seconds in a nitrogen atmosphere, as shown in FIG. 40. Although not shown, it can be appreciated that heat treatment under such a condition results in an offset transistor, in consideration of the data on the driving current of the transistor.

The results are as follows. In the case where $5\times10^{15}$ cm$^{-2}$ of boron ions are implanted into the p-channel transistor including a gate electrode side wall insulating layer having a thickness of about 0.05 $\mu$m and a gate electrode having a gate length of about 0.24 $\mu$m, the optimum result is obtained when the heat treatment is performed at 850° C. for 30 minutes in a nitrogen atmosphere and at 900° C. for 10 minutes in a nitrogen atmosphere. In the experiment providing the results shown in FIG. 41, heat treatment at 800° C. for 120 minutes in an oxygen atmosphere and at 850° C. for 30 minutes in an oxygen atmosphere is not sufficient. Although not shown, it can be appreciated that heat treatment under such a condition results in an offset transistor, in consideration of the data on the driving current of the transistor. In the case where the dose of the ions is increased from $5\times10^{15}$ cm$^{-2}$ to $1\times10^{16}$ cm$^{-2}$, sufficient diffusion of boron ions is not obtained as shown in FIG. 42. Although not shown, it can be appreciated that heat treatment under such a condition results in an offset transistor, in consideration of the data on the driving current of the transistor.

From the above-described results, it has been found that for diffusing impurities to form an n-channel transistor and to form a p-channel transistor by one cycle of heat treatment with the thickness of the gate electrode side wall insulating layer being 0.05 $\mu$m, the optimum result is obtained when heat treatment if performed within the range from 850° C. for about 30 minutes in a nitrogen atmosphere to 900° C. for about 10 minutes in a nitrogen atmosphere.

In this example, the above-described conditions are obtained as a result of designing each of the values so as to satisfy the relationships of a>b+c and d>a+c within the ranges which can be realized by the present inventors with the F=0.24 $\mu$m rule. The conditions are not limited to these. It should be noted that "c" is the positioning margin for the gate electrode and device isolation region and is not shown in the figures. For example, when the F=0.1 $\mu$m rule or the like, which is more precise, is used, the values of a, b, c and d (see FIG. 18) are different. Even when the F=0.24 $\mu$m rule is used, the values of a, b, c and d can be different as long as the relationships of a>b+c and d>a+c are satisfied. In this sense, a thickness f of the polycrystalline silicon layer used for the gate electrode and a maximum height g of the source and drain regions in the vicinity of the gate electrode change in accordance with the values of a, b, c and d. The thickness f and the maximum height g are not limited to the values in this example. The optimum ion type, implantation energy, dose, and heat treatment conditions are determined in accordance with the values of a, b, c, d, f and g. In this example, doping of the gate electrode and formation of the source and drain regions are performed by the same step of implantation. Accordingly, the conditions for ion implantation and heat treatment are set so that depletion of the gate electrode in the vicinity of the gate insulating layer and diffusion of the impurities into the channel region are prevented, and furthermore so that the performance of the transistor is improved (so that the short channel effect is more unlikely to occur and the amount of the driving current is increased). (Naturally, whether or not the impurities are diffused into the channel region depends on the thickness f of the polycrystalline silicon layer used for the gate electrode.) It appears to be very difficult to find the optimum conditions since various parameters are involved to realize the optimum conditions. In this example, however, the margins in the processing conditions can be significantly increased by setting the diffusion coefficient of the accumulated regions with respect to the diffusion coefficient of the silicon substrate (single crystalline silicon). In other words, the processing conditions such as the values of f and g, ion implantation conditions, heat treatment conditions, and the like, can be set with sufficient margins by setting the values of a, b, c and d so as to increase the amount of the driving current, restrict the short channel effect and minimize the planar size of the device within the range in which the device is processable.

The accumulated regions formed of polycrystalline silicon have the following advantages over accumulated regions formed of an epitaxial silicon layer. In a structure in which the impurities are diffused into a solid layer from the accumulated regions to form shallow junction of the well region and the source and drain regions, the conditions of, for example, ion implantation and heat treatment change in accordance with the height of the gate electrode, the height of the accumulated regions, the thickness of the gate electrode side wall insulating layer, and the like. In this example in which the accumulated regions are formed of polycrystalline silicon, the diffusion coefficient of the impurities can be about 10 to 100 times larger than that of the accumulated regions formed of epitaxial, single crystalline silicon. (The diffusion coefficient is larger as the grain size of a polycrystalline silicon layer is smaller.) In other words, the margins for ion implantation and heat treatment can be larger in this example. In contrast, in the conventional example in which the accumulated regions are formed of an epitaxial silicon layer, the diffusion coefficient of the polycrystalline silicon layer for the gate electrode and the diffusion coefficient of the accumulated regions are significantly different from each other. For this reason, it is practically impossible to set the conditions which prevent depletion of the gate electrode in the vicinity of the gate insulating layer and diffusion of the impurities into the channel region, and furthermore improve the performance of the transistor (so that the short channel effect is more unlikely to occur and the amount of the driving current is increased). The reason for this is as follows. The diffusion of impurities in the polycrystalline silicon layer for the gate electrode occur with significantly more ease than the diffusion of impurities in the accumulated regions (epitaxial, single layer) and the single crystalline semiconductor substrate. Accordingly, when the diffusion is caused under the conditions which prevent the transistor from being offset, boron is diffused through the gate oxide layer; and when the diffusion is caused under the conditions which prevent boron from being diffused through the gate oxide layer, the transistor is offset.

Even when the doping of the gate electrode is not performed in the same step as the formation of the source and drain regions, the method in this example has the following advantages over the conventional method due to the difference in the diffusion coefficient. (For example, all the gate electrodes can be doped with impurities of the same conductivity type by a method described in a fourth example described below or by diffusion of phosphorus; in this case, a p-channel transistor is a buried channel-type transistor.) By the method in this example of forming the source and drain regions by diffusing impurities from the polycrystalline silicon layer into the single crystalline silicon layer (semiconductor substrate), the following occurs. The impurities are diffused instantaneously up to the interface between the active region in the semiconductor substrate and the deposited polycrystalline silicon layer, but are diffused slowly from the interface to the silicon substrate because of the small diffusion coefficient. Accordingly, this method can alleviate the dispersion in the height of the accumulated regions, the impurity ion implantation distance (Rp), and the like, so that the depth of the junction of the shallow well region and the source and drain regions can be uniform. In contrast, when the epitaxial, single crystalline silicon is grown on the active region, the diffusion coefficient of the impurities in the resultant accumulated epitaxial, single crystalline silicon layer and the diffusion coefficient of the impurities in the semiconductor substrate are substantially identical with each other. Accordingly, the dispersion in the height of the accumulated regions and the dispersion in Rp of impurity ion implantation are directly reflected in the dispersion in the depth of the junction of the shallow well region and the source and drain regions. As a result, the transistor characteristics are dispersed.

After the step shown in FIG. 15, the step shown in FIG. 16 is performed. A refractory metal salicide layer 314 is formed selectively, i.e., on the source and drain regions 311 and the gate electrode 306 by a well-known saliciding process. In the same step, the gate electrode 306 is electrically connected to the shallow well region 304 via the refractory metal salicide layer 314. In this example, titanium is used for the refractory metal layer, but cobalt, nickel, platinum, or the like is also usable. In this example, the source and drain regions 311 and the gate electrode 306 are entirely covered with the salicide layer. Therefore, the advantage of salicide can be utilized to a maximum degree.

By performing general saliciding process without any additional step, the gate electrode 306 and the shallow well region 304 can be connected to each other in the same step as the saliciding. In this example, the connection for the n-channel transistor is performed in the order of the high concentration n-type gate electrode 306 to the refractory metal silicide layer 314, to the high concentration p-type diffusion contact region 313, and to the low concentration p-type shallow well region 304. The connection for the p-channel transistor is performed with the opposite polarities, in the order of the high concentrations p-type gate electrode 306 to the refractory metal silicide layer 314, to the high concentration n-type diffusion contact region 313, and to the low concentration n-type shallow well region 304. In either case, ohmic connection of the high concentration p-type gate electrode 306 and the low concentration n-type shallow well region 304, and ohmic connection of the high concentration n-type gate electrode 306 and the low concentration p-type shallow well region 304 are realized without any additional step. This is realized using the property of a silicide layer of growing in lateral directions when the refractory metal reacts with silicon. In more detail, as shown in FIG. 22, since the gate oxide layer 305 is very thin, a silicide layer 3141 of the contact region 313 and a silicide layer 3142 on the side walls of the gate electrode grow in lateral directions and are connected to each other.

Then, as shown in FIG. 17, an interlevel insulating layer 315 is formed by a well-known technique, and after that, contact holes 316 are formed at desired positions of the interlevel insulating layer. After the formation of the contact holes, lines can be formed by a well-known technique. In this example, it is sufficient that a portion of each contact hole 316 is in the source and drain regions 311. Such a structure can remarkably reduce the planar size of the device. In this example, the source and drain regions 311 are accumulated above the channel region and thus can have a larger surface area than a planar size. For this reason, it is sufficient that a portion of each contact hole 316 is in the source and drain regions 311 in order to increase the contact area of the source and drain regions 311 and the lines.

Therefore, the contact resistance can be prevented from increasing while reducing the planar size of the junction of the shallow well region and the source and drain regions 311.

The reduction in the planar area of the device will be described with reference to FIG. 23. As shown in FIG. 23A showing the conventional transistor, the margin between gate electrode and the device isolation region conventionally needs to be about 2.5 L to 3 L where L is the gate length and W is the width of the gate electrode. (In general, the gate length L is the minimum processable size.) (The margin of about 2.5 L to 3 L is obtained by o+p+q where o is the width of the contact hole, p is the alignment margin for preventing shortcircuiting the contact region and the gate electrode, and q is the alignment margin for preventing the contact of the contact region and the device isolation region.) In contrast, in the case of the DTMOS in this example shown in FIG. 23B, the margin between gate electrode and the device isolation region can be about ⅔ L (specifically, a=0.16 μm when L=0.24 μm). Owing to such a margin, the planar size of the active region in this example is (⅔ L×2+L)×W, i.e., 7/3 LW whereas the planar size of the active region in the conventional device is (2.5 L×2+L to 3 L×2+L)×W, i.e., 6 LW to 7 LW. Thus, the active region of each device can be reduced to about 7/18 to ⅓. The parasitic capacitance at the junction can be reduced to about 4/15 to ⅖. It should be noted that the size of an LSI is influenced by, for example, line pitches and contact pitches, and thus the area of the LSI as a final product depends on the design of the pitches. Thus, the area of the chip itself is not reduced to about ⅕.

As described above regarding the prior art, the junction capacitance of a usual MOSFET under the 0.24 μm processing rule if 4.7, whereas the total capacitance of $C_{DR}+C_{DF}+C_S+C_{SW/DW}+C_{dep}$ of a dynamic threshold voltage transistor using a bulk silicon substrate is 28.5. In this example, the parasitic capacitance is within about 6.4. The line capacitance $C_W$ and the gate capacitance $C_G$, which are conventionally significantly large with respect to the value of 6.4, is reduced to a level negligible from the viewpoint of the total capacitance of the circuit. In this example, a dynamic threshold voltage transistor using a bulk substrate is described. The method for producing the transistor described in this example is naturally applicable to a dynamic threshold voltage transistor using an SOI substrate, except that the step of forming the well region is different.

EXAMPLE 4

In the fourth example according to the present invention, a second specific method for producing the structure in the second example will be described. FIGS. 24A, 25A, 26A, 27A, 28A and 29A are plan views of steps of production in the fourth example; and FIGS. 24B, 25B, 26B, 27B, 28B and 29B are vertical cross-sectional views of FIGS. 24A, 25A, 26A, 27A, 28A and 29A taken along line A–A' of these figures. FIGS. 24C, 25C, 26C, 27C, 28C and 29C and vertical cross-sectional views of 24A, 25A, 26A, 27A, 28A and 29A taken along line B–B' of these figures. In this example, the gate electrode is formed of a refractory metal layer and a polycrystalline silicon layer.

First, as shown in FIG. 24 and as in the third example, a device isolation region 402, a deep well region 403, a shallow well region 404, and a gate oxide layer 405 are formed in a semiconductor substrate 401. Then, a polycrystalline silicon layer 406 is deposited, and a contact hole 408 for connecting a gate electrode and the shallow well region 404 is formed using a resist 407 as a mask. A high concentration diffusion region 409 having a concentration of $1\times10^{20}/cm^3$ or higher is formed by ion implantation of impurities having the same conductivity type to that of the shallow well region 404.

Next, as shown in FIG. 25, impurity ions are implanted into a portion of the polycrystalline silicon layer 406 which is to become the gate electrode, thereby forming an impurity diffusion region 410. In this example, phosphorus ions are implanted to form an n-channel transistor and boron ions are implanted to form a p-channel transistor in order to form a surface channel-type device. In a surface channel-type CMOS device, both n conductivity type impurities and p conductivity type impurities need to be implanted into the portion of the polycrystalline silicon which is to become the gate electrode. Accordingly, in this example, the step of implanting the impurity ions having the same conductivity type as that of the shallow well region 404 to form the high concentration diffusion region 409 having a concentration of $1\times10^{20}/cm^3$ or higher can be performed at the time of ion implantation into the gate electrode. At this point, the conductivity type of the gate electrode and the conductivity type of the well 404 in the surface channel-type CMOS device are different from each other. Therefore, it is necessary to concurrently perform impurity implantation to a portion of the polycrystalline silicon layer which is to become the gate electrode of an n-channel transistor and impurity implantation to form a contact region of a p-channel transistor. It is also necessary to concurrently perform impurity implantation to a portion of the polycrystalline silicon layer which is to become the gate electrode of the p-channel transistor and impurity implantation to form a contact region of the n-channel transistor.

Figure 26A:
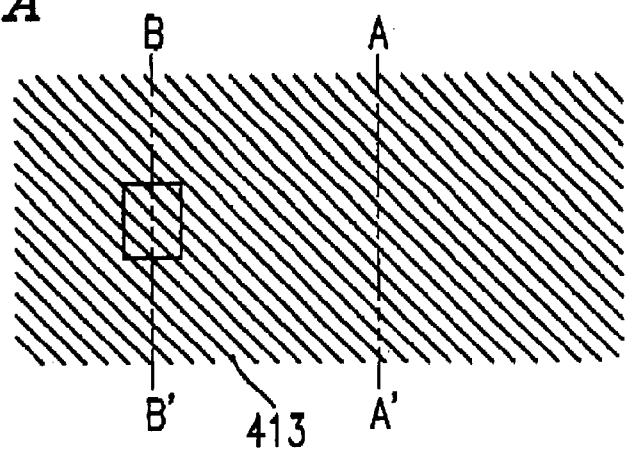
FIGS. 26A, 26B and 26C are views illustrating a step of the method for forming the semiconductor device in the fourth example.
Figure 26B:
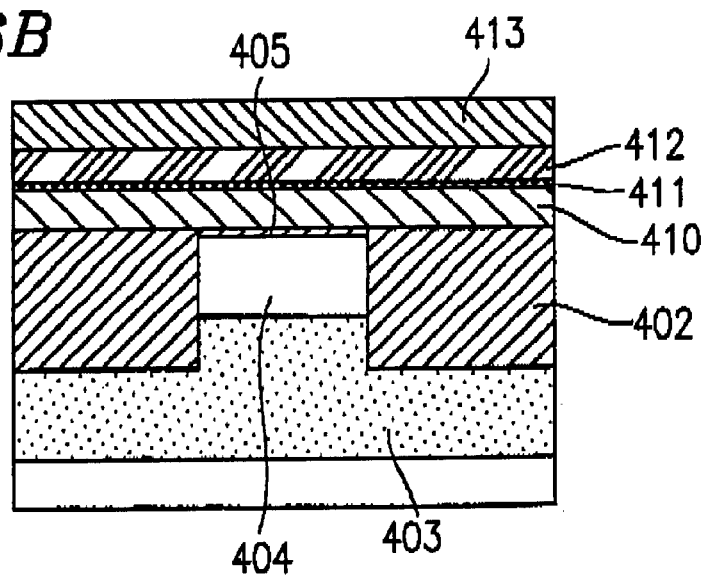
Figure 26C:
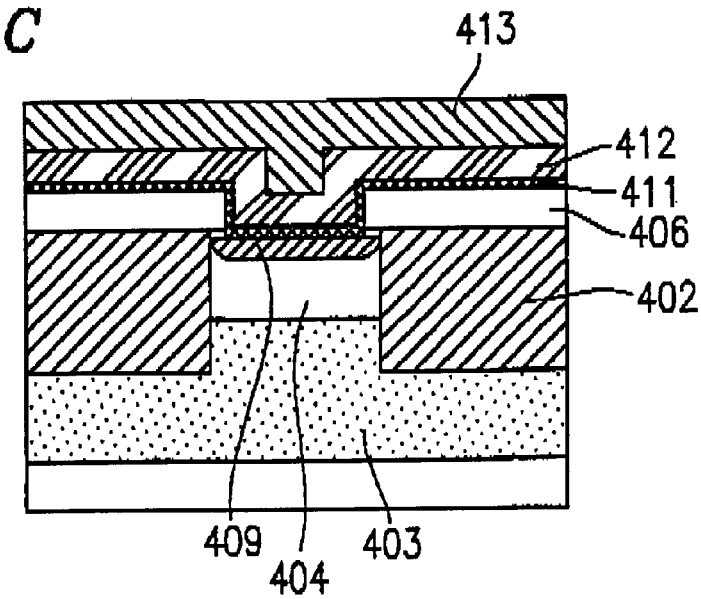
Figure 27A:
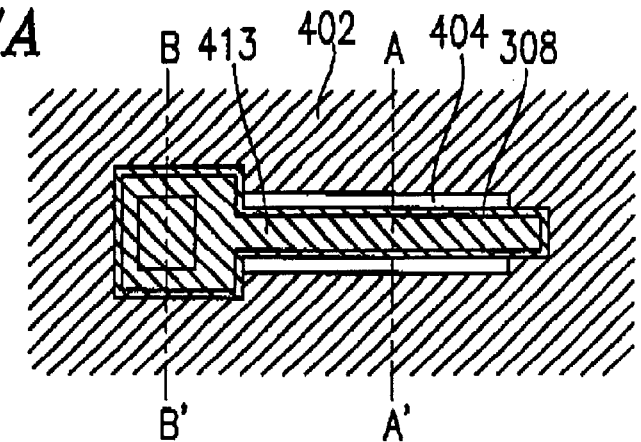
FIGS. 27A, 27B and 27C are views illustrating a step of the method for forming the semiconductor device in the fourth example.
Figure 27B:
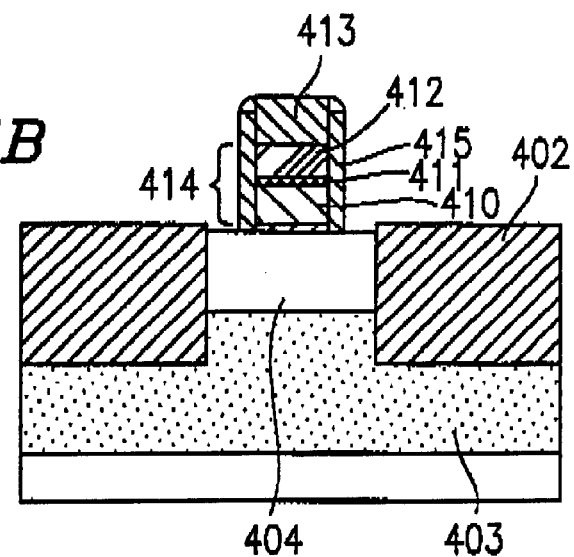
Figure 27C:
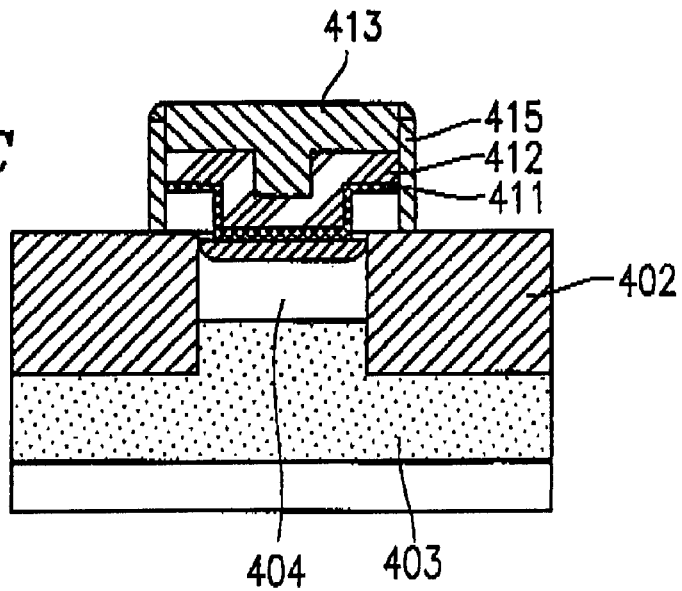
Figure 28A:
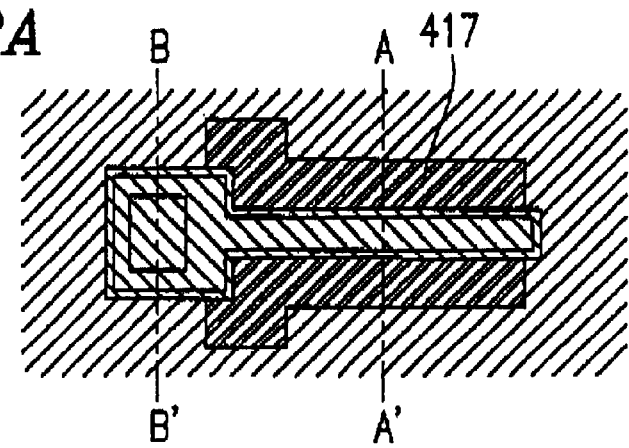
FIGS. 28A, 28B and 28C are views illustrating a step of the method for forming the semiconductor device in the fourth example.
Figure 28B:
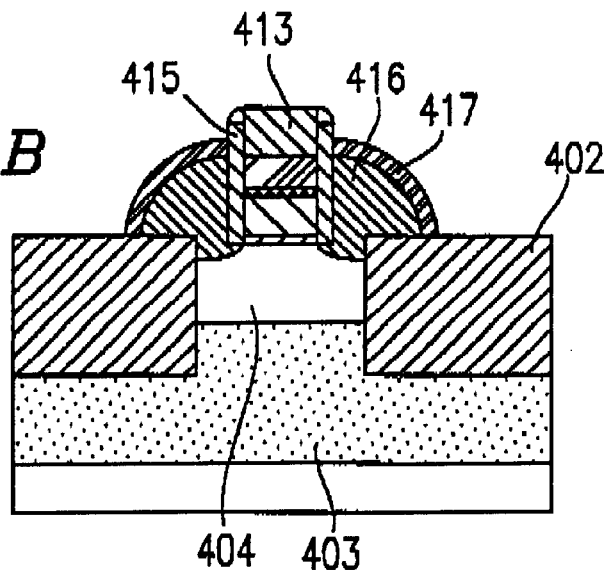
Figure 28C:
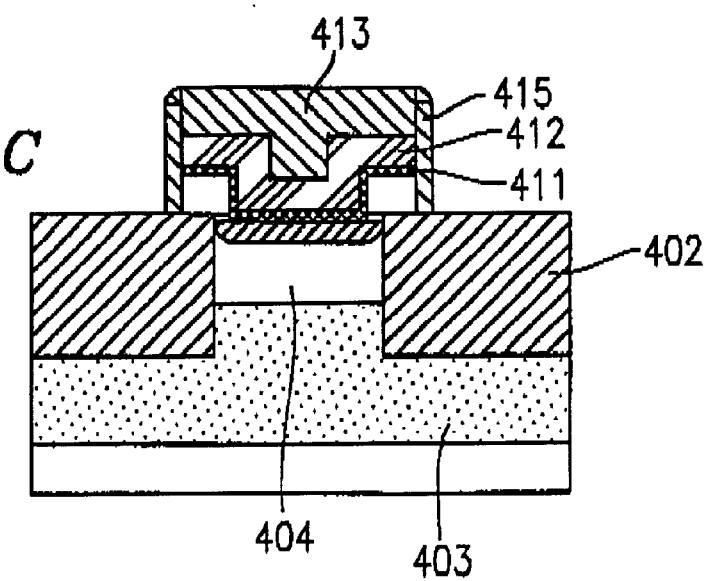
Figure 29A:
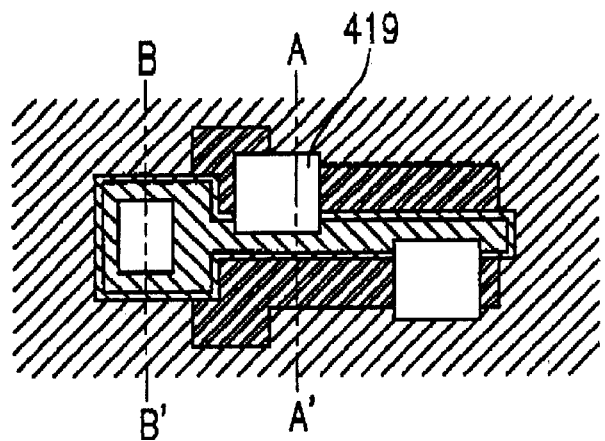
FIGS. 29A, 29B and 29C are views illustrating a step of the method for forming the semiconductor device in the fourth example.
Figure 29B:
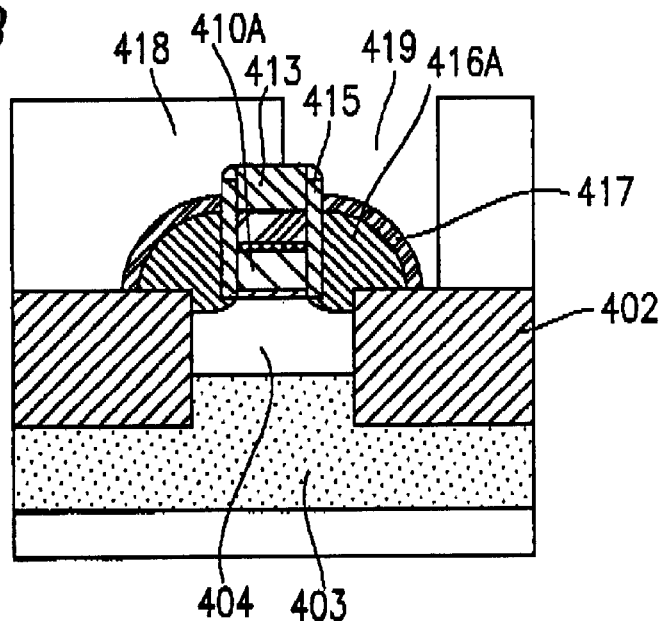
Figure 29C:
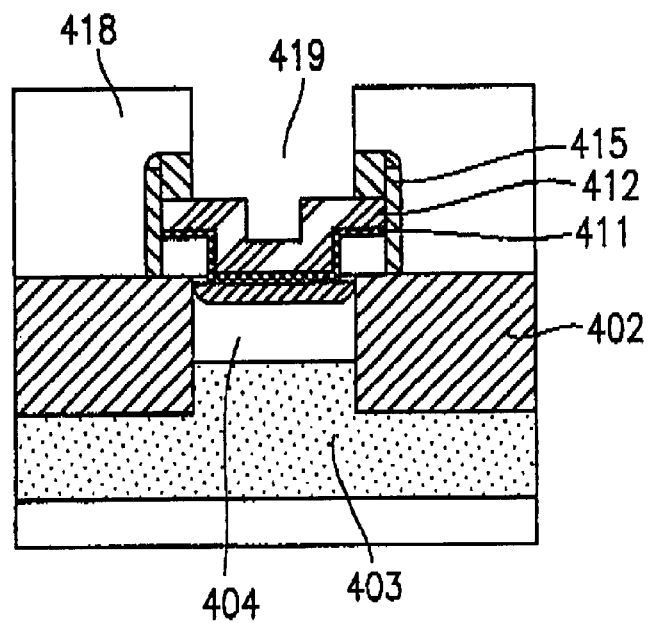

Then, as shown in FIG. 26, a titanium nitride layer 411, a tungsten layer 412, and an insulating layer 413 are sequentially deposited on the polycrystalline silicon layer 406 and the impurity diffusion region 410. (As the insulating layer 413, silicon nitride is used in this example, but silicon oxide or other insulating materials can be used.) The titanium nitride layer 411 is provided in order to prevent the polycrystalline silicon layer 406 and the tungsten layer 412 from reacting with each other during heat treatment performed in a later step. If the polycrystalline silicon layer 410 and the tungsten layer 412 react with each other, a tungsten silicide layer is formed and thus the resistance is increased. The titanium nitride layer can be replaced with a tungsten nitride layer or a layer of any other conductive material which prevents reaction of the polycrystalline silicon layer 406 and the tungsten layer 412. As shown in FIG. 26C, the high concentration diffusion region 409 and the conductive titanium nitride layer 411 are connected with each other in the contact region.

Next, as shown in FIG. 27, the silicon nitride layer 413, the tungsten layer 412, the titanium nitride layer 411, and the polycrystalline silicon layer 406 are sequentially etched, thereby forming a gate electrode 414. Then, a gate electrode side wall insulating layer 415 is formed. The gate electrode side wall insulating layer 415 is formed of a silicon nitride layer in this example, but can have a two-layer structure including a silicon oxide layer and a silicon nitride layer.

In this example, the F=0.18 μm rule is used. Accordingly, the values of a, b, c and d (also described in the third example) used for designing the device are a=0.12 μm, b=0.03 μm, c=±0.06 μm and d=0.25 μm. Therefore, the total step including the height of the gate electrode and the thickness of the insulating layer thereon can be about 200 nm to 300 nm.

As shown in FIG. 28 and as in the third example, a polycrystalline silicon layer 416 is formed by a chemical vapor deposition (CVD) technique. In this example, the polycrystalline silicon layer 416 is formed to a thickness of about 300 to 400 nm. Then, the polycrystalline silicon layer 416 is etched back. The etching back conditions are similar to those in the third example. Also as in the third example, the etching back of the polycrystalline silicon layer 416 in this step is not sufficient. After the etching back performed in this step, the polycrystalline silicon layer still remains around the gate electrode via the gate electrode side wall insulating layer 415. In order to utilize the polycrystalline silicon layer 416 as the source and drain regions, the source region and the drain region need to be separated from each other. In this example, the etching is performed under the conditions of allowing for slight side etching in order to guarantee the separation even when the gate electrode side walls are not vertical to the surface of the substrate as in the third example. In this example, however, only the separation of the source region and the drain region is required since the contact region 408 is already formed for connecting the gate electrode and the shallow well region. As in the third example, impurity ion implantation is performed. In this example, only the source and drain regions are doped at this step, unlike the third example. As in the third example, a refractory metal silicide layer 417 is formed selectively, i.e., on the source and drain regions by a well-known saliciding process. In this example, titanium is used for the refractory metal layer, but cobalt, nickel, platinum, or the like is also usable. In this example, the gate electrode is formed of tungsten which has a lower resistance than that of the metal silicide layer, and the silicon oxide layer or the silicon nitride layer is provided on the gate electrode. Therefore, only the source and drain regions are salicided. In this manner, the semiconductor device having the structure shown in FIG. 28 is obtained.

Next, as shown in FIG. 29 and as in the third example, an interlevel insulating layer 418 is formed by a well-known technique, and a contact hole 419 is formed at a desired position of the interlevel insulating layer. After the formation of the contact hole, lines can be formed by a well-known technique. In this example, it is sufficient that a portion of the contact hole 419 is in the source and drain regions 416A. Such a structure can remarkably reduce the planar size of the device.

In this example, the silicon nitride layer 413 is provided on the gate electrode. Accordingly, as compared to the third example, the positioning freedom for the contact hole 419 is increased. Even in the case where the contact hole is partially in the gate electrode 410A, the source and drain regions 416A are not shortcircuited with the gate electrode 410A via the contact hole 419. This eliminates the necessity of providing a margin for preventing the shortcircuiting (including an alignment margin) between the contact hole 419 and the gate electrode 410A. Specifically, the material for the interlevel insulating layer 418 and the silicon nitride layer 413 on the gate electrode 410A and the material for the gate electrode side wall insulating layer 415 are selected, so that the etching ratio of the interlevel insulating layer 418, and the silicon nitride layer 413 on the gate electrode 410A and the gate electrode side wall insulating layer 415 is appropriate under appropriate etching conditions. More specifically, the silicon nitride layer 413 on the gate electrode 410A and the gate electrode side wall insulating layer 415 can be formed of a silicon nitride layer, and the interlevel insulating layer 418 is formed of, for example, silicate glass including boron and phosphorus. In this case, by performing etching using a fluorocarbon-based gas, the etching ratio of the silicon nitride layers and the silicate glass layer including boron and phosphorus can be 1:10 to 1:100 or more. By performing etching to form the contact hole under such conditions, the gate electrode 410A can be prevented from being exposed.

The etching providing an appropriate range of etching ratios can be applied to the relationship between the device isolation region 402 and the interlevel insulating layer 418. For example, in the third example and this example, the contact hole is partially in the device isolation region 402. If the etching rate of the insulating layer used for the interlevel insulating layer 418 and the etching rate of the insulating layer used for the device isolation region 402 are not different from each other when forming the contact hole, a hole is also formed in the device isolation region 402. In order to solve this problem, a surface of an insulating layer forming, for example, at least the device isolation region 402 can be formed of a material having an etching ratio with respect to the interlevel insulating layer 418 formed of a silicon nitride layer or the like as in the third example.

The grain size of the accumulated regions formed of polycrystalline silicon in the third and fourth examples is preferably sufficiently small as compared to the planar size of the source and drain regions 416A. As described in the third and fourth examples, the diffusion coefficient of the accumulated regions formed of polycrystalline silicon is preferably at least twice as large as the diffusion coefficient of the silicon substrate, in order to increase the processing margins (margins for impurity ion implantation for forming the source and drain regions, for heat treatment conditions, and the like). (Preferably, the diffusion coefficient of the accumulated regions is at least 10 times as large as the diffusion coefficient of the single crystalline silicon of the silicon substrate.) The diffusion of the impurities in the polycrystalline silicon layer is promoted more as the number of grain boundaries in the polycrystalline silicon layer is larger. Accordingly, the grain size needs to be sufficiently small with respect to the planar size of the source and drain regions 416A. Even with the F=0.24 μm rule defining the relatively large minimum processable size, the device is designed so that the margin between the gate electrode and the device isolation region is about 0.16 μm. Therefore, the grain size of the polycrystalline silicon layer is preferably 50 nm or less. It is more preferable that the grains are column-shaped crystals since column-shaped crystals accelerate the diffusion in a downward direction.

In the third and fourth examples, the accumulated source and drain regions 416A are formed of a polycrystalline silicon layer. Alternatively, silicon germanium (polycrystalline) layer is usable. Still alternatively, an amorphous single layer of silicon or silicon germanium ($Si_xGe_y$) layer, or a two-layer structure of an amorphous layer and a polycrystalline layer is also usable. Use of silicon germanium provides an effect of improving the activation ratio of impurities as compared to silicon.

In this example, the description is provided regarding the SOI substrate and the bulk silicon substrate. The structure of this example is applicable as it is to substrates of other materials, for example, an SiC substrate or a sapphire substrate.

EXAMPLE 5

In a fifth example according to the present invention, an MIS semiconductor device formed on a semiconductor substrate which is roughly divided into a device isolation region and an active region. In the semiconductor device in this example, as in the first through fourth examples, a distance from the gate electrode to the device isolation region in a gate length direction which is vertical to a longitudinal direction of the gate electrode is defined as the width a (see FIG. 18) when one gate electrode is provided for one active region. When a plurality of gate electrodes are provided for one active region, a distance from the gate electrode which is closest to the device isolation region among the plurality of gate electrodes to the device isolation region in a gate length direction which is vertical to the longitudinal direction of the gate electrodes is defined as the width a.

In the semiconductor device in this example, as in the first through fourth examples, the source and drain regions have a shape which is obtained by the step of forming the device isolation region on the silicon substrate of a material which is resistant to silicon etching; the step of sequentially forming the gate insulating layer, the gate electrode and the gate electrode side wall insulating layer; the step of forming a polycrystalline silicon layer having a thickness which is larger than the value of the width a; and the step of performing anisotropic etching until the polycrystalline silicon layer on the gate electrode is eliminated.

However, the semiconductor device in this example has a different shape from that of the first through fourth examples.

In the first through fourth examples, the relationship of a>d is defined with reference to FIG. 18. However, neither a distance t between the gate electrode 306 nor an adjacent gate electrode or a width d of the side wall is mentioned. As can be clearly appreciated, when the device is formed by the method described in the third or fourth example and the distance t between adjacent gate electrodes is t<2d, the source and drain regions 311 are not formed to have a thickness which gradually increases toward the gate electrode 306.

Figures 30A, 30B:
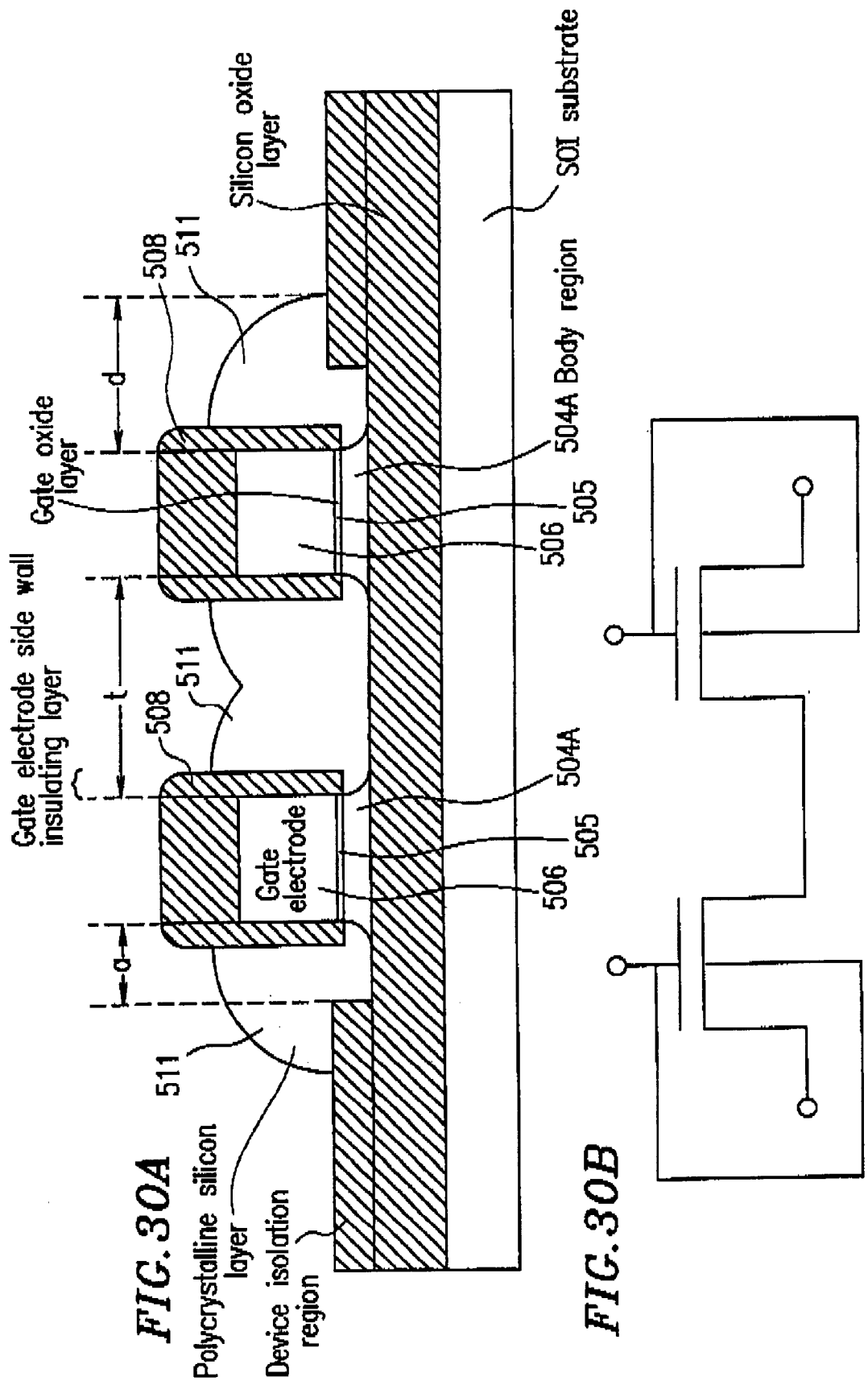
FIGS. 30A is a cross-sectional view of transistors connected in series as semiconductor devices according to the present invention using an SOI substrate.
FIG. 30B is a circuit configuration of the semiconductor devices in FIG. 30A.

When the device is formed by the method described in, for example, the third or fourth example and the distance t between adjacent gate electrodes is t<2d, the polycrystalline silicon layer fills the space between gate electrodes 506 as shown in FIG. 30A.

FIG. 30A shows an example of a semiconductor device using an SOI substrate. Therefore, a silicon oxide layer is provided immediately below source and drain regions 511. Accordingly, two body regions 504A are isolated from each other by the common source and drain regions 511 and thus are not shortcircuited. However, it is necessary to provide a device isolation region between active regions where the source and drain regions 511 are not existent, i.e., between regions each of which forms a contact region between the gate electrode 506 and the body region 504A. In this case, the circuit shown in FIG. 30B is generated, in which adjacent transistors share the common source and drain regions 511.

Figure 31:
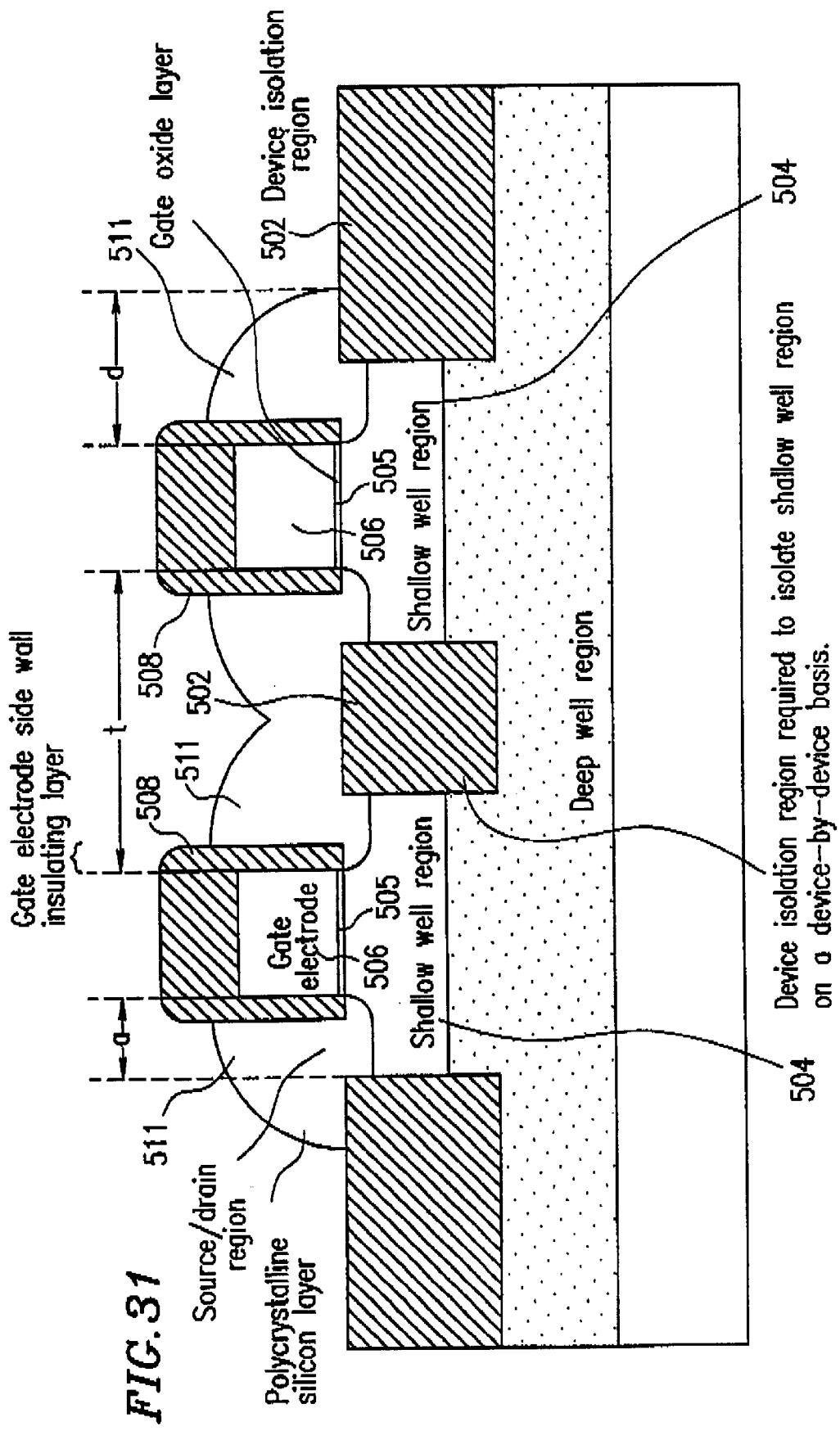
FIG. 31 is a cross-sectional view of transistors connected in series as semiconductor devices according to the present invention using a bulk substrate.
Figure 32:
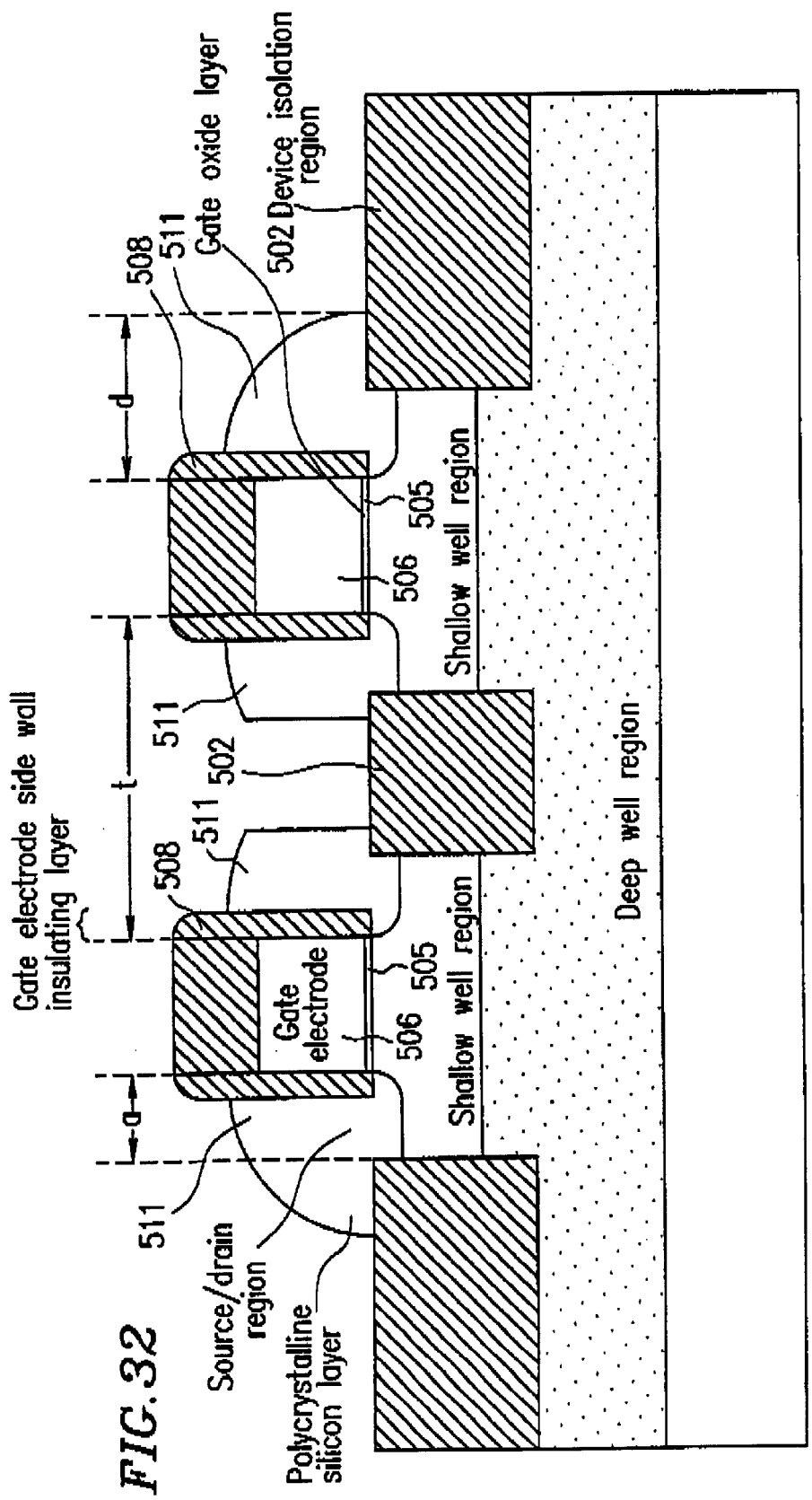
FIG. 32 is a cross-sectional view of adjacent transistors electrically separated from each other as semiconductor devices according to the present invention.
Figure 34A:
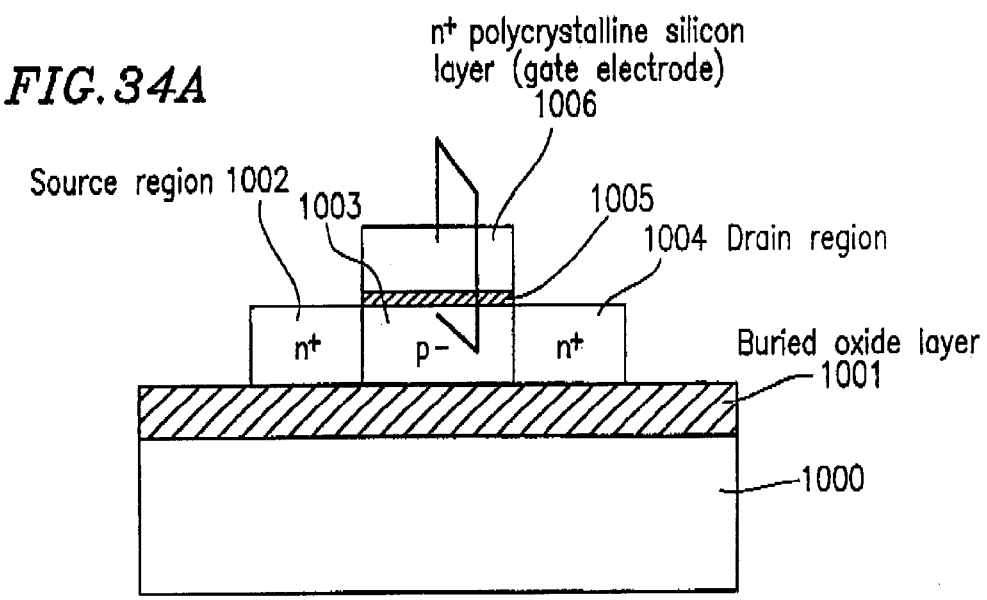
FIGS. 34A, 34B and 34C are views illustrating a conventional semiconductor device using an SOI substrate.
Figure 34B:
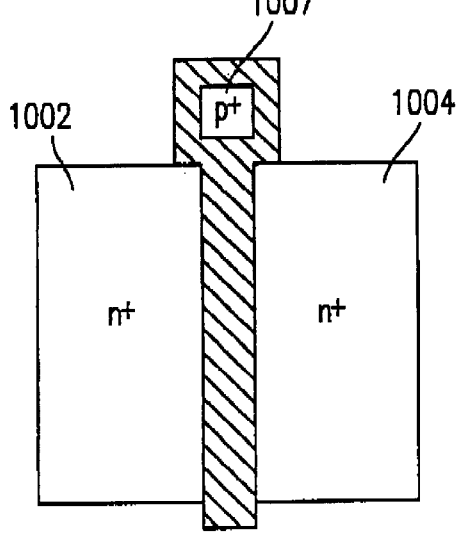
Figure 34C:
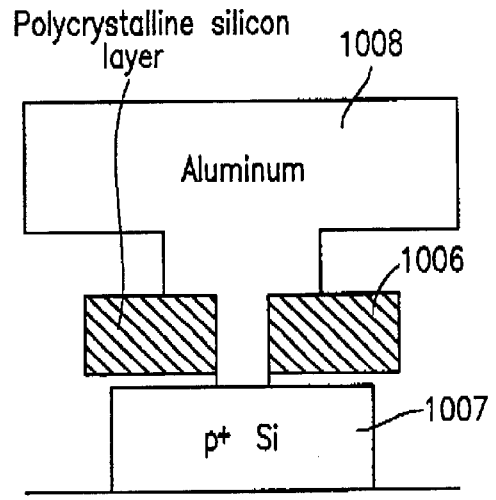
Figure 35:
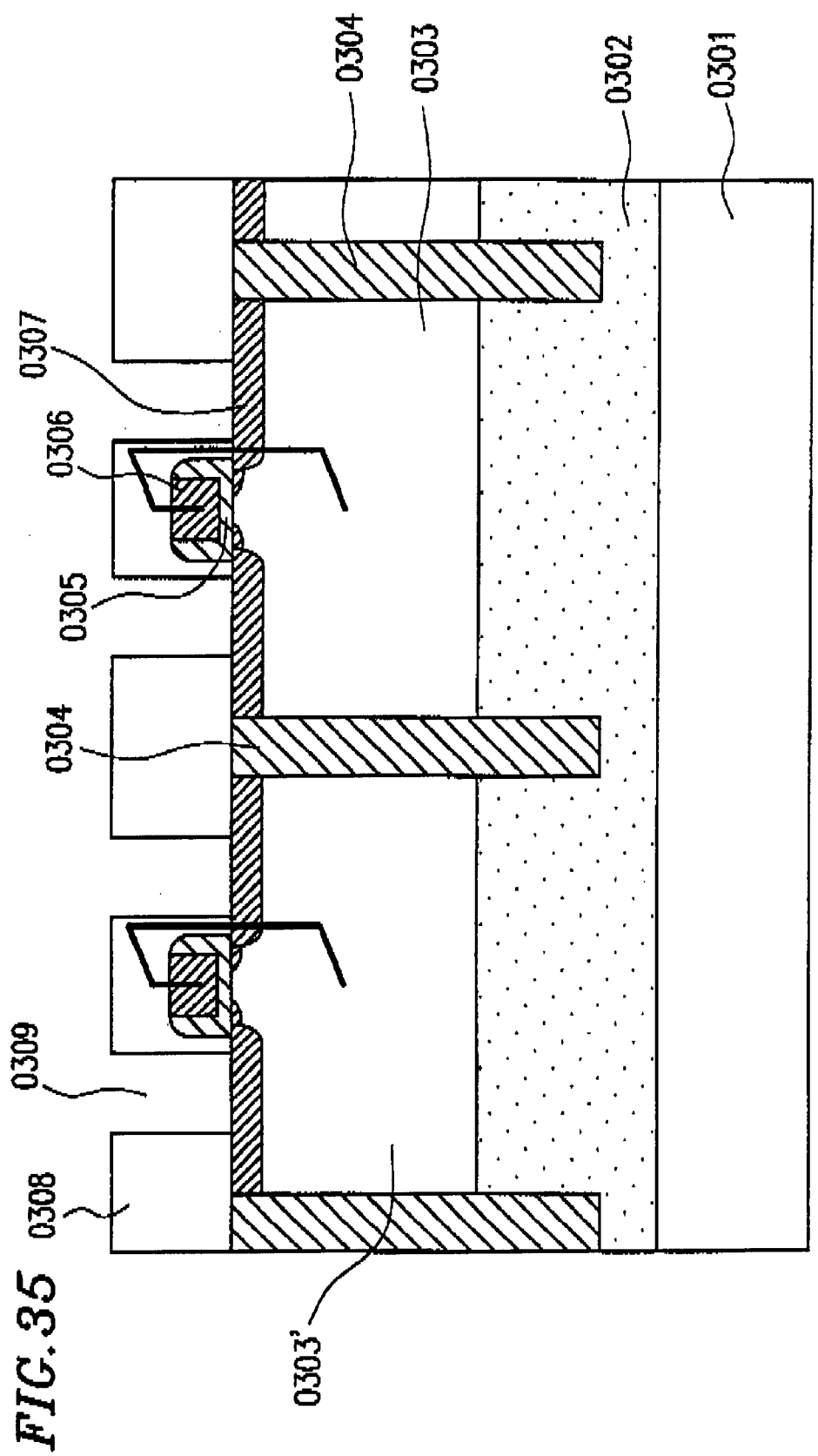
FIG. 35 is a view illustrating a conventional semiconductor device using a bulk substrate.
Figure 36:
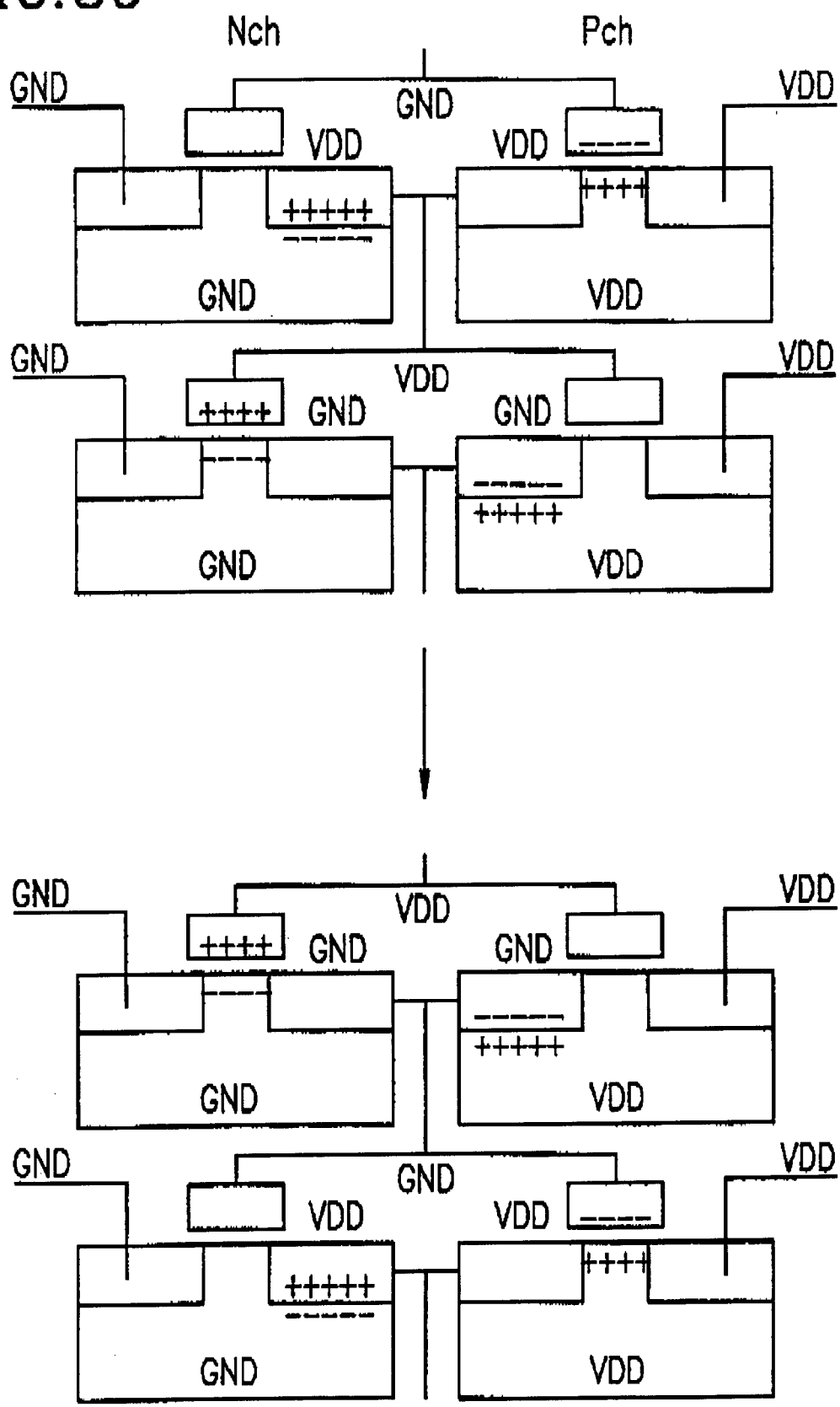
FIG. 36 is a view illustrating a change in the charge state of a CMOS inverter of a usual semiconductor device having a fan-out of 1.
Figure 37:
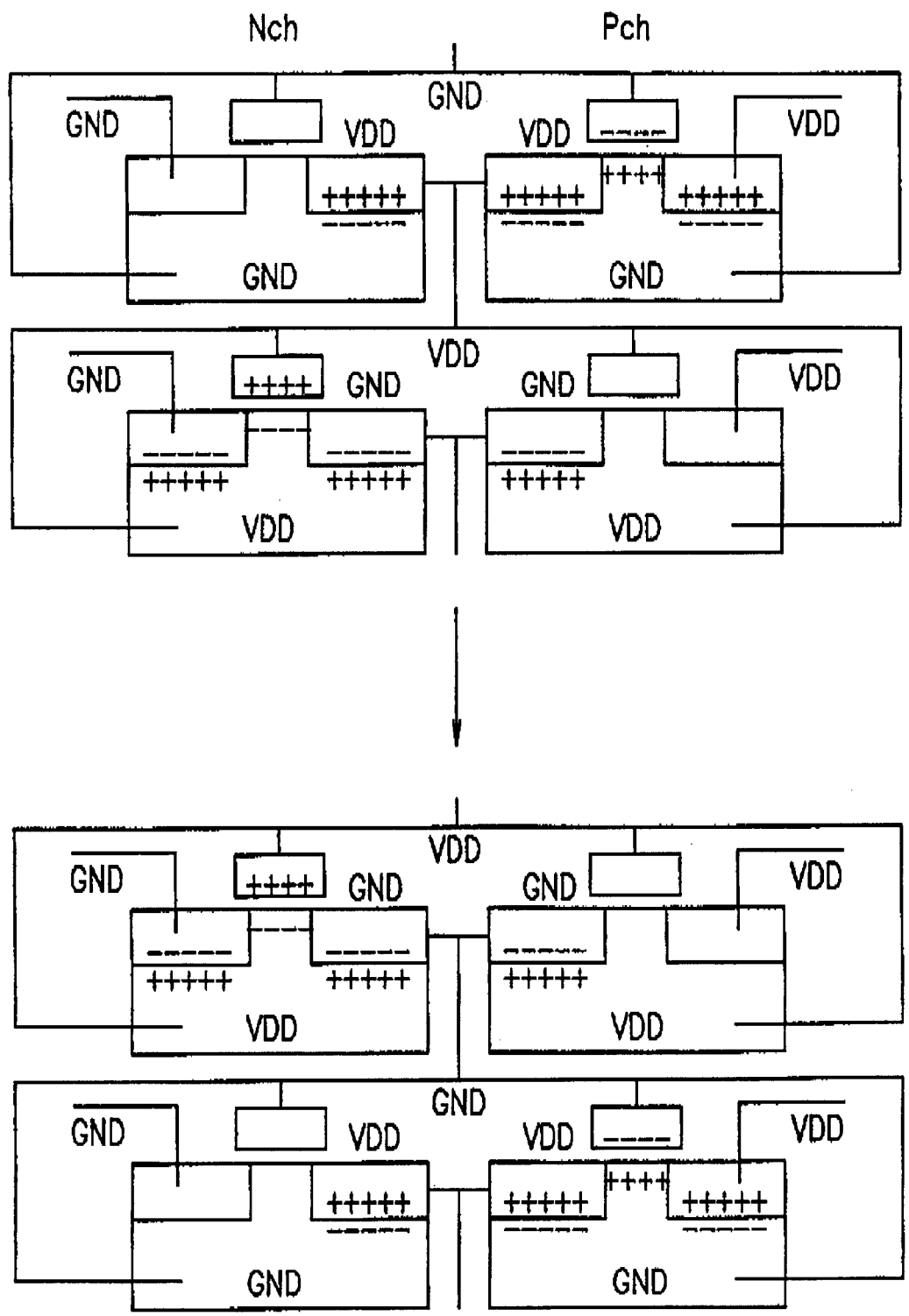
FIG. 37 is a view illustrating a change in the charge state of a CMOS inverter of a DTMOS device having a fan-out of 1.
Figure 38A:
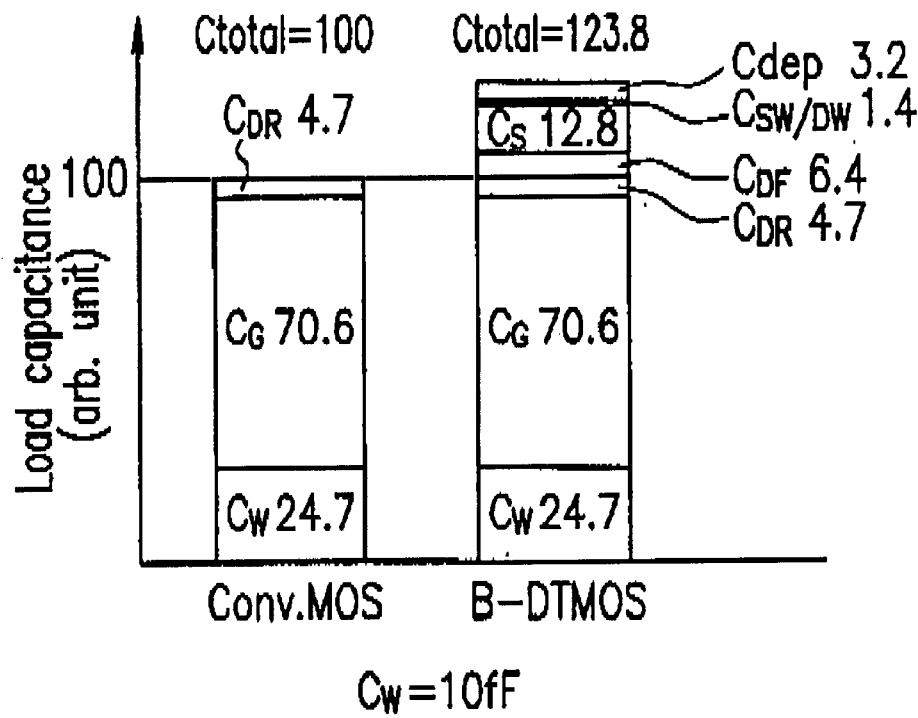
FIGS. 38A and 38B are graphs comparing the capacitances of a conventional semiconductor device and a DTMOS device.
Figure 38B:
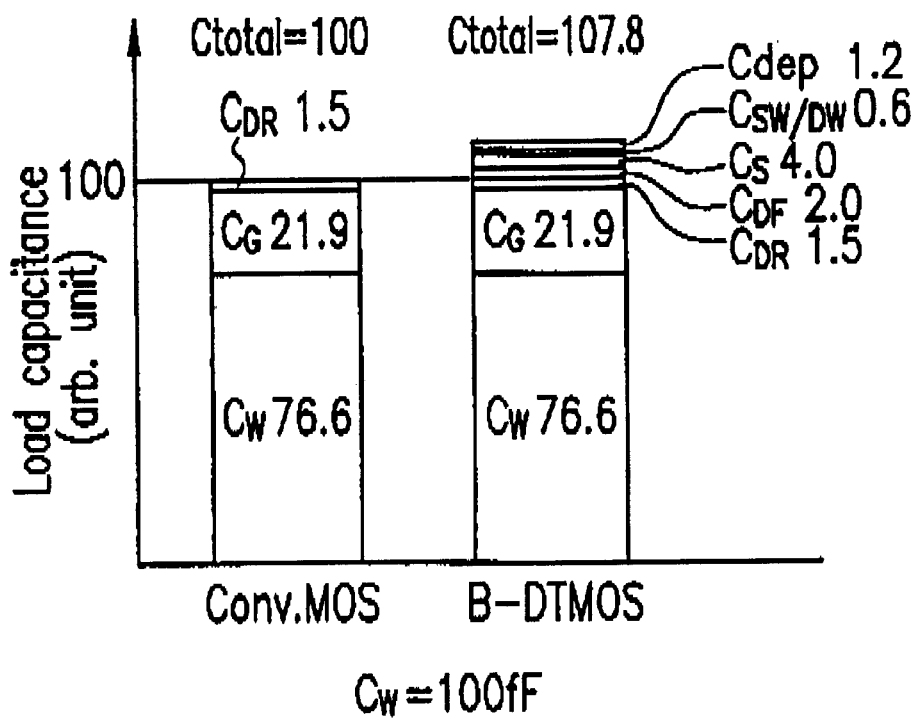

Such a connection in series of transistors is often used in circuits. When transistors are connected in series in a semiconductor device using a bulk substrate, a device isolation region 502 needs to be provided between the gate electrodes 506 as shown in FIG. 31 so as to isolate shallow well regions 504 from each other together with the transistors formed thereon. When the source region 511 and drain regions 511 need to be isolated from each other and t<2d, etching needs to be performed as shown in FIG. 32 so as to isolate the source region 511 and drain regions 511 from each other. This is realized by the etching process performed to separate the source region and the drain region from each other as described in the third and fourth examples. As shown in FIG. 33, a dummy gate electrode 506D can be provided in order to prevent the shortcircuiting between the source region and the drain region.

INDUSTRIAL APPLICABILITY

As described so far, according to the present invention, an important objective in a dynamic threshold voltage transistor using an SOI substrate, i.e., reduction in the resistance of the source and drain regions, can be achieved. The planar size of the source and drain regions can also be significantly reduced.

Regarding a dynamic threshold voltage transistor using a bulk substrate, the planar size of the source and drain regions can be reduced as with the SOI substrate. The parasitic resistance of the source and drain regions is also reduced. In addition, an important objective in a dynamic threshold voltage transistor using a bulk substrate, i.e., restriction in the increase of the junction capacitance, can be achieved by reducing the junction capacitance to about $2/15$ to $2/6$. (As compared with a usual MOSFET not adopting a dynamic threshold voltage, the parasitic capacitance at the junction of a DTMOS adopting a dynamic threshold voltage is increased to about three times or more where the area of the junction is equal to that of the usual MOSFET. Such a difference is generated due to the shortcircuiting between the gate electrode and the shallow well region in the DTMOS.)

Due to these effects, the present invention significantly increases the mutual conductance of the devices, increases the amount of the driving current, significantly reduces the CR time constant, provides a higher speed operation at a lower supply voltage, and thus significantly reduced the power consumption.

In more detail, the present invention can make the surface area of the source and drain regions above the active region larger than the planar size of the source and drain regions. Accordingly, the contact area of the source drain regions and the upper lines can be increased and thus the contact resistance can be lowered. In addition, the present invention provides effects of significantly shortening the distance between the channel region and the contact hole, remarkably decreasing the width of the high resistance impurity diffusion region in which the current flows, and noticeably reducing the parasitic resistance.

The planar size of the device, especially the planar size of the source and drain regions can be reduced regardless of the size of the contact region. Accordingly, the junction of the source and drain regions and the semiconductor substrate (in a conventional CMOS device, the junction of the source and drain regions and the well region having the opposite conductivity type to the source and drain regions) can be reduced without increasing the contact resistance. Thus, the junction capacitance can be effectively reduced.

In summary, according to the structure of the present invention, reduction in the planar size, reduction in the parasitic capacitance (junction capacitance) and reduction in the parasitic resistance can be realized without increasing the contact resistance. Thus, a very large mutual conductance can be provided (i.e., a large transistor driving current can be provided). In addition, the amount of charges required for charging is reduced for the following reason. Since in a CMOS LSI, the operating speed of the circuit is in proportion to the transistor driving current and in inverse proportion to the load capacitance, the amount of charges required for charging the load can be reduced by reducing the junction capacitance, which is a part of the load capacitance. Due to the reduced amount of charges, the operating speed of the circuit designed in accordance with the present invention is improved.

According to the present invention, the ratio of the high resistance region with respect to the current path is very low, and thus the parasitic resistance of the source and drain regions is lower than that of a circuit having the structure. In addition, the current path expands on approaching the contact region from the source and drain regions in the vicinity of the channel region. This also significantly reduces the parasitic resistance. Due to these effects, the ability of the device for driving the current is raised, and thus the mutual conductance is improved.

According to the present invention, the junction of the source and drain impurity diffusion regions and the well region can be very easily formed to at a shallow level with respect to the channel region of the transistor. This effectively prevents the short channel effect.

Without using the epitaxial growth technique, the shallow junction can be realized, and thus the short channel effect can be suppressed. The diffusion can be more easily controlled than by the epitaxial growth technique, and thus the device-by-device dispersion is reduced. Since the active region is not exposed after the source and drain regions are formed, no damage is caused during the etching or ion implantation process.

In one embodiment, when heat treatment is performed to diffuse and activate the impurities, the impurities are diffused up to the interface between the accumulated regions and the semiconductor substrate very rapidly, but are diffused in the semiconductor substrate slowly. Therefore, the depth of the portion of the source and drain regions below the channel region and the well region is unlikely to be influenced by the dispersion in the height of the accumulated regions. In consequence, the shallow junction can be formed with satisfactory controllability.

In the structure according to the present invention, reduction in the yield due to the vertical step of the gate electrode, which is undesirable for semiconductor device production, is restricted. For example, the interlevel insulating layer is easily flattened. In a semiconductor device having a vertical step of the gate electrode, during the etching process performed for forming a contact region by self-alignment contact (SAC), the etching rate of the etching stop layer undesirably rises at the vertical step of the gate electrode and defective contact is caused. Such defective contact is not caused in the structure according to the present invention.

In one embodiment, the accumulated source and drain regions in the present invention can easily be formed by setting the etching amount so as to eliminate the polycrystalline silicon layer on the gate electrode. Since the thickness of the polycrystalline silicon layer is greater than the distance between the gate electrode and the device isolation region (width of the source and drain regions), the silicon substrate is not exposed or damaged by anisotropic etching back. Ends of the accumulated regions formed by anisotropic etching provided in contact with the gate electrode side walls always extend onto the device isolation regions formed of a material which is resistant against silicon etching.

In one embodiment, the gate electrode and the body region or the shallow well region are automatically connected to each other by the saliciding process performed to the source and drain regions and the gate electrode. Thus, the production method can be simplified.

In one embodiment, the step of performing etching back for separating the polycrystalline silicon layer formed by anisotropic etching back into the source region and the drain region is concurrently performed with the step of performing etching for forming a contact region for connecting the gate electrode and the body region or the shallow well region. Thus, the production method can be simplified.

In one embodiment, the implantation of impurities to act as donors or acceptors is performed concurrently to the source region, the drain region and the gate electrode, using ion implantation. Therefore, a surface channel-type device can be formed with a fewer ion implantation steps. Since the accumulated source and drain regions are formed of a material which has a larger diffusion coefficient of impurities than the diffusion coefficient of the impurities in the semiconductor substrate, as described above. Accordingly, even when doping of the gate electrode with impurities and doping of the source and drain regions with impurities are concurrently performed, the device can be formed with satisfactory controllability so that a depletion region is not formed in the gate electrode, the impurities are not diffused through the gate oxide layer, or an offset structure is not generated (i.e., the impurities are not diffused to form the source and drain regions sufficiently close to the channel region).

In one embodiment, by performing ion implantation to form the source and drain regions by a CMOS process, ion implantation for connecting the gate electrode and the body region or the shallow wall region can also be performed. Thus, the production method can be simplified.

What is claimed is:

1. A semiconductor device, comprising:
 a semiconductor substrate;
 device isolation regions provided in the semiconductor substrate;
 a first conductivity type semiconductor layer provided between the device isolation regions;
 a gate insulating layer provided on the first conductivity type semiconductor layer;
 a gate electrode provided on the gate insulating layer;
 a gate electrode side wall insulating layer provided on side walls of the gate electrode; and
 second conductivity type semiconductor layers provided adjacent to portions of the gate electrode side wall insulating layer so as to cover a portion of the corresponding device isolation region, the second conductivity type semiconductor layers acting as a source region and/or a drain region,
 wherein:
  the gate electrode and the first conductivity type semiconductor layer are electrically connected to each other, and
  the second conductivity type semiconductor layers are provided above the first conductivity type semiconductor layer and have a thickness which gradually increases from the device isolation region toward the gate electrode.

2. A semiconductor device, comprising:
 a semiconductor substrate;
 a second conductivity type deep well region provided in the semiconductor substrate;
 device isolation regions provided in the semiconductor substrate;
 a first conductivity type shallow well region provided in the second conductivity type deep well regions;
 a gate insulating layer provided on the first conductivity type shallow well region;

a gate electrode provided on the gate insulating layer;

a gate electrode side wall insulating layer provided on side walls of the gate electrode; and second conductivity type semiconductor layers provided adjacent to portions of the gate electrode side wall insulating layer so as to cover a portion of the corresponding device isolation region, the second conductivity type semiconductor layers acting as a source region and/or a drain region, wherein:

the gate electrode and the first conductivity type shallow well region are electrically connected to each other, and the second conductivity type semiconductor layers are provided above the first conductivity type shallow well region and have a thickness which gradually increases from the device isolation region toward the gate electrode.

3. A semiconductor device according to claim 1, further comprising contact holes for electrically connecting the source region and/or the drain region to upper lines, wherein a distance, in a cross-section which is vertical to a longitudinal direction of the gate electrode, between the gate electrode and one of two ends of each of the contact holes which is farther from the gate electrode is larger than a distance between the corresponding end of the gate electrode and the corresponding device isolation region.

4. A semiconductor device according to claim 2, further comprising contact holes for electrically connecting the source region and/or the drain region to upper lines, wherein a distance, in a cross-section which is vertical to a longitudinal direction of the gate electrode, between the gate electrode and one of two ends of each of the contact holes which is farther from the gate electrode is larger than a distance between the corresponding end of the gate electrode and the corresponding device isolation region.

5. A semiconductor device according to claim 1, further comprising contact holes for electrically connecting the source region and/or the drain region to upper lines, wherein a width of each of the contact holes in a cross-section which is vertical to a longitudinal direction of the gate electrode is larger than a distance between the corresponding end of the gate electrode and the corresponding device isolation region.

6. A semiconductor device according to claim 2, further comprising contact holes for electrically connecting the source region and/or the drain region to upper lines, wherein a width of each of the contact holes in a cross-section which is vertical to a longitudinal direction of the gate electrode is larger than a distance between the corresponding end of the gate electrode and the corresponding device isolation region.

7. A semiconductor device according to claim 1, wherein a distance, in a direction which is vertical to a longitudinal direction of the gate electrode, between each end of the gate electrode and the corresponding device isolation region is smaller than a width of the gate electrode.

8. A semiconductor device according to claim 2, wherein a distance, in a direction which is vertical to a longitudinal direction of the gate electrode, between each end of the gate electrode and the corresponding device isolation region is smaller than a width of the gate electrode.

9. A semiconductor device according to claim 1, wherein the second conductivity type semiconductor layers acting as the source region and/or the drain region are formed of a material having an impurity diffusion coefficient which is larger than an impurity diffusion coefficient of the semiconductor substrate.

10. A semiconductor device according to claim 2, wherein the second conductivity type semiconductor layers acting as the source region and/or the drain region are formed of a material having an impurity diffusion coefficient which is larger than an impurity diffusion coefficient of the semiconductor substrate.

11. A semiconductor device according to claim 1, wherein the gate electrode and the second conductivity type semiconductor layers each have a two-layer structure including a refractory metal silicide layer provided on a surface side of the semiconductor device and a polycrystalline silicon layer provided on a substrate side.

12. A semiconductor device according to claim 2, wherein the gate electrode and the second conductivity type semiconductor layers each have a two-layer structure including a refractory metal silicide layer provided on a surface side of the semiconductor device and a polycrystalline silicon layer provided on a substrate side.

* * * * *